US012604640B2

(12) United States Patent
Sasagawa et al.

(10) Patent No.: US 12,604,640 B2
(45) Date of Patent: Apr. 14, 2026

(54) DISPLAY PANEL, DATA PROCESSING DEVICE, AND MANUFACTURING METHOD OF THE DISPLAY PANEL

(71) Applicant: Semiconductor Energy Laboratory Co., Ltd., Atsugi (JP)

(72) Inventors: Shinya Sasagawa, Chigasaki (JP); Ryota Hodo, Atsugi (JP); Yoshikazu Hiura, Atsugi (JP); Takahiro Fujie, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 299 days.

(21) Appl. No.: 18/267,873

(22) PCT Filed: Dec. 15, 2021

(86) PCT No.: PCT/IB2021/061733
§ 371 (c)(1),
(2) Date: Jun. 16, 2023

(87) PCT Pub. No.: WO2022/144661
PCT Pub. Date: Jul. 7, 2022

(65) Prior Publication Data
US 2024/0122052 A1 Apr. 11, 2024

(30) Foreign Application Priority Data
Dec. 29, 2020 (JP) ................................ 2020-219845

(51) Int. Cl.
*H10K 59/80* (2023.01)
*H10K 59/12* (2023.01)
(Continued)

(52) U.S. Cl.
CPC ....... *H10K 59/873* (2023.02); *H10K 59/1201* (2023.02); *H10K 59/80521* (2023.02);
(Continued)

(58) Field of Classification Search
CPC ............ H10K 59/873; H10K 59/1201; H10K 59/80521; H10K 71/60; H10K 59/121;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 102070584 A 5/2011
CN 112314056 A 2/2021
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Donald L Raleigh
(74) *Attorney, Agent, or Firm* — Eric J. Robinson; Robinson Intellectual Property Law Office, P.C.

(57) ABSTRACT

A novel display panel that is highly convenient, useful, or reliable is provided. The display panel includes a first light-emitting device, a second light-emitting device, a partition, a first protective layer, and a second protective layer. The first light-emitting device includes a first electrode, a second electrode, and a first layer, and the first layer is interposed between the electrodes. The first layer includes a first material having a hole-transport property and a first substance having an electron-accepting property, and the first protective layer is in contact with the second electrode. The second light-emitting device includes a third electrode, a fourth electrode, and a second layer, and the second layer is interposed between the electrodes. The second layer
(Continued)

includes the first material having a hole-transport property and the first substance having an electron-accepting property, and the second layer includes a first gap between the second layer and the first layer. The second protective layer includes a second gap between the second protective layer and the first protective layer. The second gap overlaps with the first gap, and the second protective layer is in contact with the fourth electrode. The partition overlaps with the first gap and the second gap.

9 Claims, 22 Drawing Sheets

(51) Int. Cl.
*H10K 71/60* (2023.01)
*H10K 59/121* (2023.01)
*H10K 59/35* (2023.01)
*H10K 101/00* (2023.01)

(52) U.S. Cl.
CPC ........... *H10K 71/60* (2023.02); *H10K 59/121* (2023.02); *H10K 59/35* (2023.02); *H10K 2101/00* (2023.02)

(58) Field of Classification Search
CPC .... H10K 59/35; H10K 2101/00; H10K 50/19; H10K 59/122; H10K 71/233; G09F 9/00; G09F 9/30; H05B 33/02; H05B 33/04; H05B 33/10; H05B 33/12; H05B 33/22
See application file for complete search history.

(56) References Cited

U.S. PATENT DOCUMENTS

| | | | | |
|---|---|---|---|---|
| 8,674,366 | B2 * | 3/2014 | Suzawa | H10K 59/124 257/98 |
| 8,771,840 | B2 | 7/2014 | Suzuki et al. | |
| 9,142,598 | B2 | 9/2015 | Ohnuma et al. | |
| 9,196,836 | B2 | 11/2015 | Suzuki et al. | |
| 9,231,043 | B2 | 1/2016 | Sato | |
| 9,502,676 | B2 | 11/2016 | Ohnuma et al. | |
| 9,711,750 | B1 * | 7/2017 | Kim | H10K 71/00 |
| 9,796,736 | B2 | 10/2017 | Suzuki et al. | |
| 9,917,274 | B2 | 3/2018 | Ohnuma et al. | |
| 10,233,199 | B2 | 3/2019 | Suzuki et al. | |
| 11,236,114 | B2 | 2/2022 | Suzuki et al. | |
| 11,678,550 | B2 | 6/2023 | Kato | |
| 2002/0072139 | A1 | 6/2002 | Kashiwabara | |
| 2008/0238297 | A1 | 10/2008 | Oota | |
| 2011/0114928 | A1 | 5/2011 | Suzuki et al. | |
| 2011/0148290 | A1 | 6/2011 | Oota | |
| 2012/0248475 | A1 | 10/2012 | Yamada et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2012/0298973 | A1 | 11/2012 | Adachi et al. | |
| 2012/0326201 | A1 | 12/2012 | Ohnuma et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0248867 | A1 | 9/2013 | Kim et al. | |
| 2013/0280839 | A1 | 10/2013 | Sonoda et al. | |
| 2013/0295705 | A1 | 11/2013 | Sonoda. et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto. et al. | |
| 2015/0069360 | A1 | 3/2015 | Sato | |
| 2015/0076476 | A1 | 3/2015 | Odaka et al. | |
| 2015/0325812 | A1 | 11/2015 | Yamazaki et al. | |
| 2015/0357388 | A1 | 12/2015 | Pang | |
| 2016/0043341 | A1 | 2/2016 | Heo et al. | |
| 2016/0049941 | A1 | 2/2016 | How et al. | |
| 2016/0172595 | A1 | 6/2016 | Malinowski et al. | |
| 2016/0240794 | A1 | 8/2016 | Yamada et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2017/0271421 | A1 | 9/2017 | Jinbo et al. | |
| 2018/0190908 | A1 | 7/2018 | Ke et al. | |
| 2020/0203662 | A1 | 6/2020 | Mollard et al. | |
| 2021/0367020 | A1 * | 11/2021 | Bok | H10K 59/1213 |
| 2022/0106336 | A1 | 4/2022 | Suzuki et al. | |
| 2023/0088427 | A1 | 3/2023 | Nakamura et al. | |

FOREIGN PATENT DOCUMENTS

| | | | |
|---|---|---|---|
| EP | 2330102 | A | 6/2011 |
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2011-121940 | A | 6/2011 |
| JP | 2012-160473 | A | 8/2012 |
| JP | 2013-030476 | A | 2/2013 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| KR | 2011-0053198 | A | 5/2011 |
| KR | 2013-0007440 | A | 1/2013 |
| WO | WO-2020/004086 | | 1/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56) References Cited

OTHER PUBLICATIONS

International Search Report (Application No. PCT/IB2021/061733) Dated Mar. 22, 2022.
Written Opinion (Application No. PCT/IB2021/061733) Dated Mar. 22, 2022.

* cited by examiner

554B(j)
552
105
1032
106
1052
103
104
551B(i,j)

528

554G(j)

551G(i,j)

520

554R(j)

551R(i,j)

510

Y1

Y2

554B(j)
552
105
1032
106
1052
103
104
551B(i,j)

554G(j)

Y3

Y4

DISPLAY PANEL, DATA PROCESSING DEVICE, AND MANUFACTURING METHOD OF THE DISPLAY PANEL

TECHNICAL FIELD

One embodiment of the present invention relates to a display panel, a manufacturing method of a display panel, a data processing device, or a semiconductor device.

Note that one embodiment of the present invention is not limited to the above technical field. The technical field of one embodiment of the invention disclosed in this specification relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

A manufacturing method of an organic EL display in which a light-emitting layer can be formed without using a fine metal mask is known. An example of the method is a manufacturing method of an organic EL display (Patent Document 1). The method includes a step of forming a first light-emitting layer as a continuous film crossing a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film crossing a display region by deposition of a second luminescent organic material, which contains a mixture of a host material and a dopant material but differs from the first luminescent organic material, over the first light-emitting layer; and a step of forming a counter electrode over the second light-emitting layer.

REFERENCE

Patent Document

[Patent Document 1] Japanese Published Patent Application No. 2012-160473

SUMMARY OF THE INVENTION

Problems to be Solved by the Invention

An object of one embodiment of the present invention is to provide a novel display panel that is highly convenient, useful, or reliable. Another object is to provide a novel manufacturing method of a display panel that is highly convenient, useful, or reliable. Another object is to provide a novel data processing device that is highly convenient, useful, or reliable. Another object is to provide a novel display panel, a novel manufacturing method of a display panel, a novel data processing device, or a novel semiconductor device.

The description of these objects does not preclude the existence of other objects. Note that one embodiment of the present invention does not have to achieve all the objects. Other objects will be apparent from the description of the specification, the drawings, the claims, and the like, and other objects can be derived from the description of the specification, the drawings, the claims, and the like.

Means for Solving the Problems (1) One embodiment of the present invention is a display panel including a first light-emitting device, a second light-emitting device, a partition, a first protective layer, and a second protective layer.

The first light-emitting device includes a first electrode, a second electrode, and a first layer, and the first layer includes a region interposed between the second electrode and the first electrode.

The first layer includes a first material having a hole-transport property and a first substance having an electron-accepting property, and the first layer has an electrical resistivity higher than or equal to $1\times10^2$ Ωcm and lower than or equal to $1\times10^8$ Ωcm.

The first protective layer is in contact with the second electrode, and the second electrode is interposed between the first protective layer and the first electrode.

The second light-emitting device includes a third electrode, a fourth electrode, and a second layer, and the second layer includes a region interposed between the fourth electrode and the third electrode.

The second layer includes the first material having a hole-transport property and the first substance having an electron-accepting property, and the second layer includes a first gap between the second layer and the first layer.

The second protective layer includes a second gap between the second protective layer and the first protective layer, and the second gap overlaps with the first gap. The second protective layer is in contact with the fourth electrode, and the fourth electrode is interposed between the second protective layer and the third electrode.

The partition includes a first opening portion and a second opening portion, the first opening portion overlaps with the first electrode, and the second opening portion overlaps with the third electrode. The partition overlaps with the first gap and the second gap between the first opening portion and the second opening portion.

(2) Another embodiment of the present invention is a display panel including a first light-emitting device, a second light-emitting device, a partition, a first protective layer, and a second protective layer.

The first light-emitting device includes a first electrode, a second electrode, a first unit, and a first layer.

The second electrode overlaps with the first electrode, the first unit includes a region interposed between the second electrode and the first electrode, and the first layer includes a region interposed between the first unit and the first electrode.

The first layer includes a first material having a hole-transport property and a first substance having an electron-accepting property, and the first layer has an electrical resistivity higher than or equal to $1\times10^2$ Ωcm and lower than or equal to $1\times10^8$ Ωcm.

The first protective layer is in contact with the second electrode, and the second electrode is interposed between the first protective layer and the first electrode.

The second light-emitting device includes a third electrode, a fourth electrode, a second unit, and a second layer.

The fourth electrode overlaps with the third electrode, and the second unit includes a region positioned between the fourth electrode and the third electrode.

The second layer includes a region interposed between the second unit and the third electrode. The second layer includes the first material having a hole-transport property and the first substance having an electron-accepting property. The second layer includes a first gap between the second layer and the first layer.

The second protective layer includes a second gap between the second protective layer and the first protective layer. The second gap overlaps with the first gap. The second protective layer is in contact with the fourth electrode. The fourth electrode is interposed between the second protective layer and the third electrode.

The partition includes a first opening portion and a second opening portion. The first opening portion overlaps with the first electrode. The second opening portion overlaps with the third electrode. The partition overlaps with the first gap and the second gap between the first opening portion and the second opening portion.

Thus, the first protective layer can protect the first light-emitting device from, for example, damage caused by a physical load or a chemical load applied in the manufacturing process. The second protective layer can protect the second light-emitting device. In addition, a layer over the partition which overlaps with the second gap can be removed using the first protective layer and the second protective layer as hard masks. Moreover, the first gap can be formed using the second gap.

Electrical continuity between the first layer and the second layer can be inhibited. A phenomenon in which current flows between the first electrode and the fourth electrode through the first layer and the second layer can be inhibited. A phenomenon in which current flows between the third electrode and the second electrode through the first layer and the second layer can be inhibited. In addition, occurrence of a crosstalk phenomenon between the first light-emitting device and the second light-emitting device can be inhibited. As a result, a novel display panel that is highly convenient, useful, or reliable can be provided.

(3) Another embodiment of the present invention is the above display panel in which the first light-emitting device includes a third unit and a first intermediate layer, and the second light-emitting device includes a fourth unit and a second intermediate layer.

The third unit includes a region interposed between the second electrode and the first unit.

The first intermediate layer includes a region interposed between the third unit and the first unit. The first intermediate layer includes a second material having a hole-transport property and a second substance having an electron-accepting property. The first intermediate layer has an electrical resistivity higher than or equal to $1\times10^2$ Ωcm and lower than or equal to $1\times10^8$ Ωcm.

The fourth unit includes a region interposed between the fourth electrode and the second unit.

The second intermediate layer includes a region interposed between the fourth unit and the second unit. The second intermediate layer includes the second material having a hole-transport property and the second substance having an electron-accepting property. The second intermediate layer includes a third gap between the second intermediate layer and the first intermediate layer.

The partition overlaps with the third gap between the first opening portion and the second opening portion.

A phenomenon in which current flows between the first electrode and the fourth electrode through the first layer and the second layer or through the first intermediate layer and the second intermediate layer can be inhibited. A phenomenon in which current flows between the third electrode and the second electrode through the first layer and the second layer can be inhibited. In addition, occurrence of a crosstalk phenomenon between the first light-emitting device and the second light-emitting device can be inhibited. As a result, a novel display panel that is highly convenient, useful, or reliable can be provided.

(4) Another embodiment of the present invention is the above display panel in which the first material having a hole-transport property is an aromatic amine compound or an organic compound having a Tc-electron rich heteroaromatic ring, and the first substance having an electron-accepting property is an organic compound including fluorine or a cyano group or a transition metal oxide.

Thus, holes can be supplied from the positive electrode side to the cathode side. Note that the second layer of the second light-emitting device is separated from the first layer of the first light-emitting device, whereby a crosstalk phenomenon can be inhibited. As a result, a novel display panel that is highly convenient, useful, or reliable can be provided.

(5) Another embodiment of the present invention is the above display panel in which the first protective layer and the second protective layer includes aluminum oxide.

(6) Another embodiment of the present invention is the display panel including a first insulating film.

The first insulating film is in contact with the first protective layer, and the first protective layer includes a region interposed between the first insulating film and the second electrode.

The first insulating film is in contact with the second protective layer, and the second protective layer includes a region interposed between the first insulating film and the fourth electrode.

The first layer includes a first sidewall, and the second layer includes a second sidewall.

The second sidewall faces the first sidewall, and the first gap is interposed between the second sidewall and the first sidewall. The first sidewall and the second sidewall are in contact with the first insulating film.

(7) Another embodiment of the present invention is the above display panel includes a second insulating film, and the second insulating film fills the first gap.

Thus, a phenomenon in which impurities diffuse into the first light-emitting device and the second light-emitting device can be inhibited. In addition, the reliability of the first light-emitting device and the second light-emitting device can be improved. As a result, a novel display panel that is highly convenient, useful, or reliable can be provided.

(8) Another embodiment of the present invention is a data processing device including one or more of a keyboard, a hardware button, a pointing device, a touch sensor, an illuminance sensor, an imaging device, an audio input device, an eye-gaze input device, and an attitude detection device, and the above display panel.

Thus, an arithmetic device can generate the image data or the control data on the basis of the data supplied using a variety of input devices. Thus, a novel data processing device that is highly convenient or reliable can be provided.

(9) Another embodiment of the present invention is a manufacturing method of a display panel, which includes the following twelve steps.

In the first step, a first electrode and a second electrode are formed.

In the second step, a partition is formed between the first electrode and the second electrode.

In the third step, a first layer is formed over the first electrode and the second electrode.

In the fourth step, a first unit is formed over the first layer.

In the fifth step, a second layer including a first organic compound and a first metal is formed over the first unit by a co-evaporation method.

In the sixth step, an intermediate layer is formed over the second unit.

In the seventh step, a second unit is formed over the intermediate layer.

In the eighth step, a third layer including a second organic compound and a second metal is formed over the second unit by a co-evaporation method.

In the ninth step, a third electrode is formed over the third layer.

In the tenth step, a first protective layer is formed over the third electrode.

In the eleventh step, the second protective layer and the third protective layer are processed into a predetermined shape by removing the first protective layer over the partition by a photoetching method.

In the twelfth step, a first light-emitting device and a second light-emitting device are formed by removing the first layer, the first unit, the second layer, the intermediate layer, the second unit, the third layer, and the third electrode that are over the partition with use of the second protective layer and the third protective layer as hard masks.

Accordingly, the second protective layer and the third protective layer can be resistant to the step in which the component over the partition is removed. For example, a processing condition in which a resist formed of an organic material such as a photopolymer is removed can be applied to the step in which the component over the partition is removed. Moreover, for example, when a resist formed of an organic material such as a photopolymer is removed, the light-emitting device can be protected using the protective layer. As a result, a novel manufacturing method of a display panel that is highly convenient, useful, or reliable can be provided.

Although a block diagram in which components are classified by their functions and shown as independent blocks is shown in the drawing attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the names of the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient, useful, or reliable can be provided. A novel manufacturing method of a display panel that is highly convenient, useful, or reliable can be provided. A novel data processing device that is highly convenient, useful, or reliable can be provided. A novel display panel, a novel manufacturing method of a display panel, a novel data processing device, or a novel semiconductor device can be provided.

The description of these effects does not preclude the existence of other effects. Note that one embodiment of the present invention does not need to have all the effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
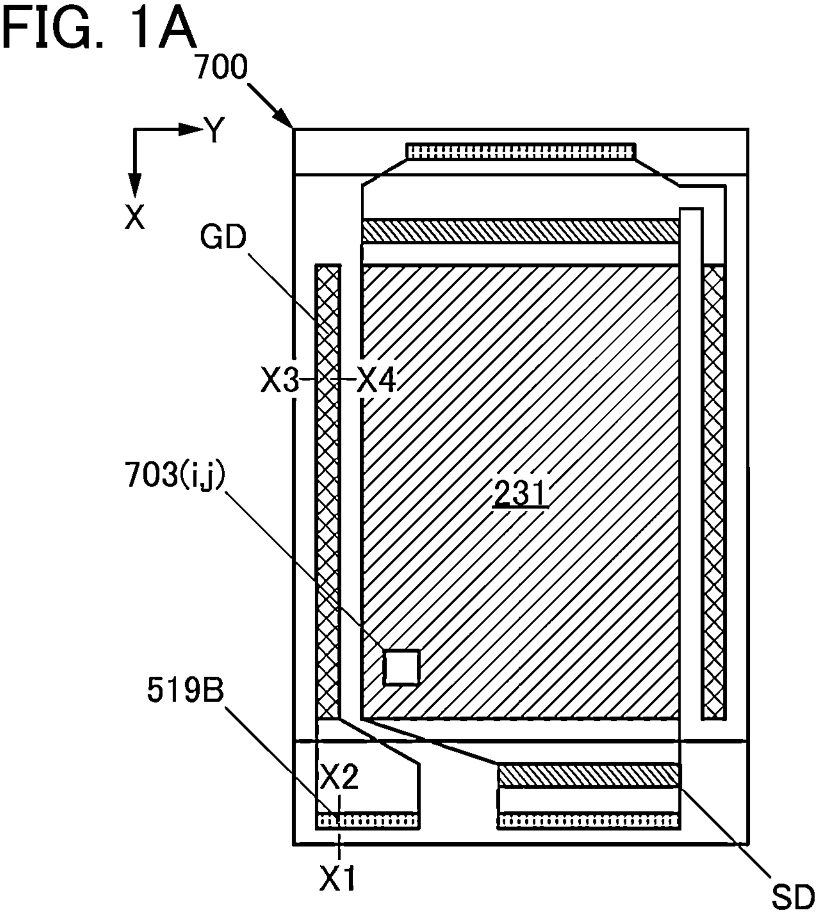
FIG. 1A and FIG. 1B are diagrams illustrating a structure of a display panel according to an embodiment.

A display panel of one embodiment of the present invention includes a first light-emitting device, a second light-emitting device, a partition, a first protective layer, and a second protective layer. The first light-emitting device includes a first electrode, a second electrode, and a first layer. The first layer includes a region interposed between the second electrode and the first electrode. The first layer includes a first material having a hole-transport property and a first substance having an electron-accepting property, and the first layer has an electrical resistivity higher than or equal to $1\times10^2$ Ωcm and lower than or equal to $1\times10^8$ Ωcm. The first protective layer is in contact with the second electrode, and the second electrode is interposed between the first protective layer and the first electrode. The second light-emitting device includes a third electrode, a fourth electrode, and a second layer, and the second layer includes a region interposed between the fourth electrode and the third electrode. The second layer includes the first material having a hole-transport property and the first substance having an electron-accepting property, and the second layer includes a first gap between the second layer and the first layer. The second protective layer includes a second gap between the second protective layer and the first protective layer, and the second gap overlaps with the first gap. The second protective layer is in contact with the fourth electrode, and the fourth electrode is interposed between the second protective layer and the third electrode. The partition includes a first opening portion and a second opening portion, the first opening portion overlaps with the first electrode, and the second opening portion overlaps with the third electrode. The partition overlaps with the first gap and the second gap between the first opening portion and the second opening portion.

Thus, the first protective layer can protect the first light-emitting device from, for example, damage caused by a physical load or a chemical load applied in the manufacturing process. The second protective layer can protect the second light-emitting device. In addition, a layer over the partition which overlaps with the second gap can be removed using the first protective layer and the second protective layer as hard masks. Moreover, the first gap can be formed using the second gap. As a result, a novel display panel that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, structures of a display panel of one embodiment of the present invention are described with reference to FIG. 1 to FIG. 8.

Figure 1B:
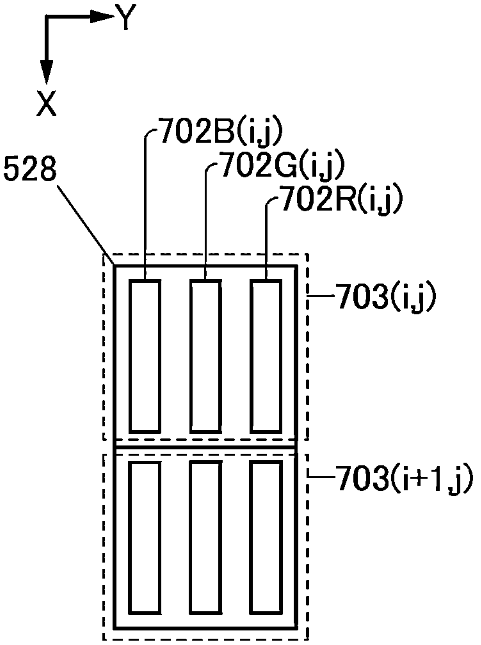

FIG. 1 shows block diagrams illustrating a structure of the display panel of one embodiment of the present invention. FIG. 1A is a top view illustrating the display panel of one embodiment of the present invention, and FIG. 1B is a top view illustrating part of the display panel.

Figure 2:
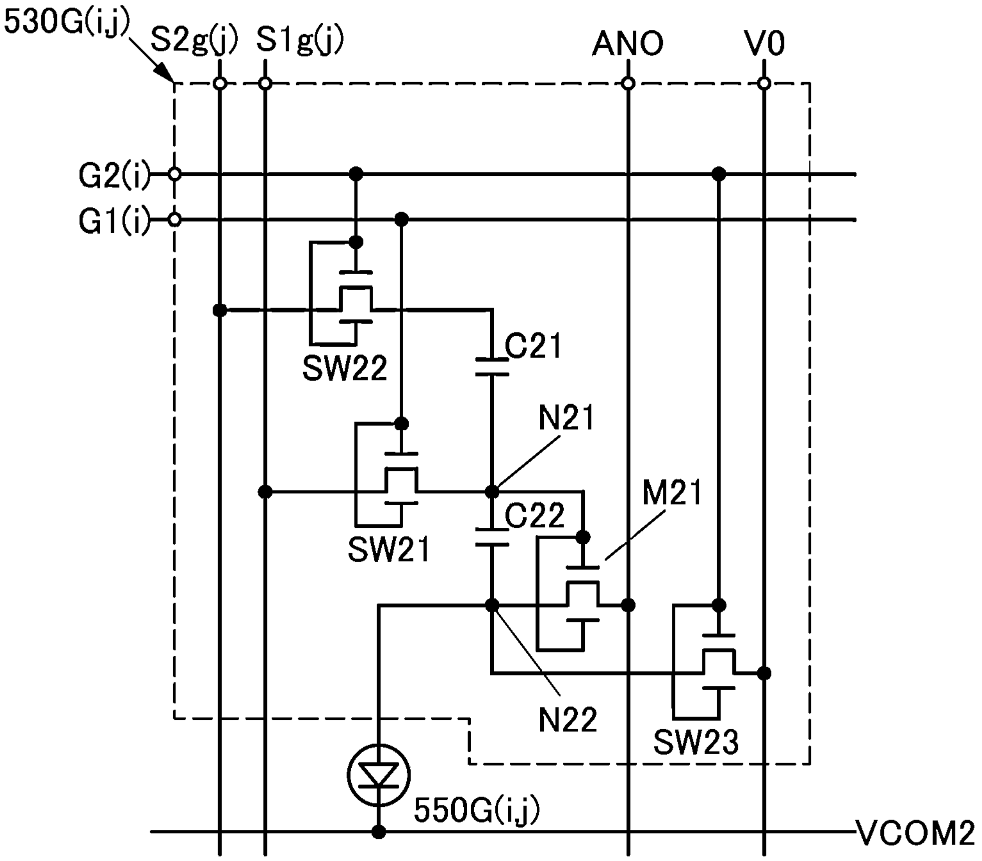
FIG. 2 is a circuit diagram illustrating a pixel of a display panel according to an embodiment.

FIG. 2 is a circuit diagram illustrating a pixel of the display panel of one embodiment of the present invention.

FIG. 3 shows cross-sectional views illustrating structures of the display panel of one embodiment of the present invention. FIG. 3A is a diagram illustrating cross sections taken along the cutting line X1-X2 and the cutting line X3-X4 in FIG. 1A and a cross section of a set of pixels 703(*i,j*). FIG. 3B is a cross-sectional view illustrating a transistor that can be used for the display panel of one embodiment of the present invention. FIG. 3C is a cross-sectional view illustrating the direction of light emitted by the display panel of one embodiment of the present invention, and FIG. 3D is a cross-sectional view illustrating the direction of light emitted by the display panel of one embodiment of the present invention, which is different from the display panel of one embodiment of the present invention described with reference to FIG. 3C.

Figure 4A:
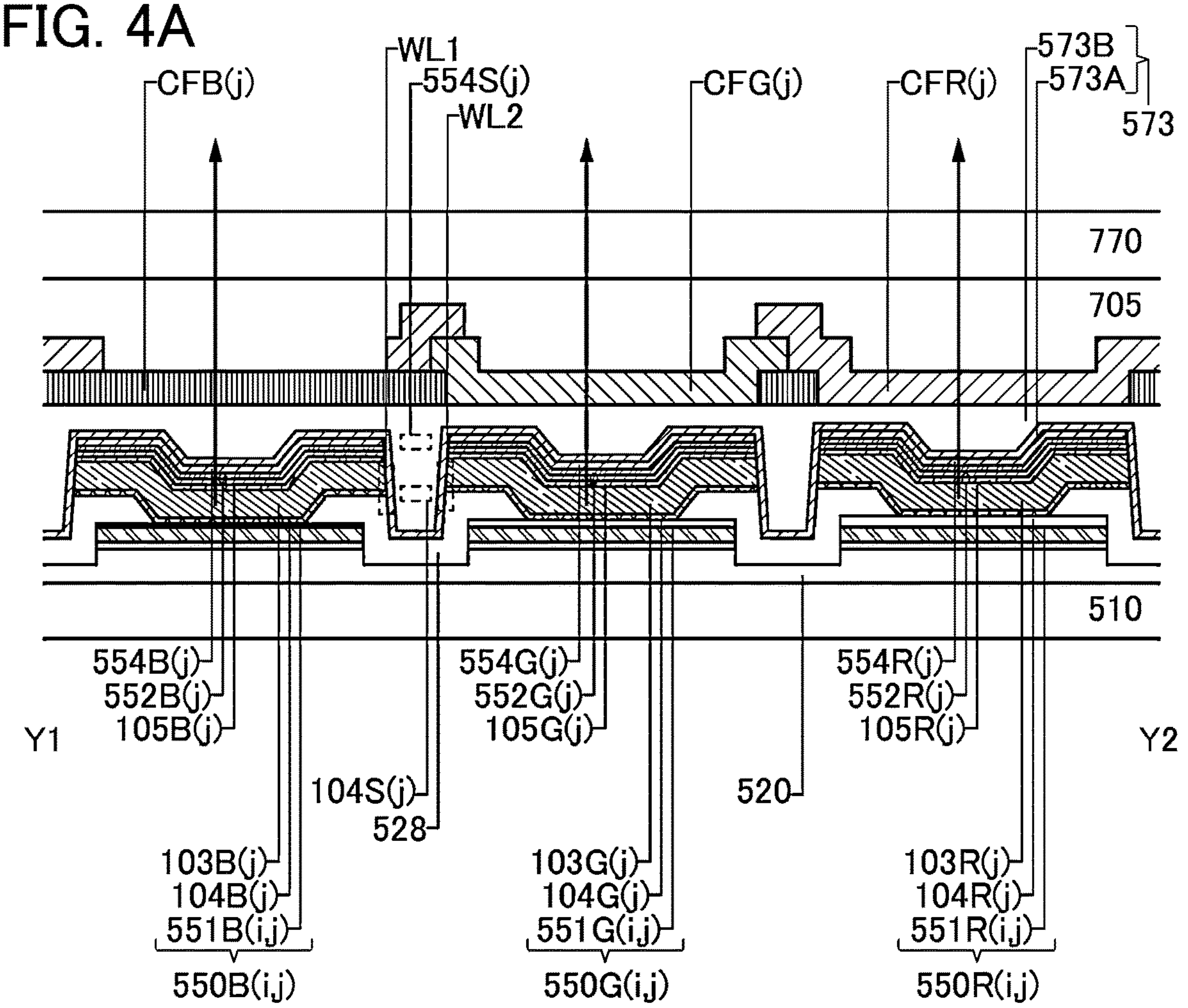
FIG. 4A to FIG. 4C are diagrams illustrating a structure of a display panel according to an embodiment.
Figure 4B:
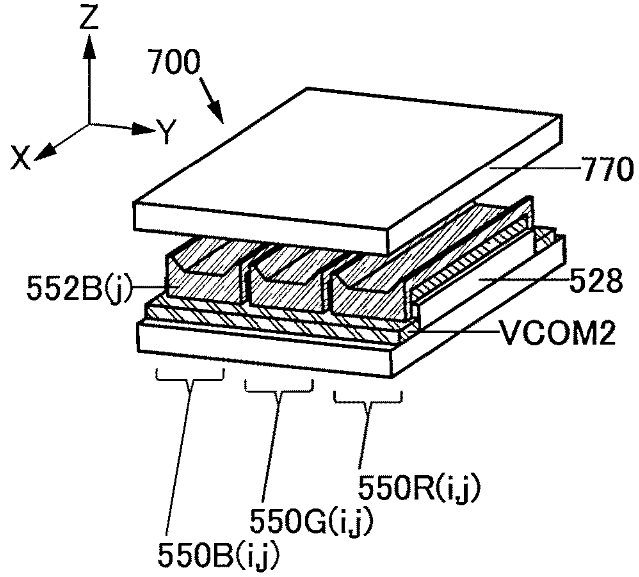
Figure 4C:
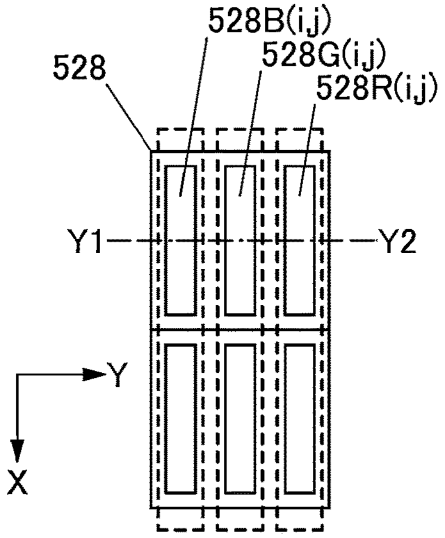

FIG. 4 shows diagrams illustrating a structure of the display panel of one embodiment of the present invention. FIG. 4A is a cross-sectional view of a pixel in the display panel of one embodiment of the present invention, FIG. 4B is a perspective view of the pixel in FIG. 4A, and FIG. 4C is a top view of the pixel in FIG. 4A. Note that insulating films are omitted in FIG. 4B and FIG. 4C in order to avoid complexity of the drawings.

Figure 5:
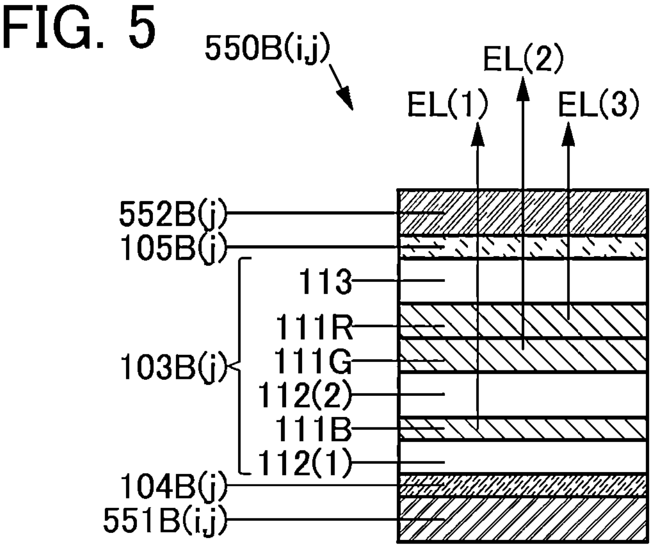
FIG. 5 is a diagram illustrating a structure of a display panel according to an embodiment.

FIG. 5 shows a diagram illustrating a structure of the display panel of one embodiment of the present invention. FIG. 5 is a cross-sectional view illustrating part of the display panel illustrated in FIG. 4A.

Figure 6A:
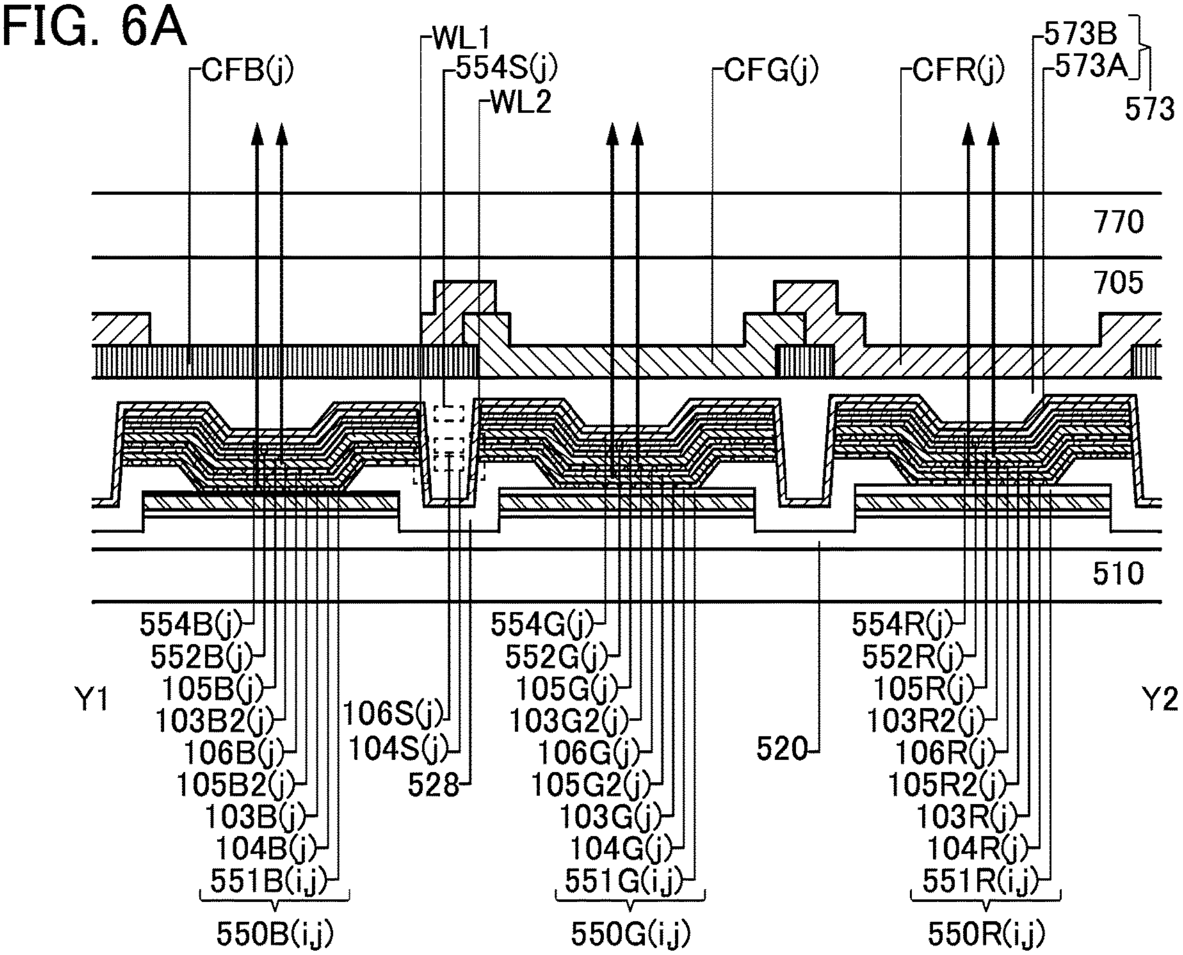
FIG. 6A to FIG. 6C are diagrams illustrating a structure of a display panel according to an embodiment.
Figure 6B:
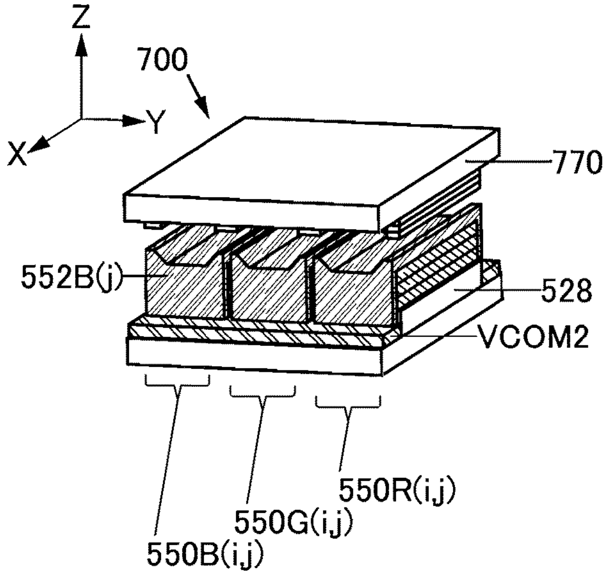
Figure 6C:
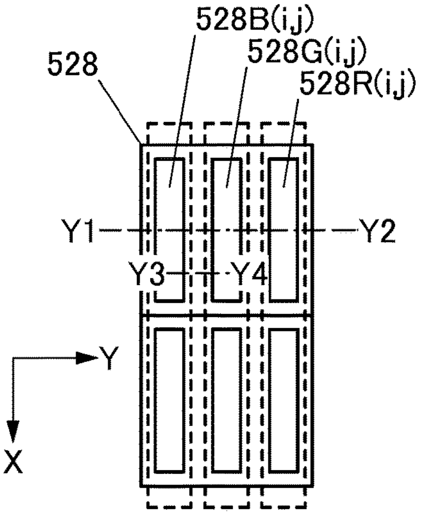

FIG. 6 is a diagram illustrating a structure of the display panel of one embodiment of the present invention. FIG. 6A is a cross-sectional view of a pixel in the display panel of one embodiment of the present invention, FIG. 6B is a perspective view of the pixel in FIG. 6A, and FIG. 6C is a top view of the pixel in FIG. 6A. Note that insulating films are omitted in FIG. 6B and FIG. 6C in order to avoid complexity of the drawings.

Figure 7:
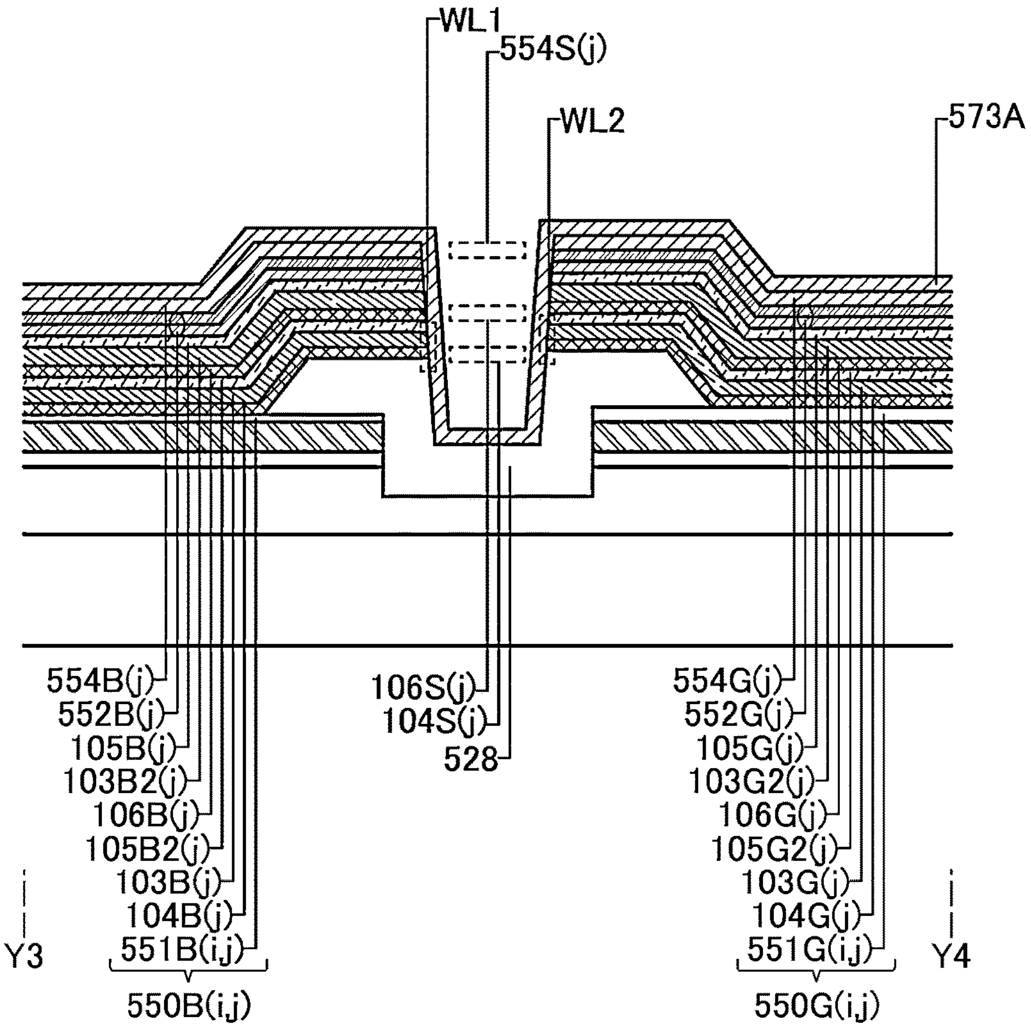
FIG. 7 is a diagram illustrating part of FIG. 6A.

FIG. 7 is a cross-sectional view of a pixel in the display panel of one embodiment of the present invention, and FIG. 7 is a diagram illustrating part of a pixel in FIG. 6A.

Figure 8A:
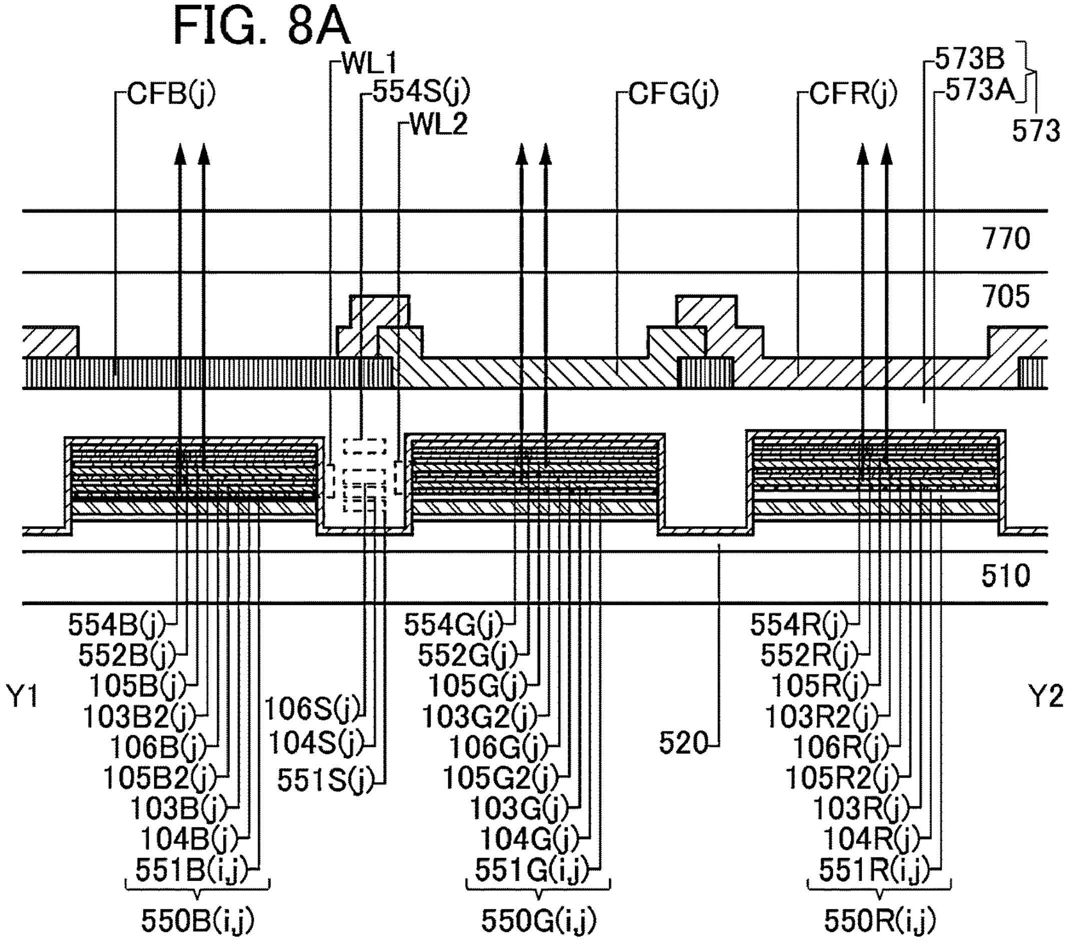
FIG. 8A and FIG. 8B are diagrams illustrating a structure of a display panel according to an embodiment.
Figure 8B:
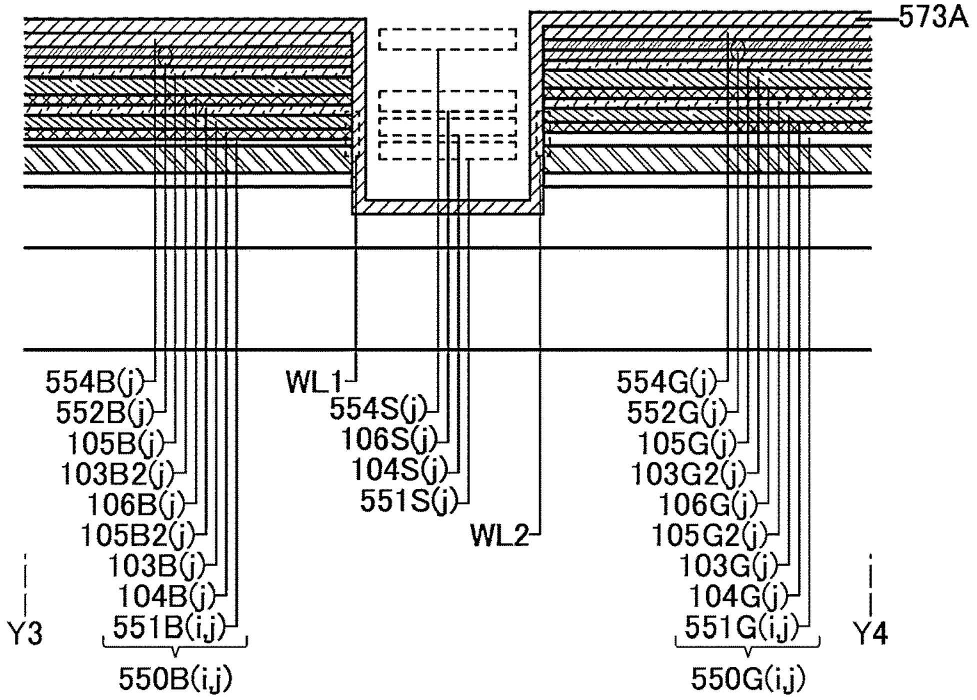
Figure 9A:
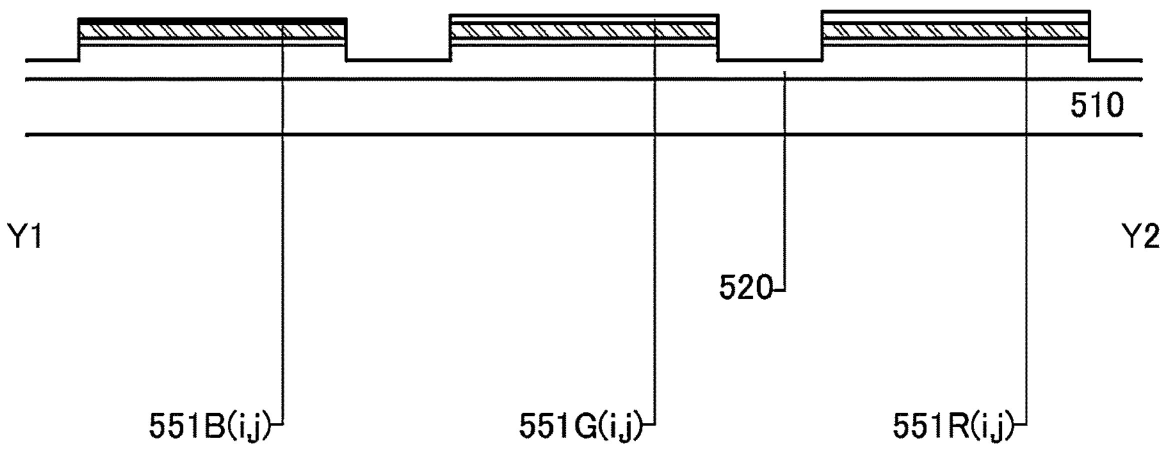
FIG. 9A and FIG. 9B are diagrams illustrating a manufacturing method of a display panel according to an embodiment.
Figure 9B:
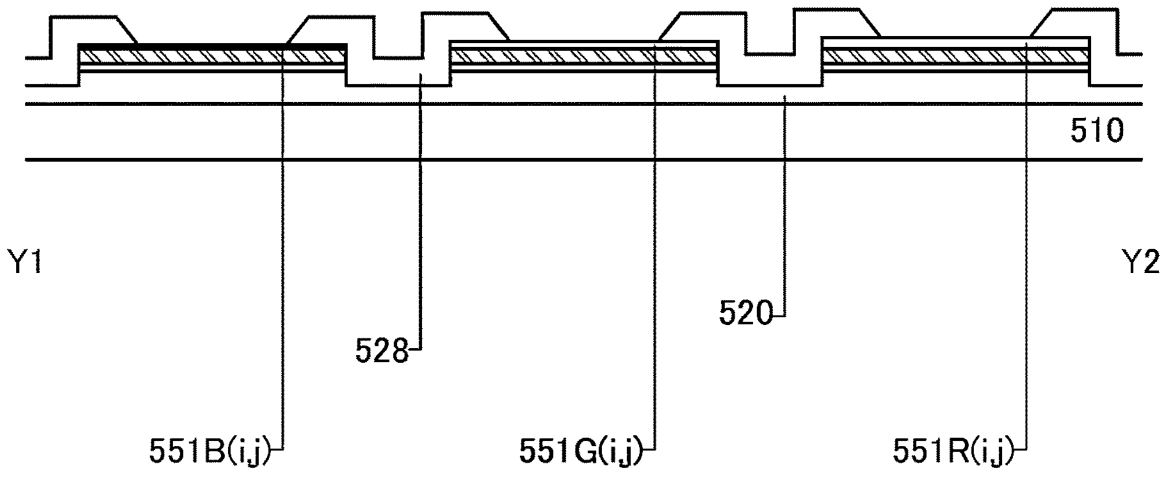

FIG. 8 show cross-sectional views illustrating the display panel of one embodiment of the present invention, which is different from the display panel of one embodiment of the present invention described with reference to FIG. 4 to FIG. 7. FIG. 8A is a cross-sectional view of a pixel in the display panel of one embodiment of the present invention, and FIG. 8B is a cross-sectional view illustrating part of the display panel in FIG. 8A.

In this specification and the like, a device formed using a metal mask or an FMM (a fine metal mask, a high-resolution metal mask) may be referred to as a device having an MM (a metal mask) structure. In this specification and the like, a device formed without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light is sometimes referred to as a white-light-emitting device. Note that a white-light-emitting device that is combined with coloring layers (e.g., color filters) can be a light-emitting device for full-color display.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that their emission colors are complementary. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is employed in which light from light-emitting layers of a plurality of light-emitting units is combined to enable white light emission. Note that a structure for obtaining white light emission is similar to that in the case of a single structure. In the device with a tandem structure, it is preferable that an intermediate layer such as a charge-generation layer be provided between the plurality of light-emitting units.

When the above white-light-emitting device (having a single structure or a tandem structure) and a light-emitting device having an SBS structure are compared to each other, the light-emitting device having an SBS structure can have lower power consumption than the white light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

Note that in this specification, an integer variable of 1 or more is sometimes used in reference numerals. For example, (p) where p is an integer variable of 1 or more is sometimes used in part of a reference numeral that specifies any of p components at a maximum. As another example, (m, n) where m and n are each an integer variable of 1 or more is sometimes used in part of a reference numeral that specifies any of m×n components at a maximum.

<Structure Example 1 of Display Panel 700 <

A display panel 700 includes a display region 231, and the display region 231 includes the set of pixels 703(*i,j*) (see FIG. 1A). The display region 231 also includes a set of pixels 703(*i*+1,*j*) adjacent to the set of pixels 703(*i,j*) (see FIG. 1B).

<<Structure Example 1 of Display Region 231>>

For example, the display region 231 includes 500 or more pixel sets per inch. Furthermore, the display region 231 includes 1000 or more pixel sets per inch, preferably 5000 or more pixel sets per inch, further preferably 10000 or more pixel sets per inch. Thus, this can reduce a screen-door effect in the case where the display panel is used for a goggle-type display device, for example.

<<Structure Example 2 of Display Region 231>>

For example, the display region 231 includes a plurality of pixels in a matrix. For example, the display region 231 includes 7600 or more pixels in the row direction and the display region 231 includes 4300 or more pixels in the column direction. Specifically, 7680 pixels are provided in the row direction and 4320 pixels are provided in the column direction.

Thus, a high-definition image can be displayed. As a result, a novel display panel that is highly convenient or reliable can be provided.

<<Structure Example 3 of Display Region 231>>

For example, in the case where the display panel 700 is used in a television system, the diagonal size of the display region 231 is greater than or equal to 32 inches, preferably greater than or equal to 55 inches, further preferably greater than or equal to 80 inches. The diagonal size of the display region 231 is preferably less than or equal to 200 inches, in which case the weight of the display panel can be reduced.

Thus, a realistic image can be displayed. As a result, a novel display panel that is highly convenient or reliable can be provided.

<<Structure Example 1 of Pixel 703(*i,j*)>>

A plurality of pixels can be used in the pixel 703(*i,j*) (see FIG. 1B). For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that an individual pixel cannot display.

Specifically, a pixel 702B(*i,j*) displaying blue, a pixel 702G(*i,j*) displaying green, and a pixel 702R(*i,j*) displaying red can be used in the pixel 703(*i,j*). The pixel 702B(*i,j*), the pixel 702G(*i,j*), and the pixel 702R(*i,j*) can each be referred to as a subpixel.

A pixel displaying white or the like can be used in addition to the above set in the pixel 703(*i,j*), for example. A pixel displaying cyan, a pixel displaying magenta, and a pixel displaying yellow can be used in the pixel 703(*i,j*).

A pixel emitting infrared rays can be used in addition to the above set in the pixel 703(*i,j*), for example. Specifically, a pixel that emits light including light with a wavelength greater than or equal to 650 nm and less than or equal to 1000 nm can be used in the pixel 703(*i,j*).

<Structure Example 2 of Display Panel 700>

Figure 3A:
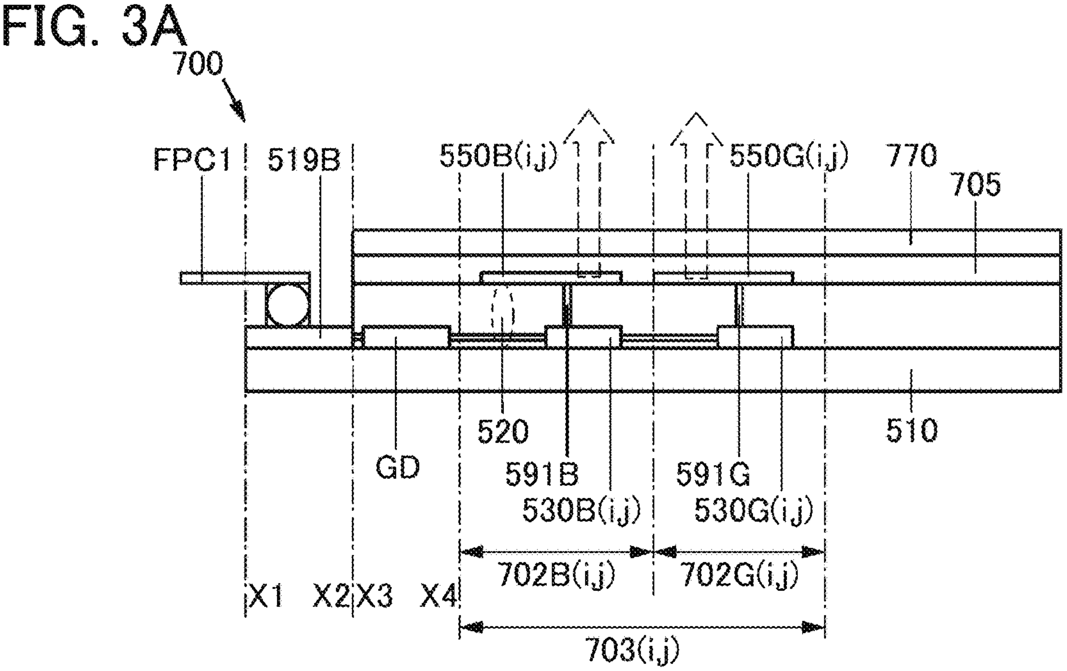
FIG. 3A to FIG. 3D are diagrams illustrating structures of a display panel according to an embodiment.

The display panel described in this embodiment includes a driver circuit GD and a driver circuit SD (see FIG. 1A and FIG. 3A). In addition, a terminal 519B is included. The terminal 519B can be electrically connected to a flexible printed circuit FPC1, for example.

<<Structure Example of Driver Circuit GD>>

The driver circuit GD has a function of supplying a first selection signal and a second selection signal. For example, the driver circuit GD is electrically connected to a conductive film G1(*i*) to supply the first selection signal, and is electrically connected to a conductive film G2(*i*) to supply the second selection signal.

<<Structure Example of Driver Circuit SD>>

The driver circuit SD has a function of supplying an image signal and a control signal, and the control signal includes a first level and a second level. For example, the driver circuit SD is electrically connected to a conductive film S1*g*(*j*) to supply the image signal, and is electrically connected to a conductive film S2*g*(*j*) to supply the control signal.

<Structure Example 3 of Display Panel 700>

The display panel 700 includes the set of pixels 703(*i,j*) and a functional layer 520 (see FIG. 3A).

The set of pixels 703(*i,j*) includes the pixel 702B(*i,j*), the pixel 702G(*i,j*), and a partition 528 (see FIG. 1*i*).

The pixel 702B(*i,j*) includes a light-emitting device 550B (*i,j*) and a pixel circuit 530B(*i,j*).

Note that the pixel 702G(*i,j*) includes a light-emitting device 550G(*i,j*) (see FIG. 3A).

The display panel 700 includes a base material 510, a base material 770, and the functional layer 520 (see FIG. 3A). The functional layer 520 is interposed between the base material 770 and the base material 510. The display panel 700 includes an insulating film 705, and the insulating film 705 has a function of bonding the base material 770 and the functional layer 520.

<<Base Material 510 and Base Material 770>>

A material having a light-transmitting property can be used for the base material 510 or the base material 770.

For example, a flexible material can be used for the base material 510 or the base material 770. Thus, a flexible functional panel can be provided.

For example, a material with a thickness smaller than or equal to 0.7 mm and larger than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be manufactured.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Aluminosilicate glass, tempered glass, chemically tempered glass, sapphire, or the like can be suitably used for the base material 510 or the base material 770 that is provided on the side close to a user of the functional panel. Thus, the functional panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as a resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. The frequency of occurrence of breakage or the like due to dropping can be reduced, for example.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Diffusion of impurities contained in glass or a resin can be prevented. Diffusion of impurities that pass through a resin can be prevented.

Furthermore, paper, wood, or the like can be used for the base material 510 or the base material 770.

For example, a material having heat resistance high enough to withstand heat treatment in the manufacturing process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a process substrate having heat resistance to heat applied in the manufacturing process, and the formed insulating film, transistor, capacitor, or the like is transferred to the base material 510 or the base material 770 can be used. Accordingly, an insulating film, a transistor, a capacitor, or the like can be formed on a flexible substrate, for example.

The functional layer 520 includes the pixel circuit 530B(*i,j*), a pixel circuit 530G(*i,j*), and the driver circuit GD. The pixel circuit 530B(*i,j*) is electrically connected to the light-emitting device 550B(*i,j*) through an opening portion 591B, and the pixel circuit 530G(*i,j*) is electrically connected to the light-emitting device 550G(*i,j*) through an opening portion 591G.

Figure 3B:
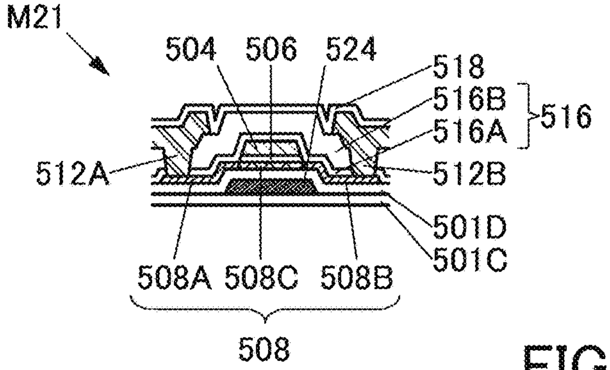
Figure 3C:
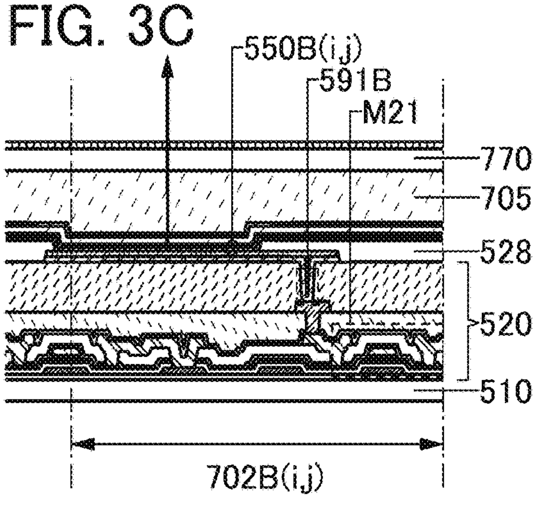

Note that the display panel displays information through the base material 770 (see FIG. 3C). In other words, the light-emitting device 550B(*i,j*) emits light toward the direction in which the functional layer 520 is not placed. The light-emitting device 550B(*i,j*) can be referred to as a top-emission light-emitting device.

A base material in which touch sensors are arranged in a matrix can be used as the base material 770. For example, a capacitive touch sensor or an optical touch sensor can be used for the base material 770. Thus, the display panel of one embodiment of the present invention can be used as a touch panel.

<Structure Example 4 of Display Panel 700>

Figure 3D:
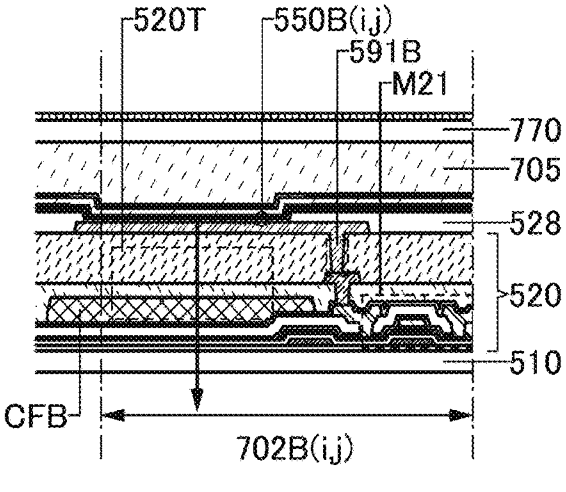

The display panel 700 includes the base material 510, the base material 770, and the functional layer 520 (see FIG. 3D). Note that the display panel described with reference to FIG. 3D is different from the display panel described with reference to FIG. 3C in that information is displayed through the base material 510. In other words, the light-emitting device 550B(*i,j*) emits light toward the functional layer 520. The light-emitting device 550B(*i,j*) can be referred to as a bottom-emission light-emitting device.

<Structure Example 5 of Display Panel 700>

The display panel 700 includes the conductive film G1(*i*), the conductive film G2(*i*), the conductive film S1*g*(*j*), the conductive film S2*g*(*j*), a conductive film ANO, and a conductive film VCOM2 (see FIG. 2).

The functional layer 520 includes the pixel circuit 530G(*i,j*) and a region 520T having a light-transmitting property. The pixel circuit 530B(*i,j*) is electrically connected to the light-emitting device 550B(*i,j*), and the region 520T having a light-transmitting property transmits light emitted from the light-emitting device 550B(*i,j*).

For example, the conductive film G1(*i*) is supplied with the first selection signal, the conductive film G2(*i*) is supplied with the second selection signal, the conductive film S1*g*(*j*) is supplied with the image signal, and the conductive film S2*g*(*j*) is supplied with the control signal.

<<Structure Example 2 of Pixel 703(*i,j*)>>

The set of pixels 703(*i,j*) includes the pixel 702G(*i,j*) (see FIG. 1). The pixel 702G(*i,j*) includes the pixel circuit 530G(*i,j*) and the light-emitting device 550G(*i,j*) (see FIG. 3).

<Structure Example 1 of Pixel Circuit 530G(*i,j*)

The pixel circuit 530G(*i,j*) is supplied with the first selection signal, and the pixel circuit 530G(*i,j*) obtains an image signal on the basis of the first selection signal. For example, the first selection signal can be supplied using the conductive film G1(*i*) (see FIG. 2). The image signal can be supplied using the conductive film S1*g*(*j*). Note that the operation of supplying the first selection signal and making the pixel circuit 530G(*i,j*) obtain the image signal can be referred to as "writing."

<<Structure Example 2 of Pixel Circuit 530G(*i,j*)>>

The pixel circuit 530G(*i,j*) includes a switch SW21, a switch SW22, a transistor M21, a capacitor C21, and a node N21 (see FIG. 2). In addition, the pixel circuit 530G(*i,j*) includes a node N22, a capacitor C22, and a switch SW23.

The transistor M21 includes a gate electrode electrically connected to the node N21, a first electrode electrically connected to the light-emitting device 550G(*i,j*), and a second electrode electrically connected to the conductive film ANO.

The switch SW21 includes a first terminal electrically connected to the node N21 and a second terminal electrically connected to the conductive film S1*g*(*j*), and has a function of controlling the conduction state or the non-conduction state on the basis of a potential of the conductive film G1(*i*).

The switch SW22 includes a first terminal electrically connected to the conductive film S2*g*(*j*), and has a function of controlling the conduction state or the non-conduction state on the basis of a potential of the conductive film G2(*i*).

The capacitor C21 includes a conductive film electrically connected to the node N21 and a conductive film electrically connected to a second electrode of the switch SW22.

Thus, the image signal can be stored in the node N21. A potential of the node N21 can be changed using the switch SW22. Alternatively, the intensity of light emitted from the light-emitting device 550G(*i,j*) can be controlled with the potential of the node N21.

<<Structure Example of Transistor>>

A bottom-gate transistor, a top-gate transistor, or the like can be used in the functional layer 520. Specifically, a transistor can be used as a switch.

The transistor M21 includes a semiconductor film 508, a conductive film 504, a conductive film 512A, and a conductive film 512B (see FIG. 3B). The transistor M21 is formed over an insulating film 501C, for example.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region interposed between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor M21. The conductive film 524 includes a region where the semiconductor film 508 is interposed between the conductive film 524 and the conductive film 504. The conductive film 524 has a function of a second gate electrode. An insulating film 501D is interposed between the semiconductor film 508 and the conductive film 524, and has a function of a second gate insulating film. Note that an insulating film 518 covers the transistor M21. An insulating film 516 includes an insulating film 516A and an insulating film 516B.

Note that the semiconductor film used in the transistor of the driver circuit can be formed in the step of forming the semiconductor film used in the transistor of the pixel circuit. A semiconductor film having the same composition as the semiconductor film used in the transistor of the pixel circuit can be used in the driver circuit, for example.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. The size of the display panel can be easily increased.

[Polysilicon]

For example, polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for fabrication of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a display panel with higher resolution than a display panel using hydrogenated amorphous silicon for the semiconductor film 508, for example, can be provided. A display panel having less display unevenness than a display panel using polysilicon for the semiconductor film 508, for example, can be provided. Smart glasses or a head-mounted display can be provided, for example.

<<Structure Example 2 of Semiconductor Film 508>>

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium, an oxide semiconductor containing indium, gallium, and zinc, or an oxide semiconductor containing indium, zinc, and tin can be used for the semiconductor film.

A transistor having a lower leakage current in an off state than a transistor using amorphous silicon for a semiconductor film can be used, for example. Specifically, a transistor using an oxide semiconductor for a semiconductor film can be used as a switch or the like. In that case, a potential of a floating node can be held for a longer time than in a circuit in which a transistor using amorphous silicon is used as a switch.

<<Structure Example 1 of Light-Emitting Device 550G(*i,j*)>>

The light-emitting device 550G(*i,j*) is electrically connected to the pixel circuit 530G(*i,j*) (see FIG. 2). The light-emitting device 550G(*i,j*) includes an electrode 551G (*i,j*) electrically connected to the pixel circuit 530G(*i,j*), and an electrode 552 electrically connected to the conductive film VCOM2. Note that the light-emitting device 550G(*i,j*) has a function of operating on the basis of the potential of the node N21.

For example, an organic electroluminescence element, an inorganic electroluminescence element, a light-emitting diode, a QDLED (Quantum Dot LED), or the like can be used as the light-emitting device 550G(*i,j*).

<Structure Example 6 of Display Panel 700>

The display panel 700 described in this embodiment includes the light-emitting device 550B(*i,j*), the light-emitting device 550G(*i,j*), the partition 528, a protective layer 554B(*j*), and a protective layer 554G(*j*) (see FIG. 4A). The display panel 700 also includes a light-emitting device 550R(*i,j*) and a protective layer 554R(*j*).

<<Structure Example 1 of Light-Emitting Device 550B(*i,j*)>>

The light-emitting device 550B(*i,j*) includes an electrode 551B(*i,j*), an electrode 552B(*j*), a unit 103B(*j*), and a layer 104B(*j*) (see FIG. 4A). In addition, a layer 105B(*j*) is included. Note that the layer 105B(*j*) can be used for an electron-injection layer, for example.

The electrode 552B(*j*) overlaps with the electrode 551B (*i,j*), and the unit 103B(*j*) includes a region interposed between the electrode 552B(*j*) and the electrode 551B(*i,j*). The unit 103B(*j*) includes a light-emitting layer and has a function of emitting light.

For example, a layer selected from a hole-transport layer, an electron-transport layer, a carrier-blocking layer, and the like can be used in the unit 103B(*j*).

The layer 104B(*j*) includes a region interposed between the unit 103B(*j*) and the electrode 551B(*i,j*), and includes a material having a hole-transport property and a substance having an electron-accepting property. The layer 104B(*j*) has an electrical resistivity higher than or equal to $1\times10^{2}$ Ωcm and lower than or equal to $1\times10^{8}$ Ωcm. Note that the layer 104B(*j*) can be used for a hole-injection layer, for example.

<<Structure Example 1 of Protective Layer 554B(*j*)>>

The protective layer 554B($j$) is in contact with the electrode 552B($j$), and the electrode 552B($j$) is interposed between the protective layer 554B($j$) and the electrode 551B($i,j$). Note that the protective layer 554B($j$) has a function of protecting the light-emitting device 550B($i,j$) from a physical load or a chemical load applied to the light-emitting device 550B($i,j$) in the manufacturing process of the display panel, for example.

<<Structure Example 2 of Light-Emitting Device 550G($i,j$)>>

The light-emitting device 550G($i,j$) includes the electrode 551G($i,j$), an electrode 552G($j$), a unit 103G($j$), and a layer 104G($j$). In addition, a layer 105G($j$) is included. Note that the layer 105G($j$) can be used for an electron-injection layer, for example.

The electrode 552G($j$) overlaps with the electrode 551G($i,j$), and the unit 103G($j$) includes a region interposed between the electrode 552G($j$) and the electrode 551G($i,j$). The unit 103G($j$) includes a light-emitting layer and has a function of emitting light.

For example, a layer selected from a hole-transport layer, an electron-transport layer, a carrier-blocking layer, and the like can be used in the unit 103G($j$).

The layer 104G($j$) includes a region interposed between the unit 103G($j$) and the electrode 551B($i,j$), and the layer 104G($j$) includes the same material having a hole-transport property and the same substance having an electron-accepting property as the layer 104B($j$). Note that the layer 104G can be used for a hole-injection layer, for example.

The layer 104G($j$) includes a gap 104S($j$) between the layer 104G($j$) and the layer 104B($j$). Note that the layer 104B($j$) and the layer 104G($j$) have conductivity, and the gap 104S($j$) has a function of inhibiting electrical continuity between the layer 104B($j$) and the layer 104G($j$).

The layer 104G($j$) can have a region continuous with the layer 104B($j$). In other words, the layer 104G($j$) is electrically isolated from the layer 104B($j$) by the gap 104S($j$).

In the case where the layer 104G($j$) includes a region continuous with the layer 104B($j$), the layer 104B($j$) is a region of a layer where the gap 104S($j$) is provided which overlaps with the electrode 551B($i,j$), and the layer 104G($j$) is a region of the layer which overlaps with the electrode 551G($i,j$). The gap 104S($j$) is provided between the layer 104G($j$) and the layer 104B($j$). In a top view, a straight line drawn from the electrode 551G($i,j$) to the electrode 551B($i,j$) crosses the gap 104S($j$) with a probability higher than or equal to a probability that the straight line crosses the continuous region.

<<Structure Example 1 of Layer 104B($j$) and Layer 104G($j$)>>

The material having a hole-transport property and the substance having an electron-accepting property can be used for the layer 104B($j$) and the layer 104G($j$).

[Material Having Hole-Transport Property]

For example, an aromatic amine compound or an organic compound having a n-electron rich heteroaromatic ring can be used as the material having a hole-transport property.

Thus, holes can be supplied from the positive electrode side to the cathode side. Note that the layer 104G($j$) in the light-emitting device 550G($i,j$) is separated from the layer 104B($j$) in the light-emitting device 550B($i,j$), which can inhibit occurrence of a crosstalk phenomenon. As a result, a novel display panel that is highly convenient, useful, or reliable can be provided.

As the material having a hole-transport property in the composite material, a compound having an aromatic amine skeleton, a carbazole derivative, an aromatic hydrocarbon, an aromatic hydrocarbon having a vinyl group, a high molecular compound (such as an oligomer, a dendrimer, or a polymer), or the like can be used. A material having a hole mobility of $1\times10^{-6}$ cm$^2$/Vs or higher can be suitably used as the material having a hole-transport property.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), or the like can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, or the like can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, or the like can be used.

As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), or the like can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), poly[N,N'-bis(4-butylphenyl)-N,N-bis(phenyl)benzidine] (abbreviation: Poly-TPD), or the like can be used.

Furthermore, a substance having any of a carbazole skeleton, a dibenzofuran skeleton, a dibenzothiophene skeleton, and an anthracene skeleton can be suitably used as the material having a hole-transport property in the composite material, for example. Moreover, as the material having a hole-transport property in the composite material, it is possible to use a substance including any of an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl)amino group, the reliability of the light-emitting device can be increased.

Examples of the above-described substances include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

[Substance Having Electron-Accepting Property]

For example, an organic compound containing fluorine or a cyano group or a transition metal oxide can be used as the substance having an electron-accepting property. The substance having an electron-accepting property can extract electrons from an adjacent hole-transport layer or an adjacent material having a hole-transport property by the application of an electric field. Note that an organic compound having an electron-accepting property is easily evaporated and deposited. As a result, the productivity of the light-emitting device can be increased.

Specifically, it is possible to use, for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), 2-(7-dicyanomethylen-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

Alternatively, a [3]radialene derivative having an electron-withdrawing group (in particular, a halogen group or a cyano group such as a fluoro group) is preferable because it has a very high electron-accepting property.

Specifically, it is possible to use, for example, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], or α,α',α"-1,2,3-cyclopropanetriylidenetris[2,3,4,5,6-pentafluorobenzeneacetonitrile].

As the substance having an electron-accepting property, molybdenum oxide, vanadium oxide, ruthenium oxide, tungsten oxide, manganese oxide, or the like can be used.

Alternatively, it is possible to use phthalocyanine (abbreviation: $H_2Pc$), a phthalocyanine-based complex compound such as and copper phthalocyanine (CuPc), and compounds having an aromatic amine skeleton such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD).

Alternatively, a high molecular compound such as poly(3,4-ethylenedioxythiophene)/poly(styrenesulfonic acid) (PEDOT/PSS), or the like can be used.

<<Structure Example of Layer 105B(*j*)>>

The layer 105B(*j*) includes a region interposed between the electrode 552B(*j*) and the electrode 551B(*i,j*). For example, the layer 105B(*j*) is interposed between the electrode 552B(*j*) and the unit 103B(*j*), and is in contact with the electrode 552B(*j*). Note that the layer 105B(*j*) can be used as an electron-injection layer, for example.

The layer 105B(*j*) includes the first organic compound and the first metal. Note that the first organic compound forms a singly occupied molecular orbital (SOMO: Single Occupied Molecular Orbital) with the first metal. For example, the singly occupied molecular orbital (SOMO) energy level is within the range from −1.5 eV to less than 0 eV from the HOMO energy level of the first organic compound.

For example, a composite material of the first organic compound including an unshared electron pair and the first metal can be used for the layer 105B(*j*). The sum of the number of electrons of the first organic compound and the number of electrons of the first metal is preferably an odd number. The molar ratio of the first metal to 1 mol of the first organic compound is preferably greater than or equal to 0.1 and less than or equal to 10, more preferably greater than or equal to 0.2 and less than or equal to 2, further more preferably greater than or equal to 0.2 and less than or equal to 0.8.

Accordingly, the first organic compound including an unshared electron pair interacts with the first metal and thus can form a singly occupied molecular orbital (SOMO). Furthermore, in the case where electrons are injected from the electrode 102 into the layer 105, a barrier therebetween can be reduced. The first metal has a low reactivity with water or oxygen; thus, the moisture resistance of the light-emitting device 150 can be improved.

For the layer 105, a composite material that allows the spin density of the layer 105B(*j*) measured by an electron spin resonance method (ESR) to be preferably higher than or equal to $1\times10^{16}$ spins/$cm^3$, further preferably higher than or equal to $5\times10^{16}$ spins/$cm^3$, further more preferably higher than or equal to $1\times10^{17}$ spins/$cm^3$ can be used.

The concentration of an alkali metal included in the layer 105B(*j*) is preferably lower than the concentration of the first metal included in the layer 105B(*j*). Examples of the alkali metal are lithium, sodium, potassium, rubidium, and cesium. The concentrations of the alkali metal and the first metal included in the layer 105B(*j*) can be measured by a secondary ion mass spectrometry method or the like.

[First Organic Compound]

For example, a material having an electron-transport property can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device 150 can be reduced.

Note that the lowest unoccupied molecular orbital (LUMO) of the organic compound including an unshared electron pair is preferably greater than or equal to −3.6 eV and less than or equal to −2.3 eV. In general, the HOMO level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound including an unshared electron pair.

[Chemical formula 1]

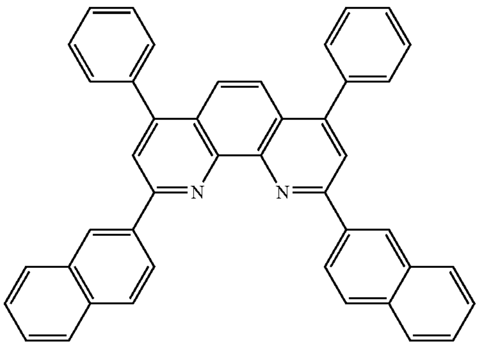

NBPhen

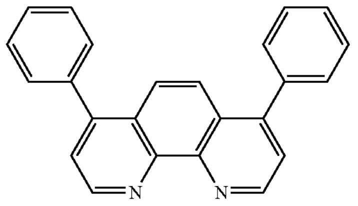

BPhen

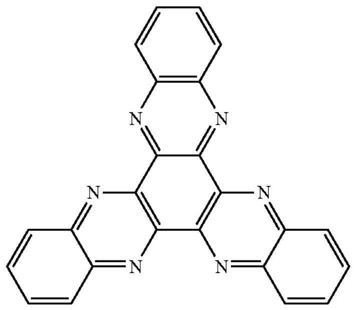

HATNA

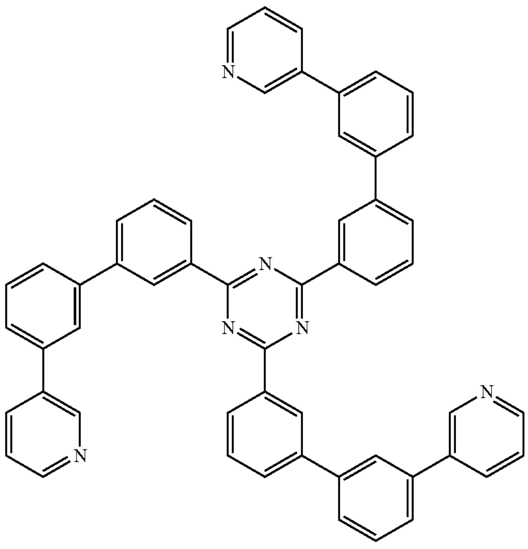

TmPPPyTz

For example, copper phthalocyanine can be used for the organic compound including an unshared electron pair. Note that the number of electrons of the copper phthalocyanine is an odd number.

[First Metal]

When the number of electrons of the first organic compound including an unshared electron pair is an even number, for example, a composite material of the first organic compound and the metal that belongs to an odd-numbered group in the periodic table can be used for the layer 105.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point.

The use of Ag for the electrode 102 and the layer 105 can increase the adhesion between the layer 105 and the electrode 102.

When the number of electrons of the organic compound including an unshared electron pair is an odd number, a composite material of the first organic compound and the first metal that belongs to an even-numbered group in the periodic table can be used for the layer 105. For example, iron (Fe), which is a metal belonging to Group 8, is an element belonging to an even-numbered group in the periodic table.

<<Structure Example of Layer 105G(*j*)>>

The layer 105G(*j*) includes a region interposed between the electrode 552G(*j*) and the electrode 551G(*i,j*). For example, the layer 105G(*j*) is interposed between the electrode 552G(*j*) and the unit 103G(*j*), and the layer 105G(*j*) is in contact with the electrode 552G(*j*). Note that the layer 105G(*j*) can be used for an electron-injection layer, for example.

The layer 105G(*j*) includes the first organic compound and the first metal, and a gap 105S(*j*) is provided between the layer 105G(*j*) and the layer 105B(*j*).

Thus, for example, driving voltage of the display panel can be reduced without using an alkali metal for the light-emitting device. Adjacent light-emitting devices can be separated by an etching method. Even when an etching method is used, manufacturing facilities are not contaminated by an alkali metal. As a result, a novel display panel that is highly convenient, useful, or reliable can be provided.

<<Structure Example 1 of Protective Layer 554G(*j*)>>

The protective layer 554G(*j*) includes a gap 554S(*j*) between the protective layer 554G(*j*) and the protective layer 554B(*j*), and the gap 554S(*j*) overlaps with the gap 104S(*j*).

The protective layer 554G(*j*) is in contact with the electrode 552G(*j*), and the electrode 552G(*j*) is interposed between the protective layer 554G(*j*) and the electrode 551B(*i,j*). Note that the protective layer 554G(*j*) has a function of protecting the light-emitting device 550G(*i,j*) from a physical load or a chemical load applied to the light-emitting device 550G(*i,j*) in the manufacturing process of the display panel, for example.

<<Structure Example 1 of Protective Layer 554B(*j*) and Protective Layer 554G(*j*)>>

An inorganic material can be used for the protective layer 554B(*j*) and the protective layer 554G(*j*). Specifically, an inorganic oxide film, an inorganic nitride film, an inorganic oxynitride film, or the like, or a layered material obtained by stacking some of these films are stacked can be used for the protective layer 554B(*j*) and the protective layer 554G(*j*).

For example, an aluminum oxide film, a film containing silicon oxide, or a film containing silicon nitride can be used for the protective layer 554B(*j*) and the protective layer 554G(*j*).

In addition, a film formed using an atomic layer deposition (ALD) method or the like is preferably used. When an ALD method is used, a dense film can be formed under mild conditions.

In particular, a film containing aluminum oxide formed by an ALD method can be suitably used for the protective layer 554B(*j*) and the protective layer 554G(*j*). Thus, diffusion of impurities such as water can be inhibited.

<<Structure Example 1 of Partition 528>>

The partition 528 includes an opening portion 528B(*i,j*) and an opening portion 528G(*i,j*) (see FIG. 4C). The opening portion 528B(*i,j*) overlaps with the electrode 551B(*i,j*), and the opening portion 528G(*i,j*) overlaps with the electrode 551G(*i,j*).

The partition 528 overlaps with the gap 104S(*j*) and the gap 554S(*j*) between the opening portion 528B(*i,j*) and the opening portion 528G(*i,j*) (see FIG. 4A).

An inorganic material, an organic material, a composite material of an inorganic material and an organic material, or the like can be used for the partition 528. Specifically, an inorganic oxide film, an inorganic nitride film, an inorganic oxynitride film, or the like, or a stacked-layer material in which a plurality of films selected from these films are stacked can be used as the partition 528. For example, a silicon oxide film, a film containing an acrylic resin, a film containing polyimide, or the like can be used as the partition 528.

Thus, the protective layer 554B(*j*) can protect the light-emitting device 550B(*i,j*) from, for example, damage caused by a physical load or a chemical load applied in the manufacturing process. The protective layer 554G(*j*) can protect the light-emitting device 550G(*i,j*). In addition, a layer over the partition 528 which overlaps with the gap 554S(*j*) can be removed using the protective layer 554B(*j*) and the protective layer 554G(*j*) as hard masks. Moreover, the gap 104S(*j*) can be formed using the gap 554S(*j*).

Electrical continuity between the layer 104B(*j*) and the layer 104G(*j*) can be inhibited. A phenomenon in which current flows between the electrode 551B(*i,j*) and the electrode 552G(*j*) through the layer 104B(*j*) and the layer 104G(*j*) can be inhibited. A phenomenon in which current flows between the electrode 551G(*i,j*) and the electrode 552B(*j*) through the layer 104B(*j*) and the layer 104G(*j*) can be inhibited. In addition, occurrence of a crosstalk phenomenon between the light-emitting device 550B(*i,j*) and the light-emitting device 550G(*i,j*) can be inhibited. As a result, a novel display panel that is highly convenient, useful, or reliable can be provided.

For example, on a high-resolution display panel exceeding 1000 ppi, a crosstalk phenomenon occurs when there is electrical continuity between the layer 104B(*j*) and the layer 104G(*j*), which narrows the color gamut displayable on the display panel. Providing a gap 104S in a display panel with a high resolution exceeding 1000 ppi, preferably in a display panel with a high resolution exceeding 2000 ppi, or further preferably in a display panel with an ultrahigh resolution exceeding 5000 ppi enables the display panel to exhibit bright colors.

<<Structure Example of Light-Emitting Device 550R(*i,j*)>>

The light-emitting device 550R(*i,j*) includes an electrode 551R(*i,j*), an electrode 552R(*j*), a unit 103R(*j*), and a layer 104R(*j*). The unit 103R(*j*) has a function of emitting light. In addition, a layer 105R(*j*) is included. Note that the layer 105R(*j*) can be used for an electron-injection layer, for example.

<Structure Example 7 of Display Panel 700>

In addition, the display panel 700 described in this embodiment includes an insulating film 573A and an insulating film 573B (see FIG. 4A).

<<Structure Example of Insulating Film 573A>>

The insulating film 573A is in contact with the protective layer 554B(*j*), and the protective layer 554B(*j*) includes a region interposed between the insulating film 573A and the electrode 552B(*j*).

The insulating film 573A is in contact with the protective layer 554G(*j*), and the protective layer 554G(*j*) includes a region interposed between the insulating film 573A and the electrode 552G(*j*).

The layer 104B(*j*) includes a sidewall WL1, and the layer 104G(*j*) includes a sidewall WL2. A sidewall WL2(*j*) faces the sidewall WL1, and the gap 104S(*j*) is interposed between the sidewall WL2(*j*) and the sidewall WL1.

The sidewall WL1 and the sidewall WL2 are in contact with the insulating film 573A.

The insulating film 573A is in contact with the partition 528.

<<Structure Example of Insulating Film 573B>>

The insulating film 573B fills the gap 104S(*j*).

For example, an inorganic material, an organic material, a composite material of an inorganic material and an organic material, or the like can be used for the insulating film 573B.

Specifically, an inorganic oxide film, an inorganic nitride film, an inorganic oxynitride film, or the like, or a stacked-layer material in which a plurality of films selected from these films are stacked can be used as the insulating film 573B.

For example, a film including a silicon oxide film, a silicon nitride film, a silicon oxynitride film, an aluminum oxide film, an IGZO film, or the like, or a film including a stacked-layer material in which a plurality of films selected from these films are stacked can be used as the insulating film 573B. Note that the silicon nitride film is a dense film and has an excellent function of inhibiting diffusion of impurities such as water.

For example, a stacked film in which silicon nitride deposited by a sputtering method and silicon nitride deposited by a plasma enhanced atomic layer deposition (PEALD) method are stacked can be used for the insulating film 573B. Thus, in the case where a pin hole, disconnection, or the like is formed in the film deposited by a sputtering method, a portion overlapping with the pin hole, the disconnection, or the like can be filled in by using the film deposited by an ALD method with favorable coverage.

For example, for the insulating film 573B, polyester, polyolefin, polyamide, polyimide, polycarbonate, polysiloxane, an acrylic resin, or the like, or a stacked-layer material, a composite material, or the like of a plurality of resins selected from these resins can be used.

For example, an organic material such as a reactive curable adhesive, a photocurable adhesive, a thermosetting adhesive, or/and an anaerobic adhesive can be used for the insulating film 573B.

Thus, a phenomenon in which impurities diffuse into the light-emitting device 550B(*i,j*) and the light-emitting device 550G(*i,j*) can be inhibited. The reliability of the light-emitting device 550B(*i,j*) and the light-emitting device 550G(*i,j*) can be increased. As a result, a novel display panel that is highly convenient, useful, or reliable can be provided.

<Structure Example 8 of Display Panel 700>

The display panel of one embodiment of the present invention includes a coloring layer CFB(*j*), a coloring layer CFG(*j*), and a coloring layer CFR(*j*).

<<Structure Example 1 of Unit 103B(*j*)>>

For example, a layer 111(B) emitting blue light EL(1), a layer 111(G) emitting green light EL(2), and a layer 111(R) emitting red light EL(3) can be used for one unit 103B(*j*) (see FIG. 5). Thus, white light can be emitted.

Specifically, a stacked structure of a layer 111B including a blue light-emitting material, a layer 111G including a green light-emitting material, and a layer 111R including a red light-emitting material can be used for the unit 103B(*j*).

A layer including a hole-transport material, a layer including an electron-transport material, and a layer including a bipolar material can be used for the unit 103B(*j*). For example, the hole-transport material can be used for a layer 112(1). The electron-transport material can be used for a layer 113. The bipolar material can be used for a layer 112(2).

Note that the structure used for the unit 103B(*j*) can be used for the unit 103G(*j*) and the unit 103R(*j*).

<<Structure Example 1 of Coloring Layer>>

The coloring layer CFB(*j*) overlaps with the light-emitting device 550B(*i,j*), the coloring layer CFG(*j*) overlaps with the light-emitting device 550G(*i,j*), and the coloring layer CFG(*j*) transmits light of a color different from a color of light that the coloring layer CFB(*j*) transmits. The coloring layer CFR(*j*) overlaps with the light-emitting device 550R(*i,j*), and the coloring layer CFR(*j*) transmits light of a color different from colors of light that the coloring layer CFB(*j*) and the coloring layer CFG(*j*) transmit.

For example, a material that preferentially transmits blue light can be used for the coloring layer CFB(*j*). Thus, blue light can be extracted from white light.

For example, a material that preferentially transmits green light can be used for the coloring layer CFG(*j*). Thus, green light can be extracted from white light.

For example, a material that preferentially transmits red light can be used for the coloring layer CFR(*j*). Thus, red light can be extracted from white light.

<<Structure Example 2 of Unit 103B(*j*)>>

For example, a blue light-emitting material can be used for the unit 103B(*j*), the unit 103G(*j*), and the unit 103R(*j*). Thus, the light-emitting device 550B(*i,j*), the light-emitting device 550G(*i,j*), and the light-emitting device 550R(*i,j*) can emit blue light.

Instead of the coloring layer, a color conversion layer can be used. For example, nanoparticles, quantum dots, or the like can be used for the color conversion layer.

For example, instead of the coloring layer CFG(*j*), a color conversion layer which converts blue light to green light can be used. Accordingly, blue light emitted from the light-emitting device 550G(*i,j*) can be converted to green light. Instead of the coloring layer CFR(*j*), a color conversion layer which converts blue light to red light can be used. Thus, blue light emitted from the light-emitting device 550R(*i,j*) can be converted to red light.

Thus, in the step of forming the light-emitting device 550B(*i,j*), the light-emitting device 550G(*i,j*) can also be formed. Furthermore, the hue can be changed with the use of the light-emitting device 550B(*i,j*) and the light-emitting device 550G(*i,j*). As a result, a novel display panel that is highly convenient, useful, or reliable can be provided.

<Structure Example 9 of Display Panel 700>

A structure of the display panel of one embodiment of the present invention is described with reference to FIG. 6.

Note that the display panel is different from the display panel described with reference to FIG. 4 in that the light-emitting device 550B(*i,j*) includes a unit 103B2(*j*), an intermediate layer 106B(*j*), and a layer 105B2(*j*) and that the light-emitting device 550G(*i,j*) includes a unit 103G2(*j*), an intermediate layer 106G(*j*), and a layer 105G2(*j*). Different portions will be described in detail here, and the above description is referred to for portions that can use similar structures.

<<Structure Example 2 of Light-Emitting Device 550B(*i,j*)>>

The light-emitting device 550B(*i,j*) includes the unit 103B2(*j*), the intermediate layer 106B(*j*), and the layer 105B2(*j*) (see FIG. 6A).

The unit 103B2(*j*) includes a region interposed between the electrode 552B(*j*) and the unit 103B(*j*).

For example, a structure that exhibits a different emission color from the emission color of the unit 103B(*j*) can be used for the unit 103B2(*j*). Specifically, the unit 103B(*j*) that emits red light and green light and the unit 103B2(*j*) that emits blue light can be used. Accordingly, a light-emitting device that emits light of a desired color can be provided. For example, a light-emitting device that emits white light can be provided.

For example, an emission color of the unit 103B(*j*) can be the same as that of the unit 103B2(*j*). Specifically, the unit 103B(*j*) that emits blue light and the unit 103B2(*j*) that emits blue light can be used. Thus, light emission at high luminance can be obtained while the power consumption is inhibited.

<<Structure Example 1 of Intermediate Layer 106B(*j*)>>

The intermediate layer 106B(*j*) includes a region interposed between the unit 103B2(*j*) and the unit 103B(*j*). Note that the intermediate layer 106B(*j*) can be used for a charge-generation layer, for example. The intermediate layer 106B(*j*) has a function of supplying electrons to the anode side and supplying holes to the cathode side by applying voltages.

The intermediate layer 106B(*j*) includes a composite material. The composite material includes a material having a hole-transport property and a substance having an electron-accepting property, and has an electrical resistivity higher than or equal to $1\times10^2$ Ωcm and lower than or equal to $1\times10^8$ Ωcm. Note that a composite material that can be used for the layer 104B(*j*) can be used for the intermediate layer 106B(*j*).

<<Structure Example of Layer 105B2(*j*)>>

The layer 105B2(*j*) includes a region interposed between the intermediate layer 106B(*j*) and the unit 103B(*j*). Note that the layer 105B2(*j*) can be used for an electron-injection layer, for example.

The layer 105B2(*j*) includes a second organic compound and a second metal. For example, the first organic compound that can be used for the layer 105B(*j*) can be used as the second organic compound. In addition, the first metal that can be used for the layer 105B(*j*) can be used as the second metal. Note that the second organic compound forms a singly occupied molecular orbital (SOMO) with the second metal.

<<Structure Example 3 of Light-Emitting Device 550G(*i,j*)>>

The light-emitting device 550G(*i,j*) includes the unit 103G2(*j*), the intermediate layer 106G(*j*), and the layer 105G2(*j*).

<<Structure Example of Unit 103G2(*j*)>>

The unit 103G2(*j*) includes a region interposed between the layer 105G(*j*) and the unit 103G(*j*).

<<Structure Example of Intermediate Layer 106G(*j*)>>

The intermediate layer 106G(*j*) includes a region interposed between the unit 103G2(*j*) and the unit 103G(*j*).

The intermediate layer 106G(*j*) includes the same material having a hole-transport property and the same substance having an electron-accepting property as the intermediate layer 106B(*j*). The intermediate layer 106G(*j*) includes a gap 106S(*j*) between the intermediate layer 106G(*j*) and the intermediate layer 106B(*j*) (see FIG. 6A and FIG. 7). Note that the intermediate layer 106B(*j*) and the intermediate layer 106G(*j*) have conductivity, and the gap 106S(*j*) has a function of inhibiting electrical continuity between the intermediate layer 106B(*j*) and the intermediate layer 106G(*j*).

<<Structure Example 2 of Partition 528>>

The partition 528 overlaps with the gap 104S(*j*), the gap 554S(*j*), and the gap 106S(*j*) between the opening portion 528B(*i,j*) and the opening portion 528G(*i,j*) (see FIG. 6A and FIG. 6C).

Thus, a phenomenon in which current flows between the electrode 551B(*i,j*) and the electrode 552G(*j*) through the layer 104B(*j*) and the layer 104G(*j*) or through the intermediate layer 106B(*j*) and the intermediate layer 106G(*j*) can be inhibited. A phenomenon in which current flows between the electrode 551G(*i,j*) and the electrode 552B(*j*) through the layer 104B(*j*) and the layer 104G(*j*) can be inhibited. In addition, occurrence of a crosstalk phenomenon between the light-emitting device 550B(*i,j*) and the light-emitting device 550G(*i,j*) can be inhibited. As a result, a novel display panel that is highly convenient, useful, or reliable can be provided.

<<Structure Example of Layer 104B(*j*) and Layer 104G(*j*)>>

The layer 104B(*j*) includes a sidewall WL1, and the layer 104G(*j*) includes a sidewall WL2 (see FIG. 7).

The sidewall WL2 faces the sidewall WL1, and the gap 104S(*j*) is interposed between the sidewall WL2 and the sidewall WL1.

<<Structure Example of Layer 105G2(*j*)>>

The layer 105G2(*j*) includes a region interposed between the intermediate layer 106G(*j*) and the unit 103G(*j*) (see FIG. 6A). Note that the layer 105G2(*j*) can be used for an electron-injection layer, for example.

The layer 105G2(*j*) includes the second organic compound and the second metal.

A gap is provided between the layer 105G2(*j*) and the layer 105B2(*j*) (see FIG. 6A and FIG. 7).

Thus, even when etching is performed, manufacturing facilities are not contaminated by an alkali metal. Adjacent light-emitting devices can be separated by an etching method. A phenomenon in which current flows between the electrode 551B(*i,j*) and the electrode 552G(*j*) through the intermediate layer 106B(*j*) and the intermediate layer 106G(*j*) can be inhibited. A phenomenon in which current flows between the electrode 551G(*i,j*) and the electrode 552B(*j*) through the intermediate layer 106B(*j*) and the intermediate layer 106G(*j*) can be inhibited. In addition, occurrence of a crosstalk phenomenon between the light-emitting device 550B(*i,j*) and the light-emitting device 550G(*i,j*) can be inhibited. As a result, a novel display panel that is highly convenient, useful, or reliable can be provided.

<Structure Example 10 of Display Panel 700>

A structure of the display panel of one embodiment of the present invention is described with reference to FIG. 8A and FIG. 8B. Note that the display panel is different from the display panel described with reference to FIG. 6 and FIG. 7 in not including the partition 528.

A gap 551S(*j*) is provided between the electrode 551G(*i,j*) and the electrode 551B(*i,j*) (see FIG. 8B). The gap 551S(*j*) overlaps with the gap 104S(*j*), the gap 106S(*j*), and the gap 554S(*j*).

Note that this embodiment can be combined with any of the other embodiments described in this specification as appropriate.

Embodiment 2

In this embodiment, a manufacturing method of a display panel of one embodiment of the present invention will be described with reference to FIG. 9 to FIG. 14.

FIG. 9 to FIG. 14 are diagrams illustrating the manufacturing method of a display panel of one embodiment of the present invention.

<Example of Manufacturing Method of Display Panel>

The manufacturing method of the display panel of one embodiment of the present invention has a first step to a thirteenth step described below. According to this step, for example, the display panel 700 of one embodiment of the present invention described with reference to FIG. 6 can be manufactured.

<<First Step>>

In the first step, the electrode 551B(*i,j*), the electrode 551G(*i,j*), and the electrode 551R(*i,j*) are formed. For example, the functional layer 520 is formed over the base material 510 and processed into a predetermined shape over the functional layer 520 by a photolithography method (see FIG. 9A).

<<Second Step>>

In a second step, the partition 528 is formed between the electrode 551B(*i,j*) and the electrode 551G(*i,j*). For example, an insulating film covering the electrode 551B(*i,j*) to the electrode 551R(*i,j*) is formed, and opening portions are formed by a photolithography method to partly expose the electrode 551B(*i,j*) to the electrode 551R(*i,j*) (see FIG. 9B).

<<Third Step>>

Figure 10A:
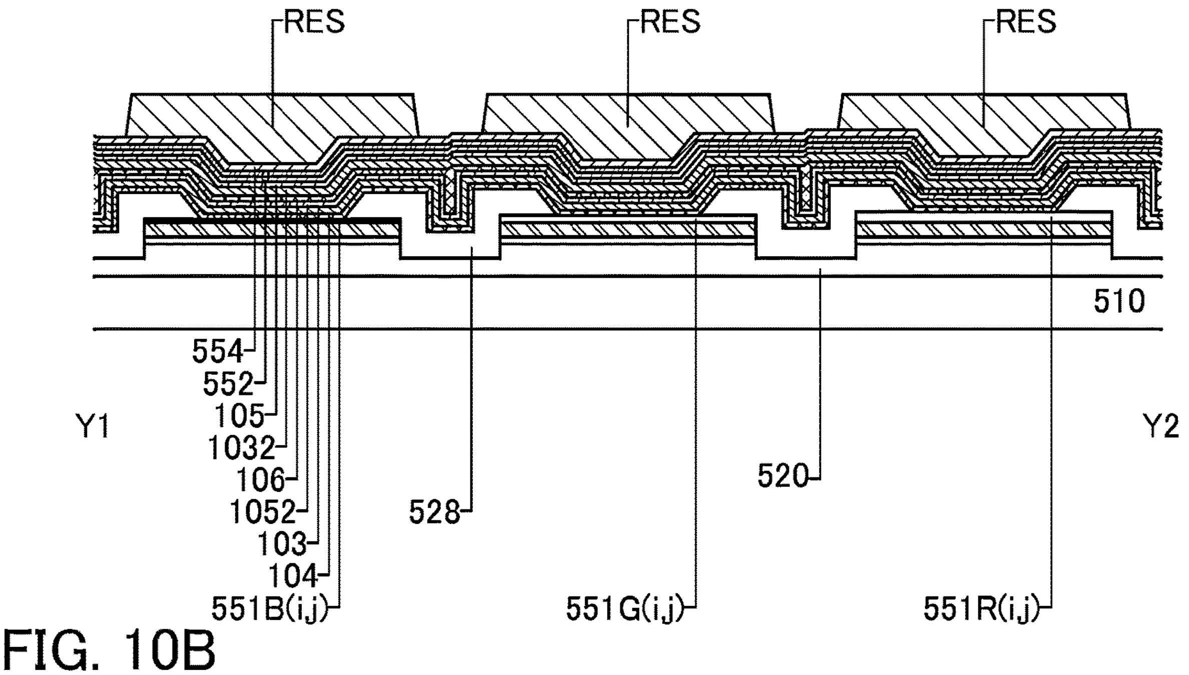
FIG. 10A and FIG. 10B are diagrams illustrating a manufacturing method of a display panel according to an embodiment.

In a third step, a layer 104 including a material having a hole-transport property and a substance having an electron-accepting property is formed over the electrode 551B(*i,j*) and the electrode 551G(*i,j*) (see FIG. 10A). The layer 104 is formed over the electrode 551B(*i,j*), the electrode 551G(*i,j*), and the electrode 551R(*i,j*) to cover these electrodes by a vacuum evaporation method, for example. Specifically, a co-evaporation method is used.

<<Fourth Step>>

In a fourth step, a unit 103 is formed over the layer 104. For example, the unit 103 is formed by a vacuum evaporation method.

<<Fifth Step>>

In a fifth step, a layer 1052 including the second organic compound and the second metal is formed over the unit 103. For example, the layer 1052 is formed by a vacuum evaporation method. Specifically, a co-evaporation method is used.

<<Sixth Step>>

In a sixth step, an intermediate layer 106 including a material having a hole-transport property and a substance having an electron-accepting property is formed over the layer 1052. For example, a vacuum evaporation method is used.

<<Seventh Step>>

In a seventh step, a unit 1032 is formed over the intermediate layer 106. For example, a vacuum evaporation method is used.

<<Eighth Step>>

In an eighth step, a layer 105 including the first organic compound and the first metal is formed over the unit 1032. For example, the layer is formed by a vacuum evaporation method. Specifically, a co-evaporation method is used.

<<Ninth Step>>

In a ninth step, the electrode 552 is formed over the layer 105. For example, the electrode 552 is formed by a vacuum evaporation method.

<<Tenth Step>>

In a tenth step, a protective layer 554 is formed over the electrode 552 by an ALD method.

Figure 10B:
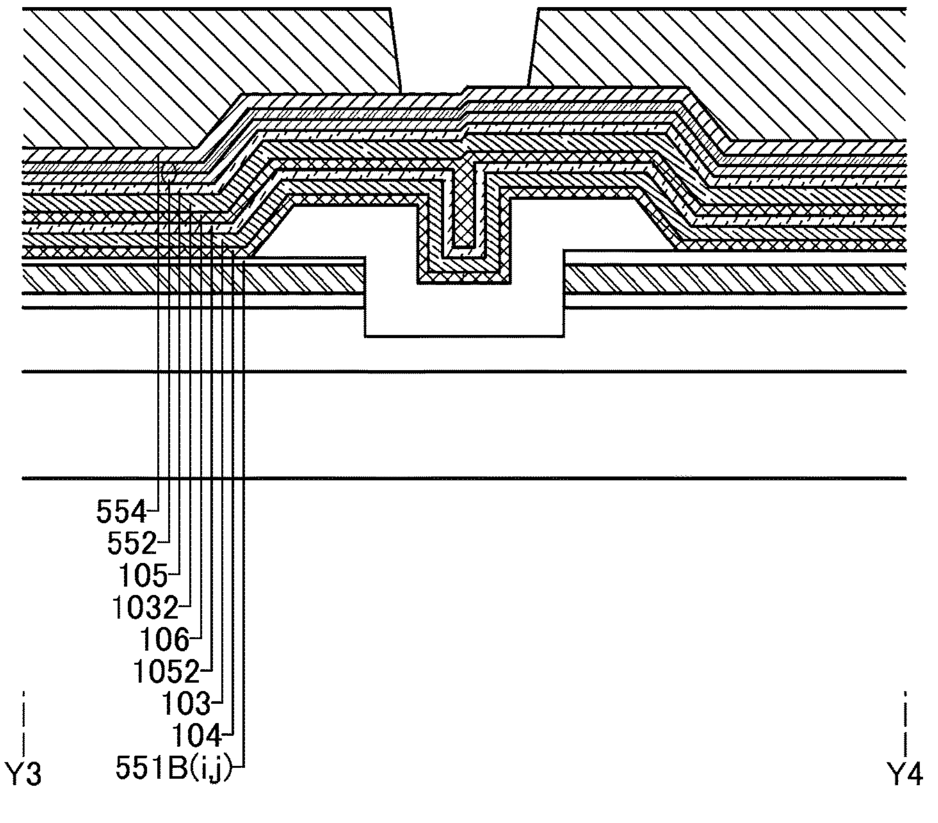

In addition, resists RES are formed over the protective layer 554 (see FIG. 10A and FIG. 10B). For example, the resists RES are formed in positions overlapping with the electrode 551B(*i,j*), the electrode 551G(*i,j*), and the electrode 551R(*i,j*).

<<Eleventh Step>>

Figure 12A:
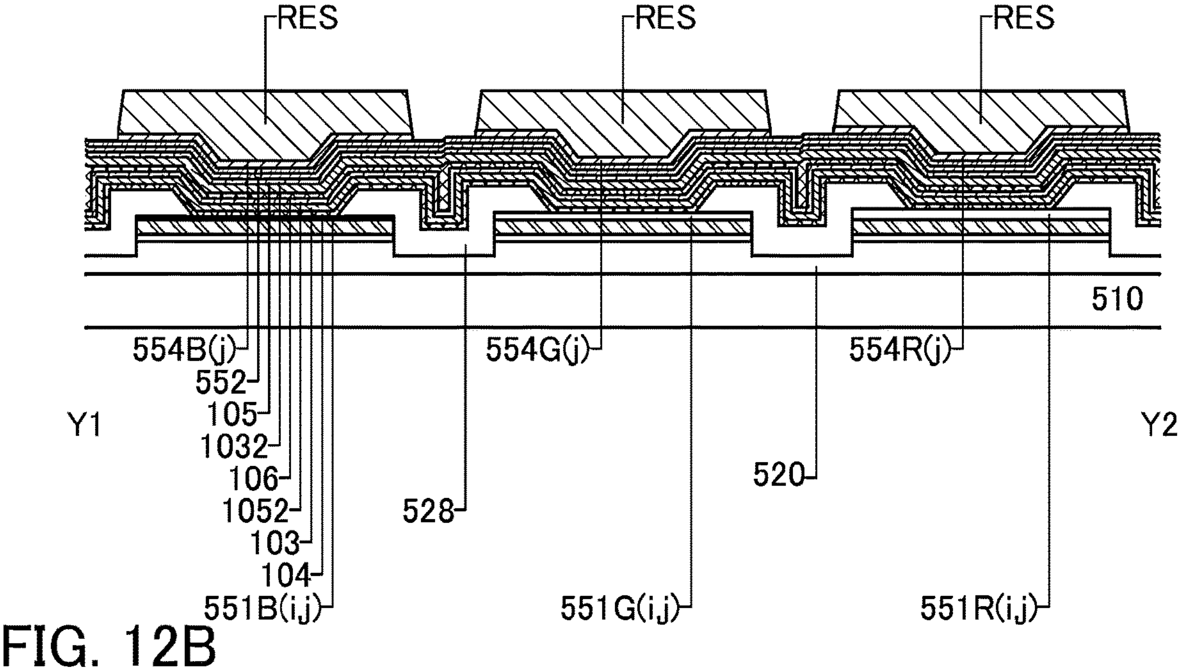
FIG. 12A and FIG. 12B are diagrams illustrating a manufacturing method of a display panel according to an embodiment.
Figure 12B:
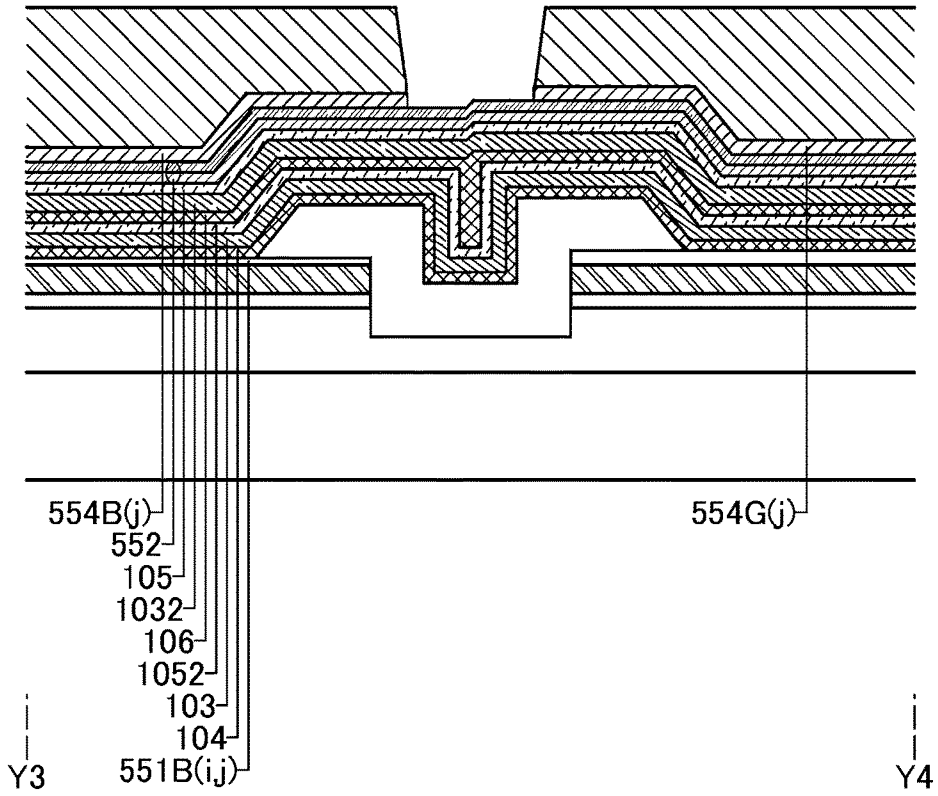

In an eleventh step, the protective layer 554B(*j*) and the protective layer 554G(*j*) are processed into a predetermined shape (see FIG. 12A and FIG. 12B).

For example, a photoetching method or the resist RES and a dry etching method in particular are used to remove a portion overlapping with the partition 528. Moreover, the electrode 552 can be used as an etching stopper.

Figure 11A:
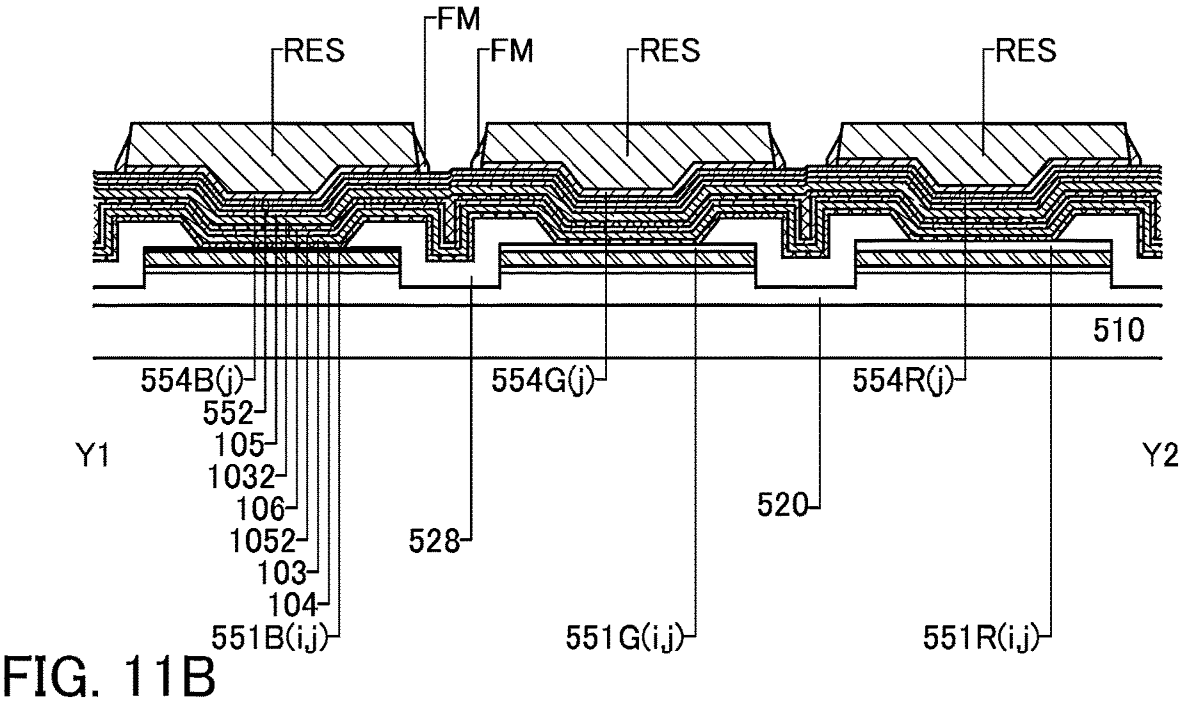
FIG. 11A and FIG. 11B are diagrams illustrating a manufacturing method of a display panel according to an embodiment.
Figure 11B:
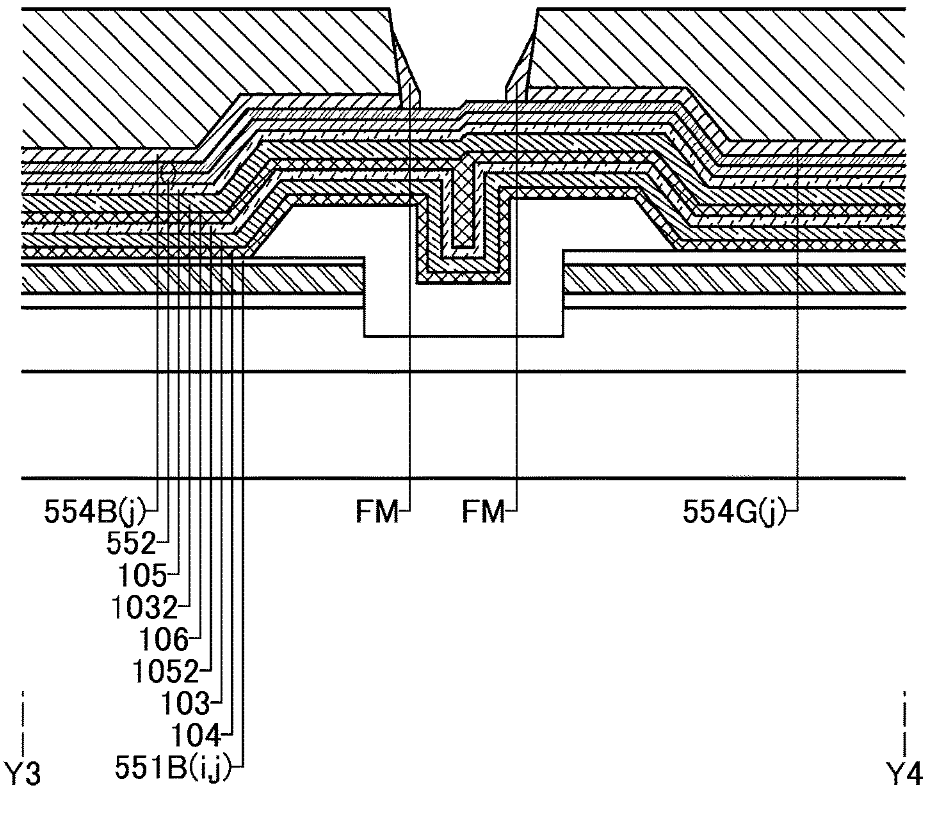

After the dry etching method is employed, a foreign substance FM remains in some cases (see FIG. 11A and FIG. 11B). For example, the foreign substance FM remaining in the vicinity of a side end portion of the resist RES can be removed by a wet etching method.

When the protective layer 554 includes aluminum oxide, the foreign substance FM can be removed using an etchant including oxalic acid, for example.

Figure 13A:
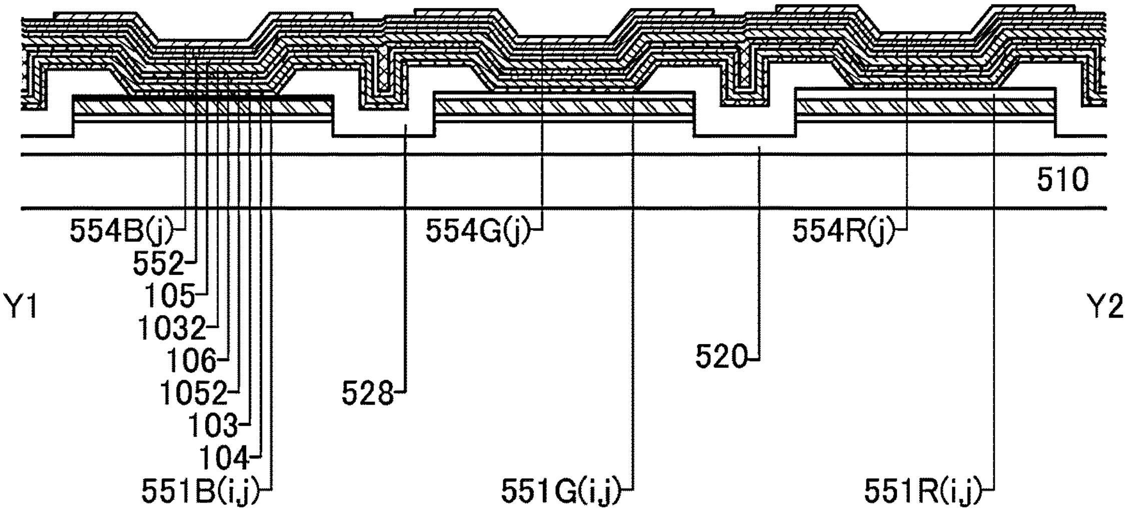
FIG. 13A and FIG. 13B are diagrams illustrating a manufacturing method of a display panel according to an embodiment.
Figure 13B:
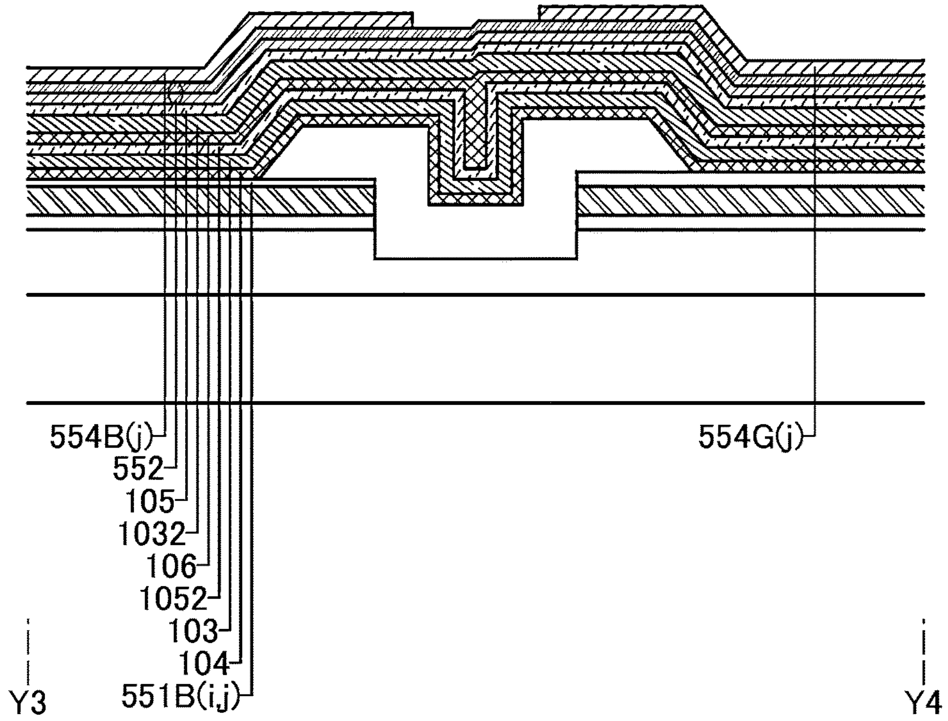

In addition, the resists RES are removed (see FIG. 13A and FIG. 13B). For example, the resists RES are removed by an ashing method using oxygen plasma.

A stacked-layer film of a metal film that is easily oxidized and a film that is resistant to oxidation can be suitably used for the electrode 552. For example, a stacked structure in which a metal oxide film is to be interposed between the metal film and the protective layer 554 can be suitably used for the electrode 552. As the metal oxide film, specifically, a film including a conductive oxide film or an oxide semiconductor film can be used.

For the electrode 552, a stacked-layer film in which a metal film containing silver and magnesium and an indium oxide-tin oxide (ITO) film are stacked can be used, for example. Thus, with the use of the indium oxide-tin oxide (ITO) film, the metal film containing silver and magnesium can be protected from an oxidation reaction in an ashing step using oxygen plasma.

<<Twelfth Step>>

Figure 14A:
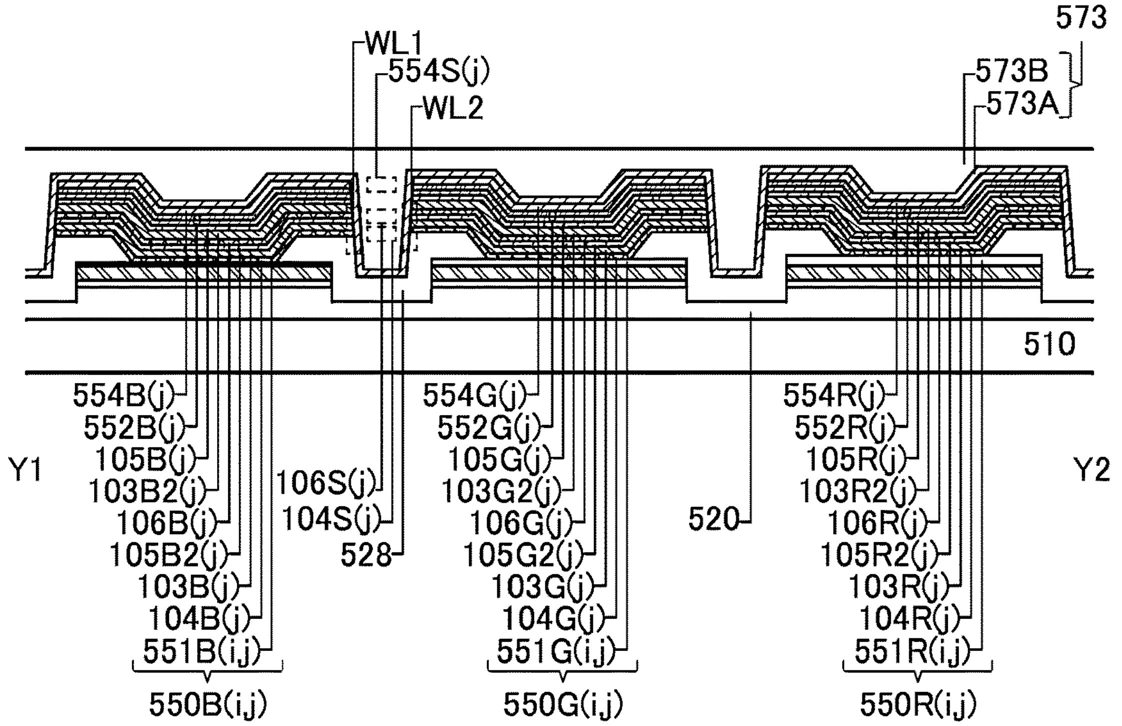
FIG. 14A and FIG. 14B are diagrams illustrating a manufacturing method of a display panel according to an embodiment.
Figure 14B:
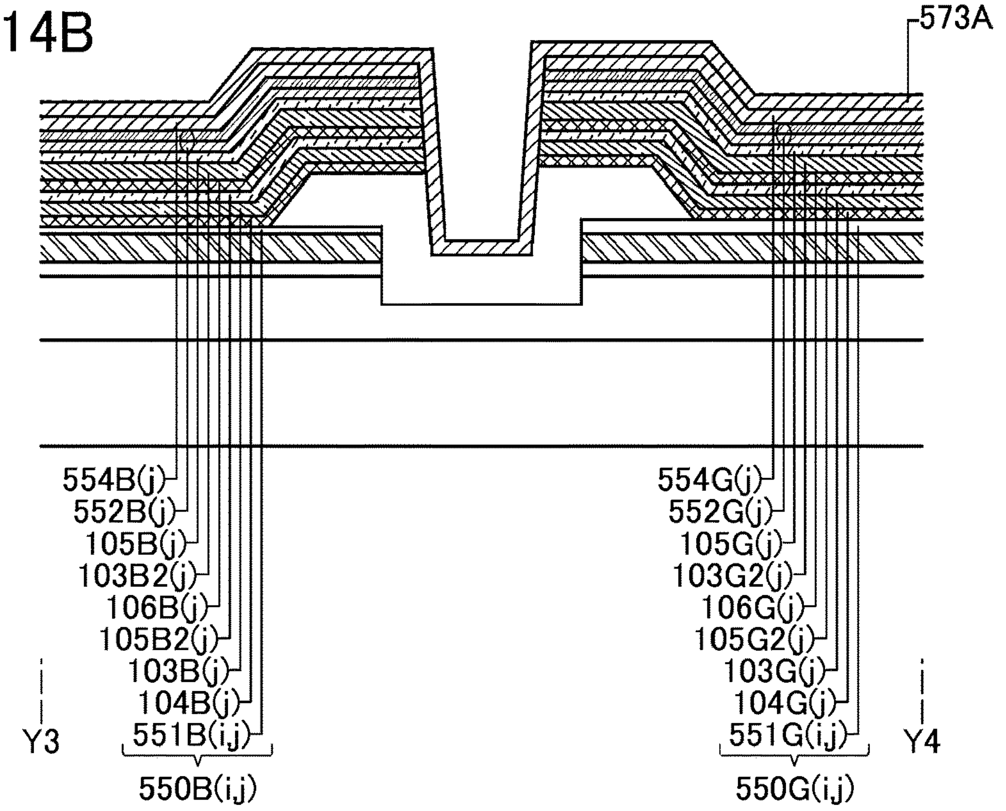

In a twelfth step, the layer 104, the unit 103, the layer 1052, the intermediate layer 106, the unit 1032, the layer 105, and the electrode 552 are processed into a predetermined shape (see FIG. 14A and FIG. 14B). For example, they are processed into a belt-like shape extending in the direction intersecting with the sheet.

Specifically, the portion overlapping with the partition 528 is removed using the protective layer 554B(*j*) and the protective layer 554G(*j*) as hard masks. The partition 528 can be used as an etching stopper.

For example, dry etching is performed while the condition where oxygen is used for an etching gas is avoided. Thus, oxidation of the electrode 552 can be inhibited even when the electrode 552 includes the metal film that is easily oxidized.

In the step in which the layer 104, the unit 103, the layer 105, the intermediate layer 106, the unit 1032, and the layer 1052 are removed, an applied bias can be reduced to as low as possible. Accordingly, damage to the layer 104, the unit 103, the layer 105, the intermediate layer 106, the unit 1032, and the layer 1052 can be mitigated.

The layer 104 is processed into the layer 104B(*j*), the layer 104G(*j*), and the layer 104R(*j*). The unit 103 is processed into the unit 103B(*j*), the unit 103G(*j*), and the unit 103R(*j*). The layer 1052 is processed into the layer 1052B2(*j*), the layer 1052G2(*j*), and the layer 1052R2(*j*). The intermediate layer 106 is processed into the intermediate layer 106B(*j*), the intermediate layer 106G(*j*), and the intermediate layer 106R(*j*). The unit 1032 is processed into the unit 103B2(*j*), the unit 103G2(*j*), and the unit 103R2(*j*). The layer 105 is processed into the layer 105B(*j*), the layer 105G(*j*), and the layer 105R(*j*). The electrode 552 is processed into the electrode 552B(*j*), the electrode 552G(*j*), and the electrode 552R(*j*).

For example, the gap 104S(*j*) is formed and the gap 104S(*j*) inhibits electrical continuity between the layer 104B(*i,j*) and the layer 104G(*i,j*). The gap 106S(*j*) is also formed and the gap 106S(*j*) inhibits electrical continuity between the intermediate layer 106B(*i,j*) and the intermediate layer 106G(*i,j*).

Through the above steps, the light-emitting device 550B(*i,j*) and the light-emitting device 550G(*i,j*) can be separately formed. The light-emitting device 550R(*i,j*) can also be formed.

<<Thirteenth Step>>

In the twelfth step, an insulating film 573 in contact with the partition 528 is formed over the electrode 552B(*j*), the electrode 552G(*j*), and the electrode 552R(*j*) to cover the light-emitting device 550B(*i,j*), the light-emitting device 550G(*i,j*), and the light-emitting device 550R(*i,j*) (see FIG. 14A). For example, the dense insulating film 573A and the flat insulating film 573B are stacked.

Specifically, the dense insulating film 573A is formed by a chemical vapor deposition method, an atomic layer deposition method, or the like, and the flat insulating film 573B is formed over the insulating film 573A by a coating method. Thus, the insulating film 573 with high quality and less defects can be formed.

Through the above steps, the light-emitting device 550B(*i,j*), the light-emitting device 550G(*i,j*), and the light-emitting device 550R(*i,j*) can be protected with the use of the insulating film 573.

Accordingly, the protective layer 554B(*i,j*) and the protective layer 554G(*i,j*) can be resistant to the step in which the component over the partition 528 is removed. For example, a processing condition in which the resist RES formed of an organic material such as a photopolymer is removed can be applied to the step in which the component over the partition 528 is removed. Moreover, for example, when the resist RES formed of an organic material such as a photopolymer is removed, the light-emitting device can be protected using the protective layer 554. As a result, a novel manufacturing method of a display panel that is highly convenient, useful, or reliable can be provided.

Note that this embodiment can be combined with any of the other embodiments described in this specification as appropriate.

Embodiment 3

In this embodiment, a structure of the light-emitting device 150 that can be used for the display panel of one embodiment of the present invention is described with reference to FIG. 15. Note that the structure that can be used for the light-emitting device 150 can be used for the light-emitting device 550B(*i,j*), the light-emitting device 550G(*i,j*), or the light-emitting device 550R(*i,j*), for example, described in Embodiment 1.

<Structure Example of Light-Emitting Device 150>

The light-emitting device 150 described in this embodiment includes an electrode 101, an electrode 102, and the unit 103. The electrode 102 includes a region overlapping with the electrode 101, and the unit 103 includes a region interposed between the electrode 101 and the electrode 102. Note that the structure that can be used for the unit 103 can be used for, for example, the unit 103B(*j*), the unit 103G(*j*), or the unit 103R(*j*) described in Embodiment 1.

<Structure Example of Unit 103>

The unit 103 has a single-layer structure or a stacked-layer structure. For example, the unit 103 includes a layer 111, a layer 112, and the layer 113 (see FIG. 15A). The unit 103 has a function of emitting light EL1.

The layer 111 includes a region interposed between the layer 112 and the layer 113, the layer 112 includes a region interposed between the electrode 101 and the layer 111, and the layer 113 includes a region interposed between the electrode 102 and the layer 111.

For example, a layer selected from a light-emitting layer, a hole-transport layer, an electron-transport layer, a carrier-blocking layer, and the like can be used for the unit 103. A layer selected from a hole-injection layer, an electron-injection layer, an exciton-blocking layer, a charge-generation layer, and the like can be used for the unit 103.

<<Structure Example of Layer 112>>

A material having a hole-transport property can be used for the layer 112, for example. The layer 112 can be referred to as a hole-transport layer. A material having a wider bandgap than the light-emitting material contained in the layer 111 is preferably used for the layer 112. Thus, transfer of energy from excitons generated in the layer 111 to the layer 112 can be inhibited.

[Material Having Hole-Transport Property]

A material having a hole mobility of $1\times10^{-6}$ $cm^2/Vs$ or higher can be suitably used as the material having a hole-transport property.

As the material having a hole-transport property, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

<<Structure Example of Layer 113>>

A material having an electron-transport property, a material having an anthracene skeleton, and a mixed material can be used for the layer 113, for example. The layer 113 can be referred to as an electron-transport layer. A material having a wider bandgap than the light-emitting material contained in the layer 111 is preferably used for the layer 113. Thus, energy transfer from excitons generated in the layer 111 to the layer 113 can be inhibited.

[Material Having Electron-Transport Property]

For example, a metal complex or an organic compound having a π-electron deficient heteroaromatic ring skeleton can be used as the material having an electron-transport property.

As the material having an electron-transport property, a material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used. In this case, the electron-transport property in the electron-transport layer can be inhibited. Alternatively, the amount of electrons injected into the light-emitting layer can be controlled. Alternatively, the light-emitting layer can be prevented from having excess electrons.

As the organic compound having a Tc-electron deficient heteroaromatic ring skeleton, for example, a heterocyclic compound having a polyazole skeleton, a heterocyclic compound having a diazine skeleton, a heterocyclic compound having a pyridine skeleton, a heterocyclic compound having a triazine skeleton, or the like can be used. In particular, the heterocyclic compound having a diazine skeleton and the heterocyclic compound having a pyridine skeleton have favorable reliability and thus are preferable. In addition, the heterocyclic compound having a diazine (pyrimidine or pyrazine) skeleton has a high electron-transport property to contribute to a reduction in driving voltage.

[Material Having Anthracene Skeleton]

An organic compound having an anthracene skeleton can be used for the layer 113. In particular, an organic compound having both an anthracene skeleton and a heterocyclic skeleton can be suitably used.

For example, it is possible to use an organic compound having both an anthracene skeleton and a nitrogen-containing five-membered ring skeleton. Alternatively, it is possible to use an organic compound having both an anthracene skeleton and a nitrogen-containing five-membered ring skeleton where two heteroatoms are included in a ring. Specifically, it is suitable to use, as the heterocyclic skeleton, a pyrazole ring, an imidazole ring, an oxazole ring, a thiazole ring, or the like.

For example, it is possible to use an organic compound having both an anthracene skeleton and a nitrogen-containing six-membered ring skeleton. Alternatively, it is possible to use an organic compound having both an anthracene skeleton and a nitrogen-containing six-membered ring skeleton where two heteroatoms are included in a ring. Specifically, a pyrazine ring, a pyrimidine ring, a pyridazine ring, or the like can be suitably used as the heterocyclic skeleton.

[Structure Example of Mixed Material]

A material in which a plurality of kinds of substances are mixed can be used for the layer 113. Specifically, a mixed material which includes an alkali metal, an alkali metal compound, or an alkali metal complex and a substance having an electron-transport property can be used for the layer 113. Note that the material having an electron-transport property preferably has a HOMO level of −6.0 eV or greater.

For example, a composite material of a substance having an electron-accepting property and a material having a hole-transport property can be used for the layer 104. Specifically, a composite material of a substance having an electron-accepting property and a substance having a relatively deep HOMO level HOMO1, which is greater than or equal to −5.7 eV and lower than or equal to −5.4 eV, can be used for the layer 104 (see FIG. 15B). The mixed material can be suitably used for the layer 113 in combination with a structure using such a composite material for the layer 104. This leads to an increase in the reliability of the light-emitting device.

Furthermore, a structure using a material having a hole-transport property for the layer 112 can be suitably combined with the structure using the mixed material for the layer 113 and the composite material for the layer 104. For example, a substance having the HOMO level HOMO2, which is within the range of −0.2 eV to 0 eV from the relatively deep HOMO level HOMO1, can be used for the layer 112 (see FIG. 15B). This leads to an increase in the reliability of the light-emitting device.

The concentration of the alkali metal, the alkali metal compound, or the alkali metal complex preferably differs in the thickness direction of the layer 113 (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

<<Structure Example 1 of Layer 111>>

A light-emitting material or a light-emitting material and a host material can be used for the layer 111, for example. The layer 111 can be referred to as a light-emitting layer. Note that the layer 111 is preferably provided in a region where holes and electrons are recombined. Thus, energy generated by recombination of carriers can be efficiently converted into light and emitted. Furthermore, the layer 111 is preferably provided to be distanced from a metal used for the electrode or the like. Thus, a quenching phenomenon caused by the metal used for the electrode or the like can be inhibited.

For example, a fluorescent substance, a phosphorescent substance, or a substance exhibiting thermally activated delayed fluorescence (TADF) (also referred to as a TADF material) can be used as the light-emitting material. Thus, energy generated by recombination of carriers can be released as the light EL1 from the light-emitting material (see FIG. 15A).

[Fluorescent Substance]

A fluorescent substance can be used for the layer 111. For example, any of the following fluorescent substances can be used for the layer 111. Note that the fluorescent substance that can be used for the layer 111 is not limited to the following, and a variety of known fluorescent substances can be used.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

[Phosphorescent Substance]

A phosphorescent substance can be used for the layer 111. For example, the following phosphorescent substances can be used for the layer 111. Note that the phosphorescent substance that can be used for the layer 111 is not limited to the following, and a variety of known phosphorescent substances can be used.

Any of the following can be used for the layer 111: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Substance Exhibiting Thermally Activated Delayed Fluorescence (TADF)]

A TADF material can be used for the layer 111. For example, any of the TADF materials given below can be used as the light-emitting material. Note that without being limited thereto, a variety of known TADF materials can be used as the light-emitting material.

In the TADF material, the difference between the S1 level and the T1 level is small, and reverse intersystem crossing (upconversion) from the triplet excited state into the singlet excited state can be performed with a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Furthermore, a heterocyclic compound including one or both of a π-electron rich heteroaromatic ring and a Tc-electron deficient heteroaromatic ring can be used, for example, for the TADF material.

Such a heterocyclic compound is preferable because of having excellent electron-transport property and hole-transport property owing to a n-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high electron-accepting properties and reliability.

Among skeletons having the Tc-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the Tc-electron rich heteroaromatic ring is directly bonded to the π-electron deficient heteroaromatic ring is particularly preferable because the electron-donating property of the π-electron rich heteroaromatic ring and the electron-acceptor property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

<<Structure Example 2 of Layer 111>>

A material having a carrier-transport property can be used as the host material. For example, a material having a hole-transport property, a material having an electron-transport property, a substance exhibiting thermally activated delayed fluorescence, a material having an anthracene skeleton, or a mixed material can be used as the host material. A material having a wider bandgap than the light-emitting material contained in the layer 111 is preferably used as the host material. Thus, transfer of energy from excitons generated in the layer 111 to the host material can be inhibited.

[Material Having Hole-Transport Property]

A material having a hole mobility of $1\times10^{-6}$ $cm^2/Vs$ or higher can be suitably used as the material having a hole-transport property.

For example, a material having a hole-transport property that can be used for the layer 112 can be used for the layer 111. Specifically, a material having a hole-transport property that can be used for the hole-transport layer can be used for the layer 111.

[Material Having Electron-Transport Property]

For example, a material having an electron-transport property that can be used for the layer 113 can be used for the layer 111. Specifically, a material having an electron-transport property that can be used for the electron-transport layer can be used for the layer 111.

[Material Having Anthracene Skeleton]

An organic compound having an anthracene skeleton can be used as the host material. In particular, when a fluorescent substance is used as the light-emitting substance, an organic compound having an anthracene skeleton is suitable. Thus, a light-emitting device with high emission efficiency and high durability can be achieved.

Among the organic compounds having an anthracene skeleton, an organic compound having a diphenylanthracene skeleton, in particular, a 9,10-diphenylanthracene skeleton is chemically stable and thus is preferable. The host material preferably has a carbazole skeleton in order to improve the hole-injection and hole-transport properties. In particular, the host material preferably has a dibenzocarbazole skeleton because the HOMO level thereof is shallower than that of carbazole by approximately 0.1 eV, so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferably used as the host material.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance, whereby the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

For example, the TADF material that can be used as the light-emitting material can be used as the host material.

[Structure Example 1 of Mixed Material]

A material in which a plurality of kinds of substances are mixed can be used as the host material. For example, a material which includes an electron-transport material and a hole-transport material can be used as the mixed material. The weight ratio between the hole-transport material and the electron-transport material contained in the mixed material may be (the hole-transport material/the electron-transport material)=(1/19) or more and (19/1) or less. Thus, the carrier-transport property of the layer 111 can be easily adjusted and a recombination region can be easily controlled.

[Structure Example 2 of Mixed Material]

A material mixed with a phosphorescent substance can be used as the host material. When a fluorescent substance is used as the light-emitting substance, the phosphorescent substance can be used as an energy donor for supplying excitation energy to the fluorescent substance.

A mixed material containing a material to form an exciplex can be used as the host material. For example, a material in which an emission spectrum of a formed exciplex overlaps with a wavelength of the absorption band on the lowest energy side of the light-emitting substance can be used as the host material. This enables smooth energy transfer and improves emission efficiency. The driving voltage can be inhibited.

A phosphorescent substance can be used as at least one of the materials forming an exciplex. Accordingly, reverse intersystem crossing can be utilized. Triplet excitation energy can be efficiently converted into singlet excitation energy.

A combination of a material having an electron-transport property and a material having a hole-transport property whose HOMO level is higher than or equal to that of the material having an electron-transport property is preferable for forming an exciplex. The LUMO level of the material having a hole-transport property is preferably higher than or equal to the LUMO level of the material having an electron-transport property. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the material having a hole-transport property and the material having an electron-transport property are mixed is shifted to a longer wavelength side than the emission spectrum of each of the materials (or has another peak on the longer wavelength side) observed in comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed in comparison of transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed in comparison of the transient EL of the material having a hole-transport property, the transient EL of the material having an electron-transport property, and the transient EL of the mixed film of these materials.

Note that this embodiment can be combined with any of the other embodiments described in this specification as appropriate.

Embodiment 4

Figure 15A:
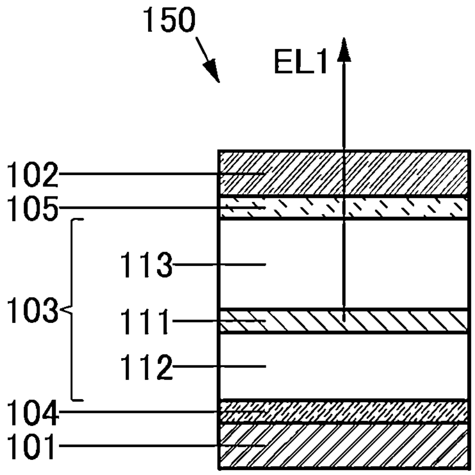
FIG. 15A and FIG. 15B are diagrams each illustrating a structure of a light-emitting device according to an embodiment.
Figure 15B:
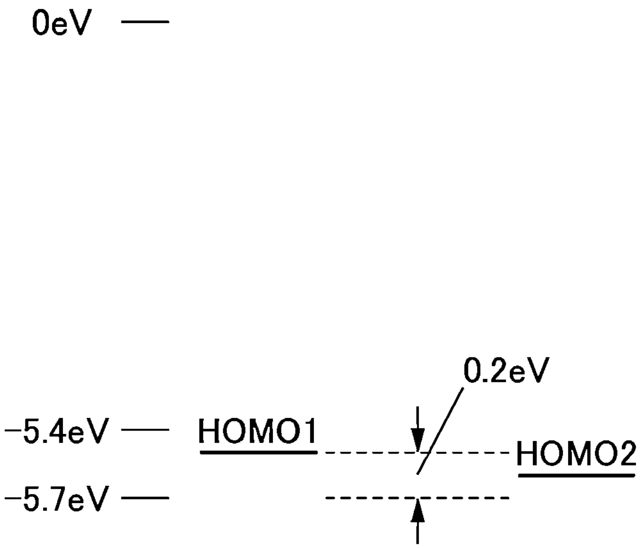

In this embodiment, a structure of the light-emitting device 150 of one embodiment of the present invention is described with reference to FIG. 15A. Note that the structure that can be used for the light-emitting device 150 can be used for the light-emitting device 550B(*i,j*), the light-emitting device 550G(*i,j*), or the light-emitting device 550R(*i,j*), for example, described in Embodiment 1.

<Structure Example of Light-Emitting Device 150>

The light-emitting device 150 described in this embodiment includes the electrode 101, the electrode 102, the unit 103, and the layer 104. The electrode 102 includes a region overlapping with the electrode 101, and the unit 103 includes a region interposed between the electrode 101 and the electrode 102. The layer 104 includes a region interposed between the electrode 101 and the unit 103. For example, the structure described in Embodiment 3 can be used for the unit 103. The structure that can be used for the electrode 101 can be used for the electrode 551B(*i,j*), the electrode 551G(*i,j*), or the electrode 551R(*i,j*) described in Embodiment 1, for example. The structure that can be used for the layer 104 can be used for the layer 104B(*j*), the layer 104G(*j*), or the layer 104R(*j*) described in Embodiment 1.

<Structure Example of Electrode 101>

For example, a conductive material can be used for the electrode 101. Specifically, a single layer or a stacked layer of a metal, an alloy, or a film containing a conductive compound can be used for the electrode 101.

A film that efficiently reflects light can be used as the electrode 101, for example. Specifically, an alloy containing silver, copper, and the like, an alloy containing silver, palladium, and the like, or a metal film of aluminum or the like can be used for the electrode 101.

For example, a metal film that transmits part of light and reflects another part of the light can be used as the electrode 101. Thus, a microcavity structure can be provided in the light-emitting device 150. Light of a predetermined wavelength can be extracted more efficiently than other light. Light with a narrow half width of a spectrum can be extracted. Light of a bright color can be extracted.

A film having a visible-light-transmitting property can be used for the electrode 101, for example. Specifically, a single layer or a stacked layer of a metal film, an alloy film, a conductive oxide film, or the like that is thin enough to transmit light can be used for the electrode 101.

In particular, a material having a work function higher than or equal to 4.0 eV can be suitably used.

For example, indium oxide-tin oxide (abbreviation: ITO:), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, graphene can be used.

Note that this embodiment can be combined with any of the other embodiments described in this specification as appropriate.

Embodiment 5

In this embodiment, a structure of the light-emitting device 150 of one embodiment of the present invention is described with reference to FIG. 15A. Note that the structure that can be used for the light-emitting device 150 can be used for the light-emitting device 550B(*i,j*), the light-emitting device 550G(*i,j*), or the light-emitting device 550R(*i,j*), for example, described in Embodiment 1.

<Structure Example of Light-Emitting Device 150>

The light-emitting device 150 described in this embodiment includes the electrode 101, the electrode 102, the unit 103, and the layer 105. The electrode 102 includes a region overlapping with the electrode 101, and the unit 103 includes a region interposed between the electrode 101 and the electrode 102. The layer 105 includes a region interposed between the unit 103 and the electrode 102. For example, the structure described in Embodiment 3 can be used for the unit 103. In addition, the structure that can be used for the electrode 102 can be used for, for example, the electrode 552B(*j*), the electrode 552G(*j*), or the electrode 552R(*j*) described in Embodiment 1. The material that can be used for the layer 105 can be used for, for example, the layer 105B(*j*), the layer 105G(*j*), or the layer 105R(*j*) described in Embodiment 1.

<Structure Example of Electrode 102>

For example, a conductive material can be used for the electrode 102. Specifically, a single layer or a stacked layer of a metal, an alloy, or a material containing a conductive compound can be used for the electrode 102.

For example, the material that can be used for the electrode 101 described in Embodiment 4 can be used for the electrode 102. In particular, a material with a lower work function than the electrode 101 can be suitably used for the electrode 102. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 102.

Specifically, lithium (Li), cesium (Cs), or the like; magnesium (Mg), calcium (Ca), strontium (Sr), or the like; europium (Eu), ytterbium (Yb), or the like or an alloy containing any of these (MgAg or AlLi) can be used for the electrode 102. Alternatively, a layered material of the alloy containing any of these and a conductive oxide can be used for the electrode 102. Specifically, a layered material of MgAg and ITO can be used for the electrode 102.

<<Structure Example of Layer 105>>

For example, a material having an electron-injection property can be used for the layer 105. The layer 105 can also be referred to as an electron-injection layer.

Specifically, a substance having a donor property can be used for the layer 105. Alternatively, a material in which a substance having a donor property and a material having an electron-transport property are combined can be used for the layer 105. Alternatively, an electride can be used for the layer 105. This can facilitate the injection of electrons from the electrode 102, for example. Alternatively, not only a material having a low work function but also a material having a high work function can also be used for the electrode 102. Alternatively, a material used for the electrode 102 can be selected from a wide range of materials regardless of its work function. Specifically, Al, Ag, ITO, indium oxide-tin oxide containing silicon or silicon oxide, and the like can be used for the electrode 102. Alternatively, the driving voltage of the light-emitting device can be reduced.

[Substance Having Donor Property]

For example, an alkali metal, an alkaline earth metal, a rare earth metal, or a compound thereof (an oxide, a halide, a carbonate, or the like) can be used for the substance having a donor property. Alternatively, an organic compound such as tetrathianaphthacene (abbreviation: TTN), nickelocene, or decamethylnickelocene can be used as the substance having a donor property.

[Structure Example 1 of Composite Material]

A material composed of two or more kinds of substances can be used as the material having an electron-injection property. For example, a substance having a donor property and a material having an electron-transport property can be used for the composite material.

[Material Having Electron-Transport Property]

For example, a metal complex or an organic compound having a π-electron deficient heteroaromatic ring skeleton can be used as the material having an electron-transport property.

For example, a material having an electron-transport property capable of being used for the unit 103 can be used as the composite material.

[Structure Example 2 of Composite Material]

A material including a fluoride of an alkali metal in a microcrystalline state and a material having an electron-transport property can be used for the composite material. Alternatively, a material including a fluoride of an alkaline earth metal in a microcrystalline state and a material having an electron-transport property can be used for the composite material. In particular, a composite material including a fluoride of an alkali metal or a fluoride of an alkaline earth metal at 50 wt % or higher can be suitably used. Alternatively, a composite material including an organic compound having a bipyridine skeleton can be suitably used. Thus, the refractive index of the layer 104 can be reduced. The external quantum efficiency of the light-emitting device can be improved.

[Electride]

For example, a substance obtained by adding electrons at high concentration to an oxide where calcium and aluminum are mixed, or the like can be used as the material having an electron-injection property.

Note that this embodiment can be combined with any of the other embodiments described in this specification as appropriate.

Embodiment 6

In this embodiment, a structure of the light-emitting device 150 of one embodiment of the present invention is described with reference to FIG. 16A.

Figure 16A:
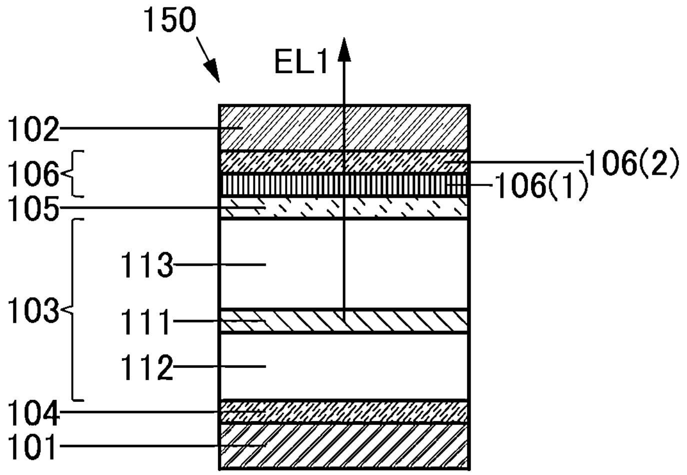
FIG. 16A and FIG. 16B are diagrams illustrating structures of a light-emitting device according to an embodiment.

FIG. 16A is a cross-sectional view illustrating a structure of the light-emitting device of one embodiment of the present invention.

<Structure Example of Light-Emitting Device 150>

The light-emitting device 150 described in this embodiment includes the electrode 101, the electrode 102, the unit 103, and an intermediate layer 106 (see FIG. 16A). The electrode 102 includes a region overlapping with the electrode 101, and the unit 103 includes a region interposed between the electrode 101 and the electrode 102. The intermediate layer 106 includes a region positioned between the unit 103 and the electrode 102.

<<Structure Example of Intermediate Layer 106>>

The intermediate layer 106 includes a layer 106(1) and a layer 106(2). The layer 106(2) includes a region interposed between the layer 106(1) and the electrode 102.

<<Structure Example of Layer 106(1)>>

For example, a material having an electron-transport property can be used for the layer 106(1). The layer 106(1) can be referred to as an electron-relay layer. With the use of the layer 106(1), a layer that is on the anode side and in contact with the layer 106(1) can be kept away from a layer that is on the cathode side and in contact with the layer 106(1). Interaction between the layer that is on the anode side and in contact with the layer 106(1) and the layer that is on the cathode side and in contact with the layer 106(1) can be reduced. Electrons can be smoothly supplied to the layer that is on the anode side and in contact with the layer 106(1).

A substance whose LUMO level is positioned between the LUMO level of the substance having an electron-accepting property included in the layer that is on the anode side and in contact with the layer 106(1) and the LUMO level of the substance included in the layer that is on the cathode side and in contact with the layer 106(1) can be suitably used for the layer 106(1).

For example, a material having a LUMO level in a range higher than or equal to −5.0 eV, preferably higher than or equal to −5.0 eV and lower than or equal to −3.0 eV, can be used for the layer 106(1).

Specifically, a phthalocyanine-based material can be used for the layer 106(1). Alternatively, a metal complex having a metal-oxygen bond and an aromatic ligand can be used for the layer 106(1).

<<Structure Example of Layer 106(2)>>

For example, a material that supplies electrons to the anode side and supplies holes to the cathode side when voltage is applied can be used for the layer 106(2). Specifically, electrons can be supplied to the unit 103 that is positioned on the anode side. The layer 106(2) can be referred to as a charge-generation layer.

Specifically, a material having a hole-injection property capable of being used for the layer 104 can be used for the layer 106(2). For example, a composite material can be used for the layer 106(2). Alternatively, for example, a stacked film in which a film including the composite material and a film including a material having a hole-transport property are stacked can be used for the layer 106(2).

Note that this embodiment can be combined with any of the other embodiments described in this specification as appropriate.

Embodiment 7

In this embodiment, a structure of the light-emitting device 150 of one embodiment of the present invention is described with reference to FIG. 16B and FIG. 17.

Figure 16B:
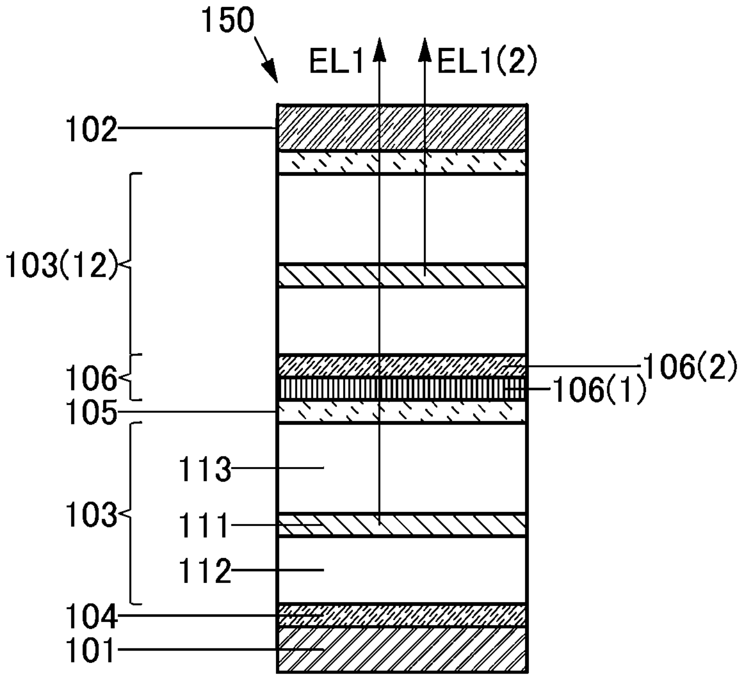

FIG. 16B is a cross-sectional view illustrating a structure of the light-emitting device of one embodiment of the present invention, which is different from the structure illustrated in FIG. 16A.

Figure 17:
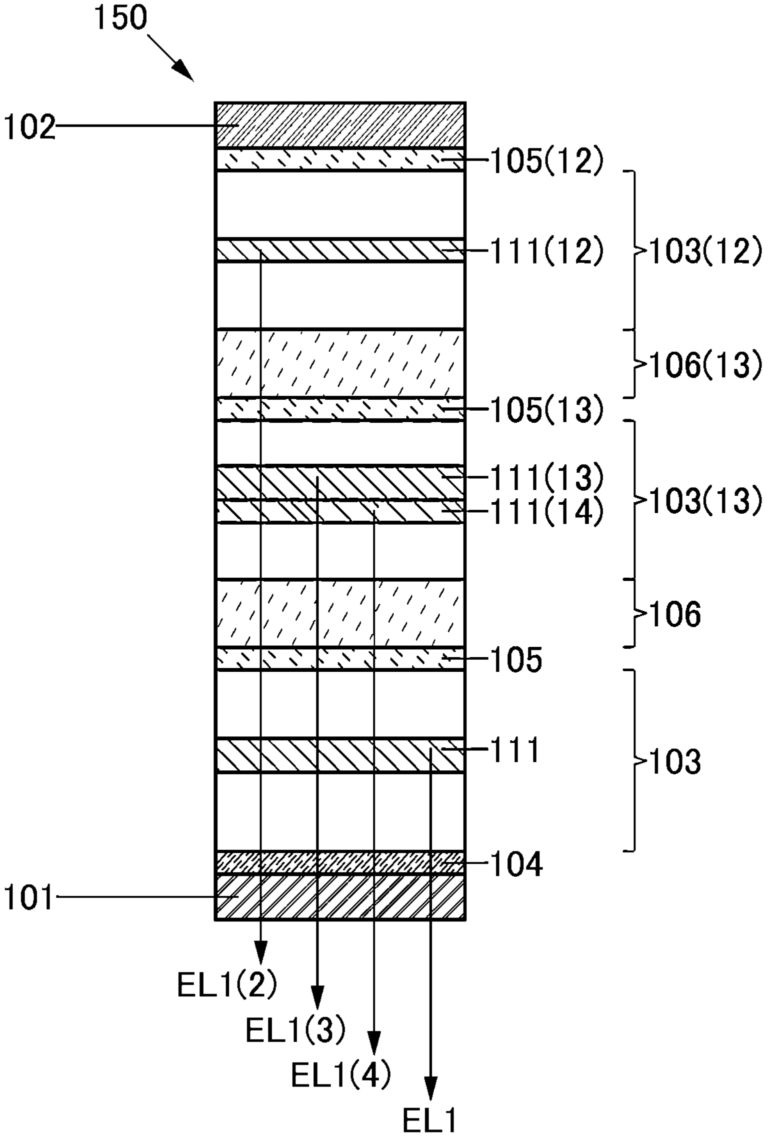
FIG. 17 is a diagram illustrating a structure of a light-emitting device according to an embodiment.

FIG. 17 is a cross-sectional view illustrating a structure of a light-emitting device of one embodiment of the present invention, which is different from the structure illustrated in FIG. 16B.

<Structure Example 1 of Light-Emitting Device 150>

The light-emitting device 150 described in this embodiment includes the electrode 101, the electrode 102, the unit 103, the intermediate layer 106, and a unit 103(12) (see FIG. 16B). The electrode 102 includes a region overlapping with the electrode 101, the unit 103 includes a region positioned between the electrode 101 and the electrode 102, and the intermediate layer 106 includes a region positioned between the unit 103 and the electrode 102. The unit 103(12) includes a region interposed between the intermediate layer 106 and the electrode 102, and the unit 103(12) has a function of emitting light EL1(2).

A structure including the intermediate layer 106 and a plurality of units is referred to as a stacked light-emitting device or a tandem light-emitting device in some cases. This structure can obtain light emission at high luminance while the current density is kept low. Alternatively, the reliability can be increased. Alternatively, the driving voltage can be reduced in comparison with that of the light-emitting device with the same luminance. Alternatively, power consumption can be inhibited.

<<Structure Example of Unit 103(12)>>

The structure that can be used for the unit 103 can also be used for the unit 103(12). In other words, the light-emitting device 150 includes a plurality of units that are stacked. Note that the number of stacked units is not limited to two, and three or more units can be stacked.

The same structure as the unit 103 can be used for the unit 103(12). Alternatively, a structure different from the unit 103 can be used for the unit 103(12).

For example, a structure which exhibits a different emission color from that of the unit 103 can be used for the unit 103(12). Specifically, the unit 103 emitting red light and green light and the unit 103(12) emitting blue light can be used. Accordingly, a light-emitting device that emits light of a desired color can be provided. For example, a light-emitting device that emits white light can be provided.

<<Structure Example of Intermediate Layer 106>>

The intermediate layer 106 has a function of supplying electrons to one of the unit 103 and the unit 103(12) and supplying holes to the other. For example, the intermediate layer 106 described in Embodiment 6 can be used.

<Structure Example 2 of Light-Emitting Device 150>

The light-emitting device 150 described in this embodiment includes the electrode 101, the electrode 102, the unit 103, intermediate the layer 106, the unit 103(12), a unit 103(13), a layer 105(13), and an intermediate layer 106(13) (see FIG. 17).

The light-emitting device is different from the light-emitting device 150 illustrated in FIG. 16B in that the unit 103(13), the layer 105(13), and the intermediate layer 106 (13) are provided between the layer intermediate layer 106 and the unit 103(12).

The layer 111 has a function of emitting light EL1, a layer 111(12) has a function of emitting light EL1(2), a layer 111(13) has a function of emitting light EL1(3), and a layer 111(14) has a function of emitting light EL1(4).

For example, a light-emitting material that emits blue light can be used for the layer 111 and the layer 111(12). For example, a light-emitting material that emits yellow light can be used for the layer 111(13). For example, a light-emitting material that emits red light can be used for the layer 111(14).

For example, the structure that can be used for the unit 103 can be used for the unit 103(13), the structure that can be used for the layer 105 can be used for the layer 105(13), and the structure that can be used for the intermediate layer 106 can be used for the intermediate layer 106(13).

<Manufacturing Method of Light-Emitting Device 150>

For example, each layer of the electrode 101, the electrode 102, the unit 103, the intermediate layer 106, and the unit 103(12) can be formed by a dry process, a wet process, an evaporation method, a droplet discharge method, a coating method, a printing method, or the like. Different methods can be used to form the components.

Specifically, the light-emitting device 150 can be manufactured with a vacuum evaporation machine, an inkjet machine, a spin coater, a coating machine, a gravure printing machine, an offset printing machine, a screen printing machine, or the like.

For example, the electrode can be formed by a wet process or a sol-gel method using a paste of a metal material. An indium oxide-zinc oxide film can be formed by a sputtering method using a target obtained by adding, to indium oxide, zinc oxide at higher than or equal to 1 wt % and lower than or equal to 20 wt %. An indium oxide film containing tungsten oxide and zinc oxide (IWZO) can be formed by a sputtering method using a target containing, with respect to indium oxide, tungsten oxide at higher than or equal to 0.5 wt % and lower than or equal to 5 wt % and zinc oxide at higher than or equal to 0.1 wt % and lower than or equal to 1 wt %.

Note that this embodiment can be combined with any of the other embodiments described in this specification as appropriate.

Embodiment 8

In this embodiment, structures of a data processing device of one embodiment of the present invention will be described with reference to FIG. 18 to FIG. 20.

Figure 18A:
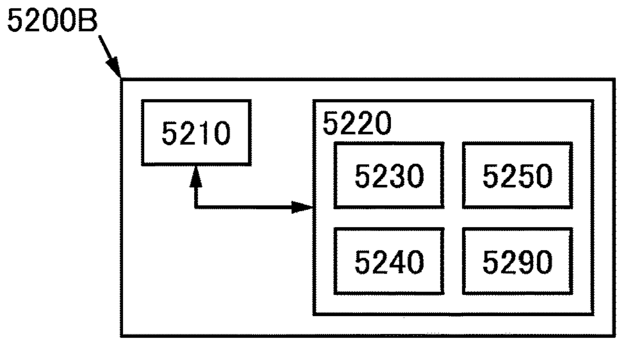
FIG. 18A to FIG. 18E are diagrams illustrating structures of a data processing device according to an embodiment.
Figure 18B:
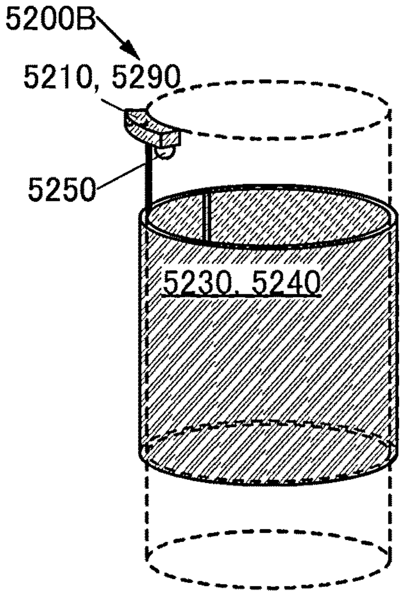
Figure 18C:
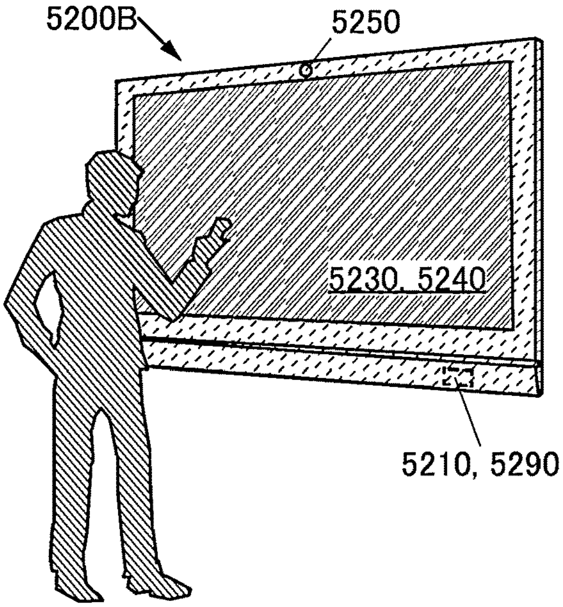
Figure 18D:
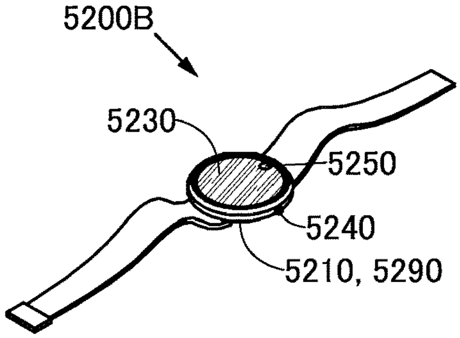
Figure 18E:
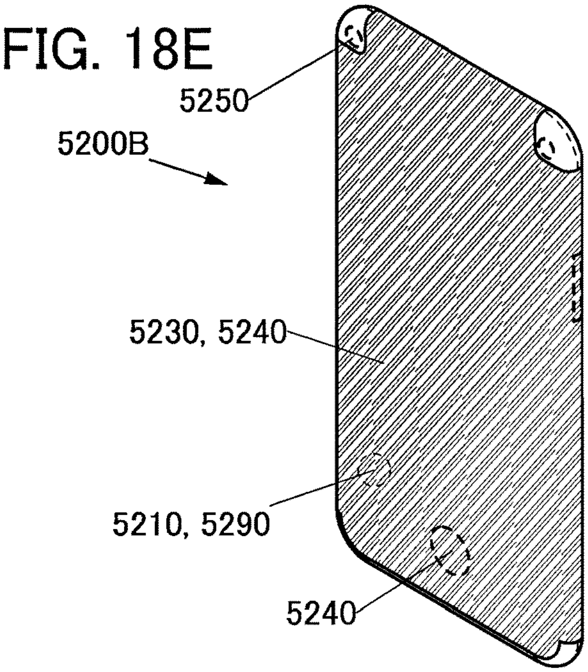
Figure 19A:
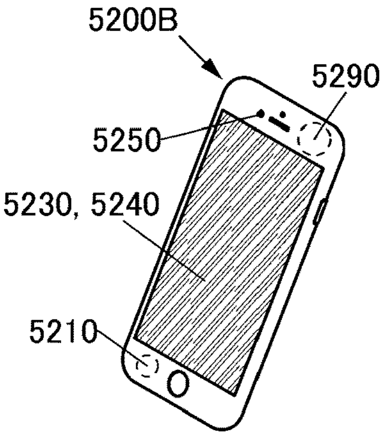
FIG. 19A to FIG. 19E are diagrams illustrating structures of a data processing device according to an embodiment.
Figure 19B:
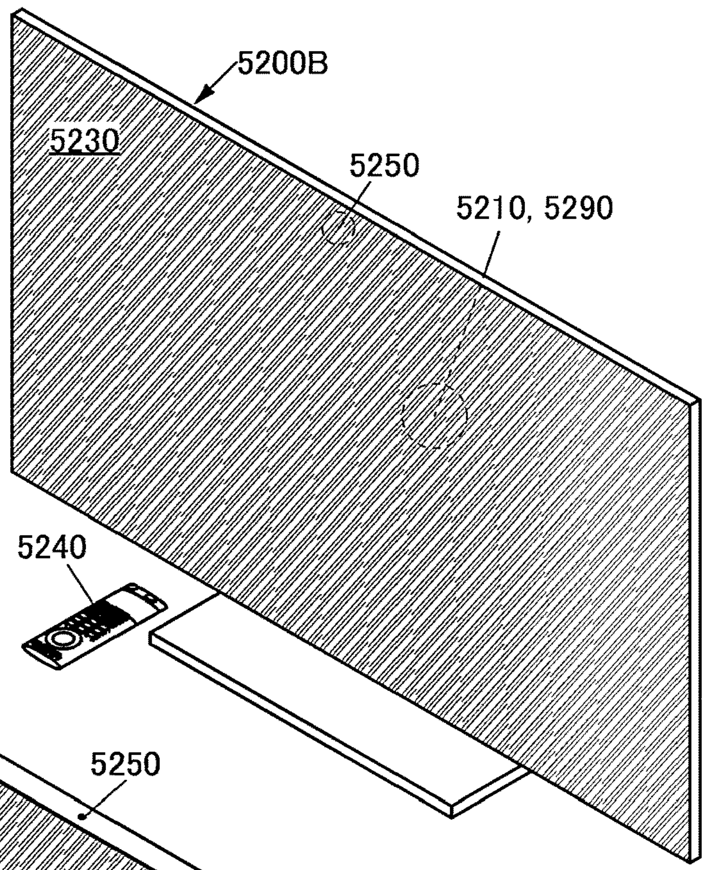
Figure 19C:
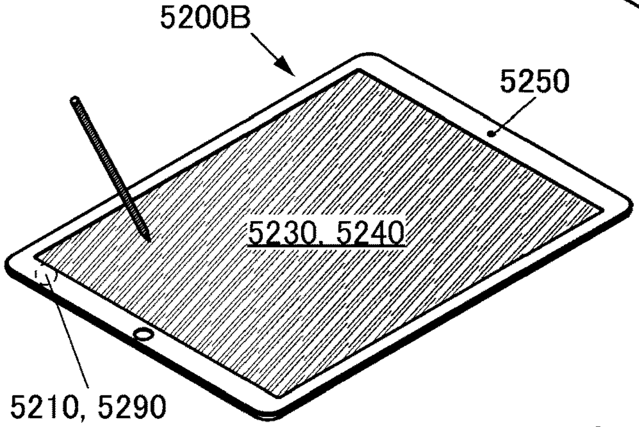
Figure 19D:
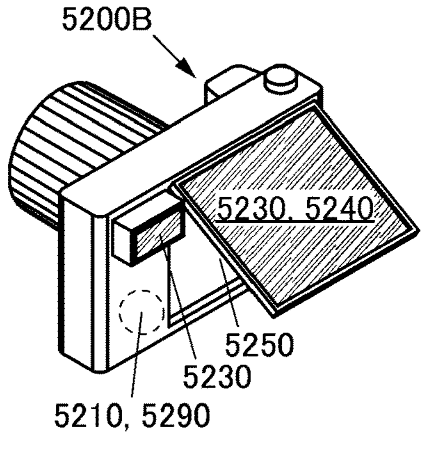
Figure 19E:
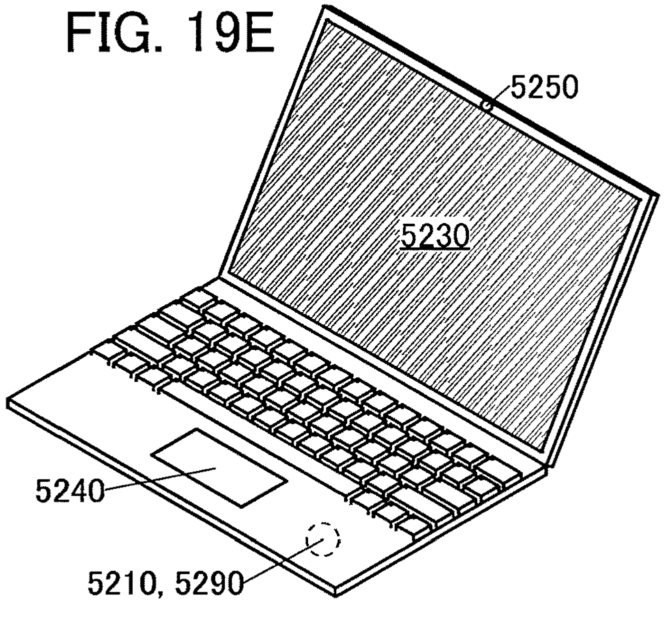
Figure 20A:
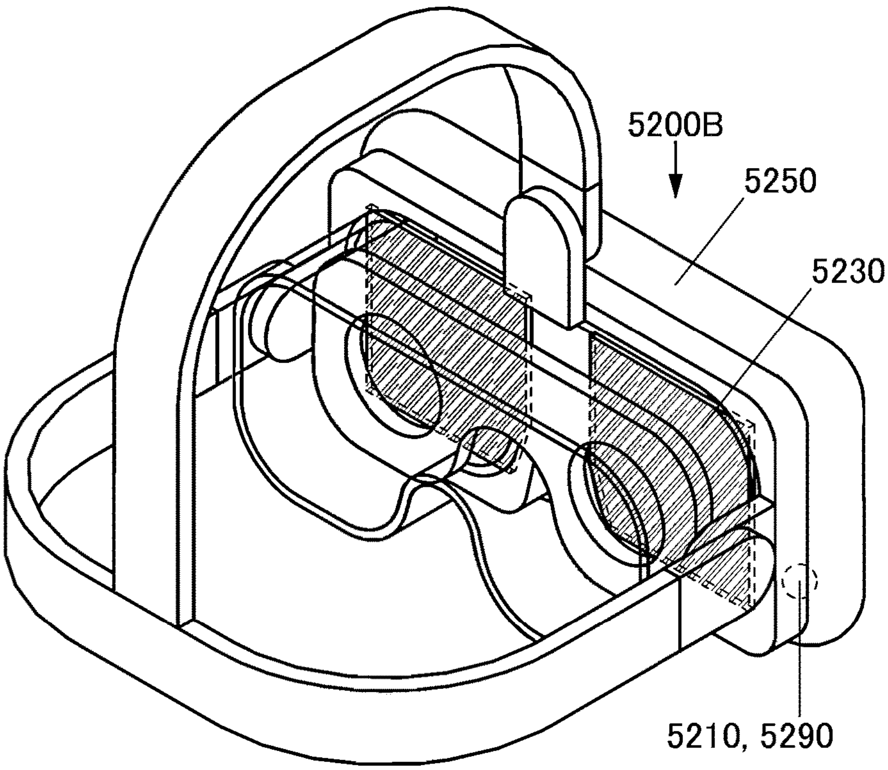
FIG. 20A and FIG. 20B are diagrams illustrating a structure of a data processing device according to an embodiment.
Figure 20B:
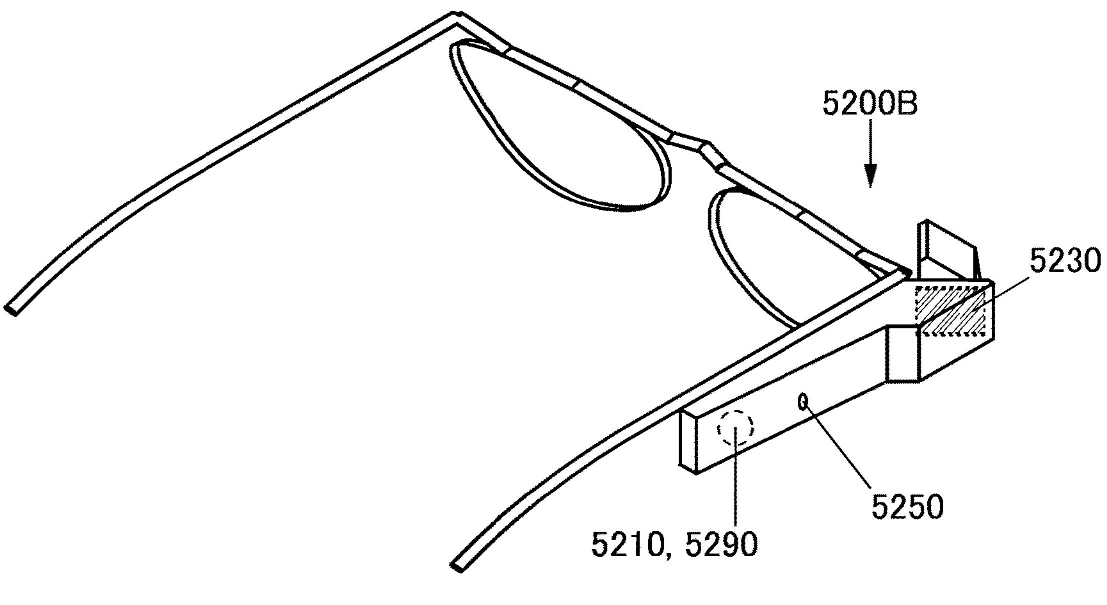

FIG. 18 to FIG. 20 are diagrams illustrating structures of the data processing device of one embodiment of the present invention. FIG. 18A is a block diagram of the data processing device, and FIG. 18B to FIG. 18E are perspective views illustrating structures of the data processing device. FIG. 19A to FIG. 19E are perspective views illustrating structures of the data processing device. FIG. 20A and FIG. 20B are perspective views illustrating structures of the data processing device.

<Data Processing Device>

A data processing device 5200B described in this embodiment includes an arithmetic device 5210 and an input/output device 5220 (see FIG. 18A).

The arithmetic device 5210 has a function of being supplied with operation information and a function of supplying image information on the basis of the operation information.

The input/output device 5220 includes a display portion 5230, an input portion 5240, a sensing portion 5250, and a communication portion 5290 and has a function of supplying operation information and a function of being supplied with image information. The input/output device 5220 also has a function of supplying sensing information, a function of supplying communication information, and a function of being supplied with communication information.

The input portion 5240 has a function of supplying operation information. For example, the input portion 5240 supplies operation information on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image information. For example, the display panel described in Embodiment 1 can be used for the display portion 5230.

The sensing portion 5250 has a function of supplying sensing information. For example, the sensing portion 5250 has a function of sensing a surrounding environment where the data processing device is used and supplying sensing information.

Specifically, an illuminance sensor, an imaging device, an attitude detection device, a pressure sensor, a human motion sensor, or the like can be used as the sensing portion 5250.

The communication portion 5290 has a function of being supplied with communication information and a function of supplying communication information. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Data Processing Device>>

For example, the display portion 5230 can have an outer shape along a cylindrical column or the like (see FIG. 18B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

<<Structure Example 2 of Data Processing Device>>

For example, the data processing device has a function of generating image information on the basis of the path of a pointer used by a user (see FIG. 18C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

<<Structure Example 3 of Data Processing Device>>

The data processing device can receive information from another device, and the information can be displayed on the display portion 5230 (see FIG. 18D). Several options can be displayed. The user can choose some from the options and send a reply to a transmitter of the information. For example, the data processing device has a function of changing its display method in accordance with the illuminance of a usage environment. Thus, for example, the power consumption of a wrist-watch-type portable terminal device can be reduced. Alternatively, for example, a wrist-watch-type portable terminal device can display an image so as to be suitably used even in an environment under strong external light, e.g., outdoors in fine weather.

<<Structure Example 4 of Data Processing Device>>

For example, the display portion 5230 has a surface gently curved along a side surface of a housing (see FIG. 18E). The display portion 5230 includes a display panel, and the display panel has a function of performing display on the front surface, the side surfaces, the top surface, and the rear surface, for example. Thus, for example, a mobile phone can display information not only on its front surface but also on its side surfaces, its top surface, and its rear surface.

<<Structure Example 5 of Data Processing Device>>

For example, the data processing device can receive information via the Internet and display the information on the display portion 5230 (see FIG. 19A). A created message can be checked on the display portion 5230. The created message can be sent to another device. The data processing device has a function of changing its display method in accordance with the illuminance of a usage environment, for example. Thus, the power consumption of a smartphone can be reduced. Alternatively, for example, a smartphone can display an image so as to be suitably used even in an environment under strong external light, e.g., outdoors in fine weather.

<<Structure Example 6 of Data Processing Device>>

A remote controller can be used as the input portion 5240 (see FIG. 19B). For example, the data processing device can receive information from a broadcast station or via the Internet and display the information on the display portion 5230. An image of a user can be captured using the sensing portion 5250. The image of the user can be transmitted. The data processing device can acquire a viewing history of the user and provide it to a cloud service. The data processing device can acquire recommendation information from a cloud service and display the information on the display portion 5230. A program or a moving image can be displayed on the basis of the recommendation information. For example, the data processing device has a function of changing its display method in accordance with the illuminance of a usage environment. Accordingly, for example, a television system can display an image to be suitably used even when irradiated with strong external light that enters a room in fine weather.

<<Structure Example 7 of Data Processing Device>>

For example, the data processing device can receive educational materials via the Internet and display them on the display portion 5230 (see FIG. 19C). An assignment can be input with the input portion 5240 and sent via the Internet.

A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Data Processing Device>>

The data processing device includes, for example, a plurality of display portions 5230 (see FIG. 19D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 19E). As another example, part of image data can be displayed on the display portion 5230 and another part of the image data can be displayed on a display portion of another data processing device. Image signals can be supplied. With the communication portion 5290, information to be written can be obtained from an input portion of another data processing device. Thus, a large display region can be utilized by using a portable personal computer, for example.

<<Structure Example 10 of Data Processing Device>>

The data processing device includes, for example, the sensing portion 5250 that senses an acceleration or a direction (see FIG. 20A). The sensing portion 5250 can supply information on the position of the user or the direction in which the user faces. The data processing device can generate image information for the right eye and image information for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensing portion 5250 that senses an acceleration or a direction (see FIG. 20B). The sensing portion 5250 can supply information on the position of the user or the direction in which the user faces. The data processing device can generate image information in accordance with the position of the user or the direction in which the user faces. Accordingly, the information can be shown together with a real-world scene, for example. An augmented reality image can be displayed on a glasses-type data processing device.

Note that this embodiment can be combined with any of the other embodiments described in this specification as appropriate.

Example 1

In this example, a structure of a fabricated display panel of one embodiment of the present invention is described with reference to FIG. 21.

Figure 21A:
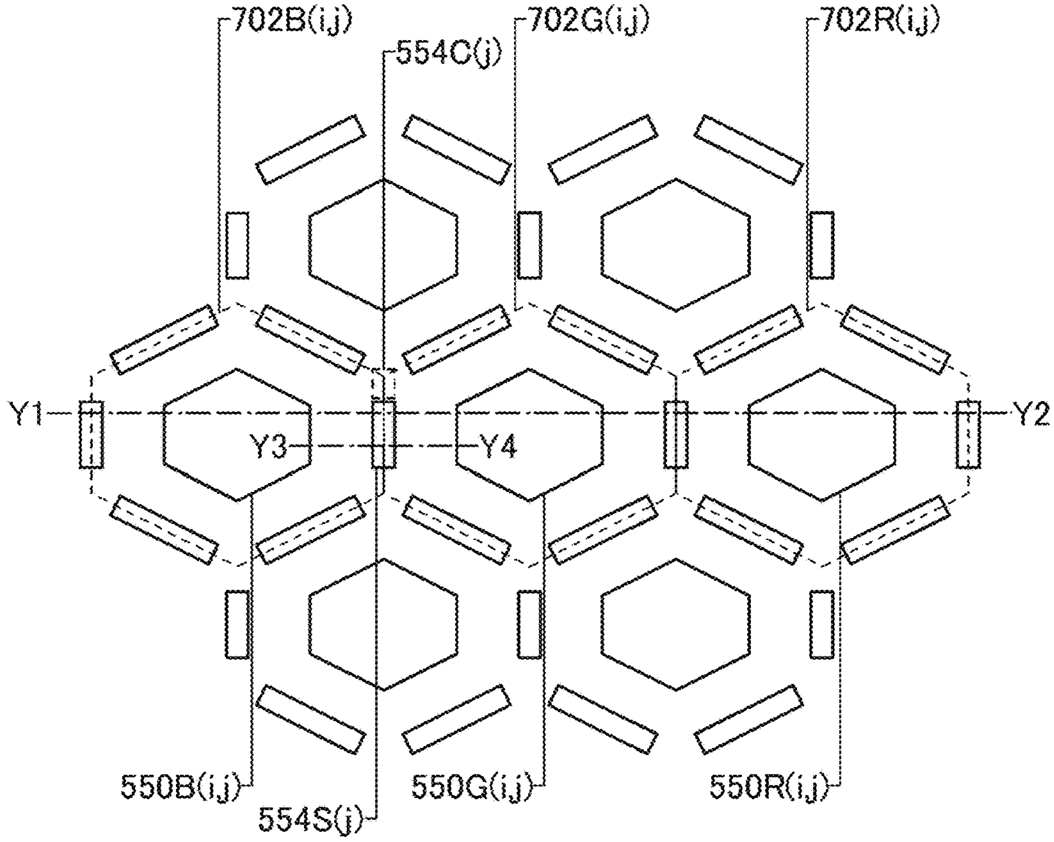
FIG. 21A and FIG. 21B are diagrams illustrating a structure of a display panel according to an example.
Figure 21B:
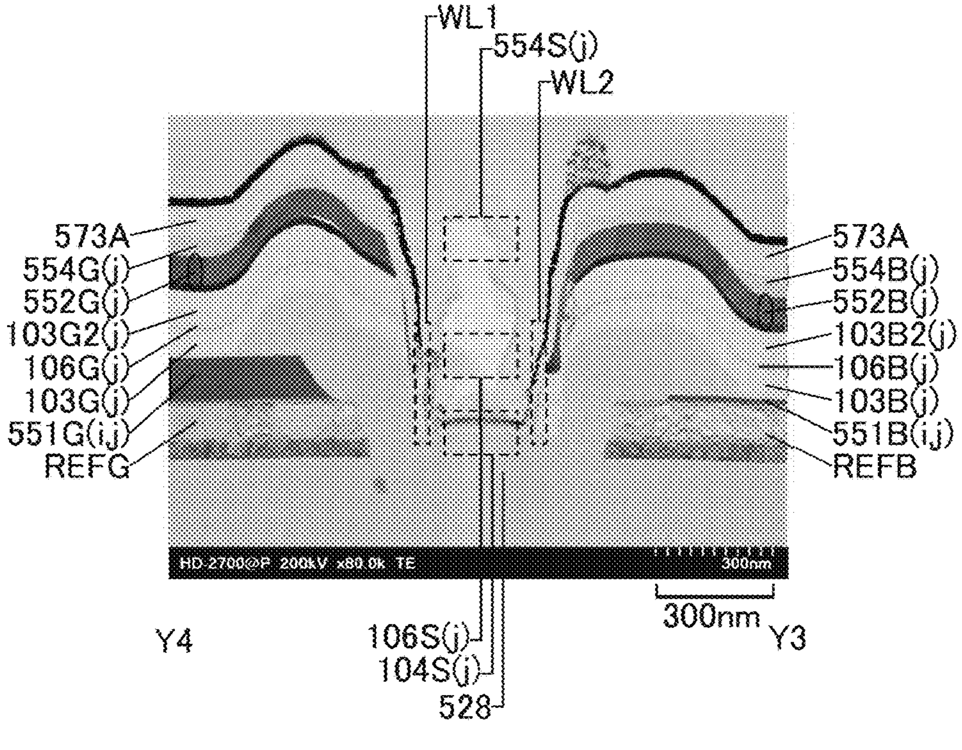

FIG. 21A is a diagram illustrating pixel arrangement of the fabricated display panel, and FIG. 21B is a transmission electron microscopy image showing a cross section taken along the cutting line Y3-Y4 in FIG. 21A.

<Structure 1 of Display Panel>

The fabricated display panel has a cross section with a structure similar to the structure of the display panel described using FIG. 6A and FIG. 7. The display panel includes the light-emitting device 550B(*i,j*), the light-emitting device 550G(*i,j*), the partition 528, the protective layer 554B(*j*), and the protective layer 554G(*j*) (see FIG. 6, FIG. 7, and FIG. 21).

<<Structure 1 of Light-Emitting Device 550B(*i,j*)>>

The light-emitting device 550B(*i,j*) includes the electrode 551B(*i,j*), the electrode 552B(*j*), the unit 103B(*j*), and the layer 104B(*j*), and the electrode 552B(*j*) overlaps with the electrode 551B(*i,j*). Note that the electrode 551B(*i,j*) is formed over a reflective film REFB (see FIG. 21B).

The unit 103B(*j*) includes a region interposed between the electrode 552B(*j*) and the electrode 551B(*i,j*).

The layer 104B(*j*) includes a region interposed between the unit 103B(*j*) and the electrode 551B(*i,j*), and the layer 104B(*j*) includes the first material having a hole-transport property and the first substance having an electron-accepting property.

The protective layer 554B(*j*) is in contact with the electrode 552B(*j*), and the electrode 552B(*j*) is interposed between the protective layer 554B(*j*) and the electrode 551B(*i,j*).

<<Structure 1 of Light-Emitting Device 550G(*i,j*)>>

The light-emitting device 550G(*i,j*) includes the electrode 551G(*i,j*), the electrode 552G(*j*), the unit 103G(*j*), and the layer 104G(*j*), and the electrode 552G(*j*) overlaps with the electrode 551G(*i,j*) (see FIG. 6A, FIG. 7, and FIG. 21B). Note that the electrode 551G(*i,j*) is formed over a reflective film REFG (see FIG. 21).

The unit includes a region interposed between the electrode 552G(*j*) and the electrode 551G(*i,j*).

The layer 104G(*j*) includes a region interposed between the unit 103G(*j*) and the electrode 551G(*i,j*). The layer 104G(*j*) includes a first material having a hole-transport property and a first substance having an electron-accepting property. The layer 104G(*j*) includes the gap 104S(*j*) between the layer 104G(*j*) and the layer 104B(*j*).

The protective layer 554G(*j*) includes the gap 554S(*j*) between the layer 554G(*j*) and the layer 55B(*j*), and the gap 554S(*j*) overlaps with the gap 104S(*j*).

The protective layer 554G(*j*) includes a region 554C(*j*) continuous with the protective layer 554B(*j*) (see FIG. 21A). In other words, the protective layer 554G(*j*) is not separated from the protective layer 554B(*j*) by the gap 554S(*j*).

In the case where the protective layer 554G(*j*) includes the region 554C(*j*) continuous with the protective layer 554B(*j*), the protective layer 554B(*j*) is a region of a protective layer where the gap 554S(*j*) is provided which overlaps with the electrode 551B(*i,j*), and the protective layer 554G(*j*) is a region of the protective layer which overlaps with the electrode 551G(*i,j*). Note that the gap 554S(*j*) is provided between the protective layer 554G(*j*) and the protective layer 554B(*j*). In a top view, a straight line drawn from the electrode 551G(*i,j*) to the electrode 551B(*i,j*) crosses the gap 554S(*j*) with a probability higher than or equal to a probability that the straight line crosses the continuous region 554C(*j*).

The protective layer 554G(*j*) is in contact with the electrode 552G(*j*), and the electrode 552G(*j*) is interposed between the protective layer 554G(*j*) and the electrode 551G(*i,j*).

The partition 528 includes the opening portion 528B(*i,j*) and the opening portion 528G(*i,j*). The opening portion 528B(*i,j*) overlaps with the electrode 551B(*i,j*), and the opening portion 528G(*i,j*) overlaps with the electrode 551G (*i,j*).

The partition 528 overlaps with the gap 104S(*j*) and the gap 554S(*j*) between the opening portion 528B(*i,j*) and the opening portion 528G(*i,j*).

<<Structure 2 of Light-Emitting Device 550B(*i,j*)>>

The light-emitting device 550B(*i,j*) includes the unit 103B2(*j*) and the intermediate layer 106B(*j*) (see FIG. 6A, FIG. 7, and FIG. 21).

The unit 103B2(*j*) includes a region interposed between the electrode 552B(*j*) and the unit 103B(*j*).

The intermediate layer 106B(*j*) includes a region interposed between the unit 103B2(*j*) and the unit 103B(*j*). The intermediate layer 106B(*j*) includes the second material having a hole-transport property and the second substance having an electron-accepting property, and the intermediate layer 106B(*j*) has an electrical resistivity higher than or equal to $1\times10^2$ Ωcm and lower than or equal to $1\times10^8$ Ωcm.

<<Structure 2 of Light-Emitting Device 550G(*i,j*)>>

The light-emitting device 550G(*i,j*) includes the unit 103G2(*j*) and the intermediate layer 106G(*j*), and the unit 103G2(*j*) includes a region interposed between the electrode 552G(*j*) and the unit 103G(*j*).

The intermediate layer 106G(*j*) includes a region interposed between the unit 103G2(*j*) and the unit 103G(*j*). The intermediate layer 106G(*j*) includes a second material having a hole-transport property and a second substance having an electron-accepting property, and the intermediate layer 106G(*j*) includes the gap 106S(*j*) between the intermediate layer 106G(*j*) and the intermediate layer 106B(*j*).

The partition 528 overlaps with the gap 106S(*j*) between the opening portion 528B(*i,j*) and the opening portion 528G (*i,j*).

<<Structure Example 3 of Light-Emitting Device 550B(*i,j*)>>

Table 1 shows the structure of the light-emitting device 550B(*i,j*). Structural formulae of the materials used in the light-emitting devices described in this example are shown below. Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 1

| Structure | Reference numeral | Material | Composition | Thickness/nm |
|---|---|---|---|---|
| Protective layer | 554B(j) | AlO*x* | | 60 |
| Electrode | 552B(j)b | ITO | | 70 |
| Electrode | 552B(j)a | Ag:Mg | 1:0.1 | 25 |
| Layer | 105B(j) | NBPhen:Ag | 1:0.05 | 5 |
| Layer | 113B(j)b | NBPhen | | 10 |
| Layer | 113B(j)a | 4,6mCzP2Pm | | 25 |
| Layer | 111B(j) | 8BP-4mDBtPBfpm:βNCCP:Ir(ppy)2(4dppy) | 0.5:0.5:0.1 | 40 |
| Layer | 112B(j) | PCBBiF | | 7.5 |
| Layer | 106B2 | BBABnf:MoO*x* | 1:0.5 | 10 |
| Layer | 106B1 | CuPc | | 2 |
| Layer | 105B2(j) | NBPhen:Ag | 1:0.1 | 5 |
| Layer | 113B2(j)b | NBPhen | | 5 |
| Layer | 113B2(j)a | 2mDBTBPDBq-II | | 15 |
| Layer | 111B2(j) | αN-βNPAnth:3,10PCA2Nbf(IV)-02 | 1:0.015 | 25 |
| Layer | 112B2(j)b | PCzN2 | | 10 |
| Layer | 112B2(j)a | BBABnf | | 10 |
| Layer | 104B(j) | BBABnf:MoO*x* | 1:0.5 | 10 |
| Electrode | 551B(i, j) | ITSO | | 85 |
| Reflective film REFB | | APC | | |

[Chemical formula 2]
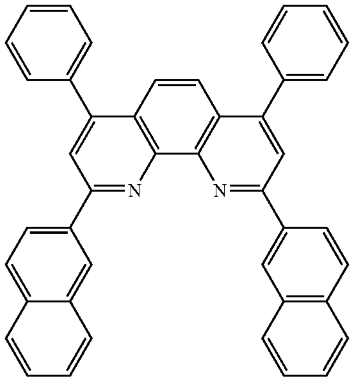
NBPhen
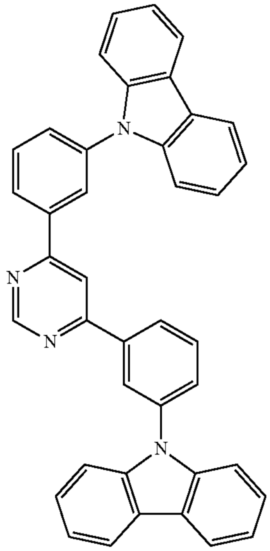
4,6mCzP2Pm
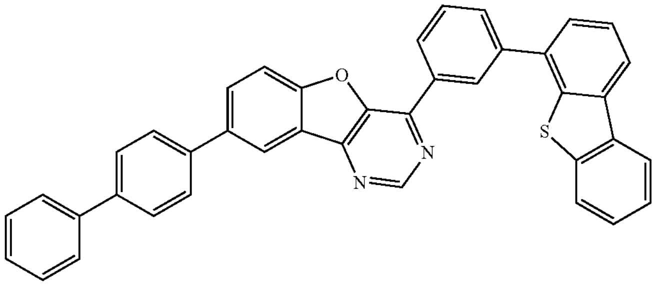
BBP-4mDBtPBfpm
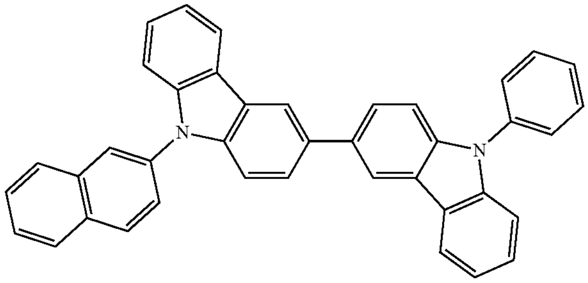
β NCCP
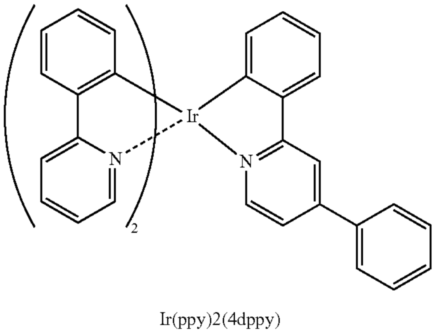
Ir(ppy)2(4dppy)

-continued
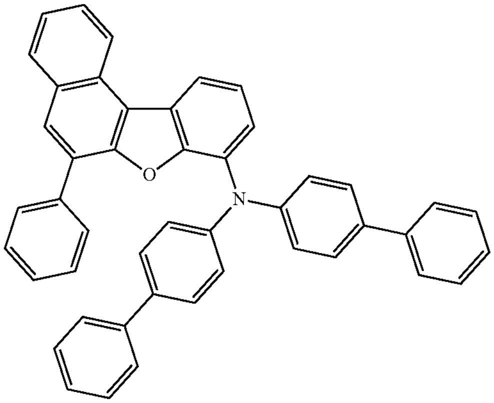
BBABnf
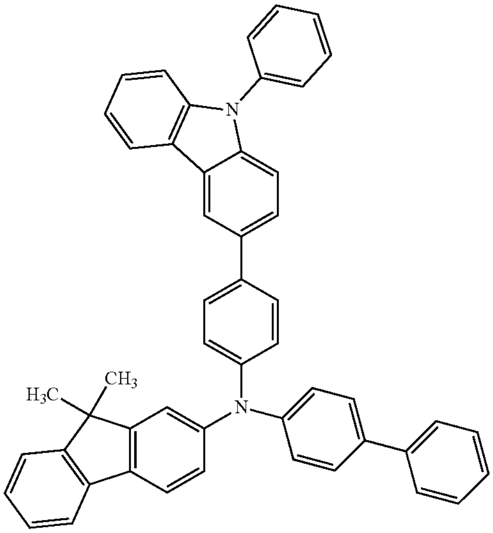
PCBBiF
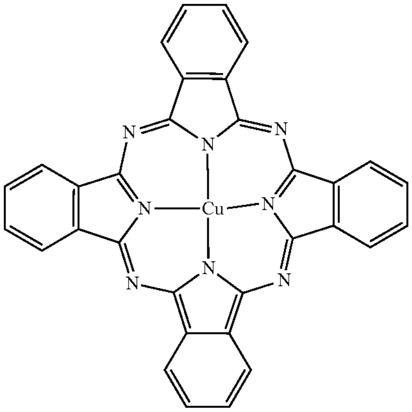
CuPc
[Chemical formula 3]
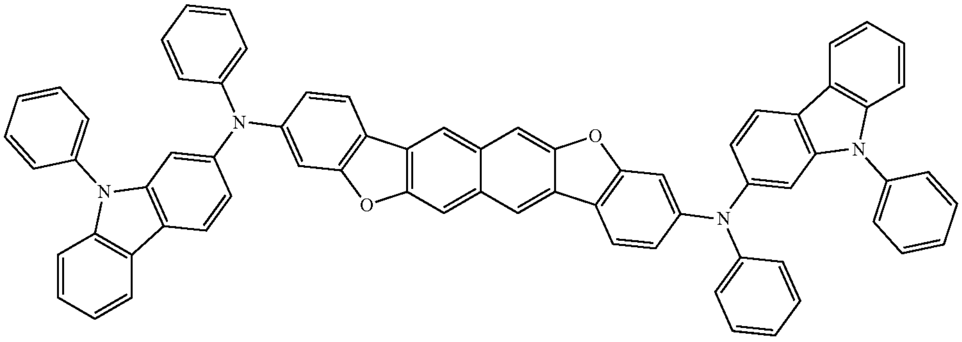
3,10PCA2Nbf(IV)-02

-continued

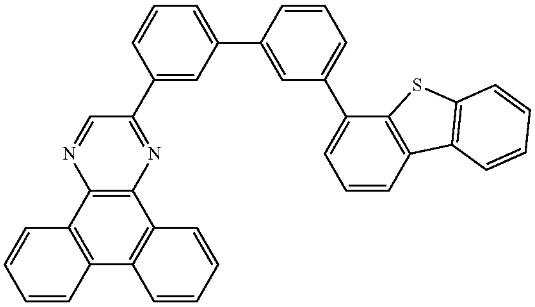

2mDBTBPDBq-II

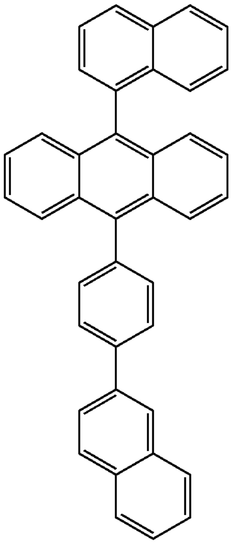

α N-β NPAnth

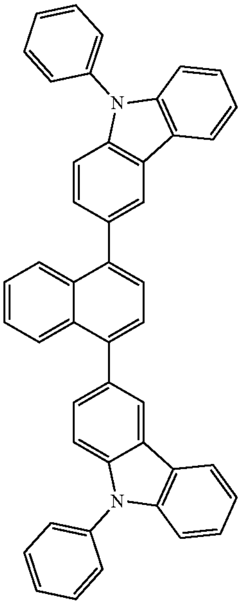

PCzN2

The reflective film REFB includes an alloy containing silver (Ag), palladium (Pd), and copper (Cu) (abbreviation: APC).

The electrode 551B(*i,j*) includes indium oxide-tin oxide containing silicon (abbreviation: ITSO) and has a thickness of 85 nm.

[Structure of Layer 104B(*j*)]

The layer 104B(*j*) includes N,N-bis(4-biphenyl)-6-phenylbenzo[b]naphtho[1,2-d]furan-8-amine (abbreviation: BBABnf) and molybdenum oxide (abbreviation: MoOx) at BBABnf:MoOx=1:0.5 (weight ratio) and has a thickness of 10 nm.

Note that BBABnf has a hole-transport property and is an aromatic amine compound. In addition, MoOx has an electron-accepting property and is a transition metal oxide.

[Structure of Unit 103B2(*j*)]

The unit 103B2(*j*) includes a layer 112B2(*j*)*a*, a layer 112B2(*j*)*b*, a layer 111B2(*j*), a layer 113B2(*j*)*a*, and a layer 113B2(*j*)*b*.

The layer 112B2(*j*)*a* includes BBABnf and has a thickness of 10 nm.

The layer 112B2(*j*)*b* includes 3,3'-(naphthalene-1,4-diyl) bis(9-phenyl-9H-carbazole) (abbreviation: PCzN2) and has a thickness of 10 nm.

The layer 111B2(*j*) includes 9-(1-naphthyl)-10-[4-(2-naphthyl)phenyl]anthracene (abbreviation: αN-βNPAnth) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) at αN-βNPAnth:3,10PCA2Nbf (IV)-02=1:0.015 (weight ratio) and has a thickness of 25 nm.

The layer 1131B2(*j*)*a* includes 2-[3'-(dibenzothiophen-4-yl)biphenyl-3-yl]dibenzo[f,h]quinoxaline (abbreviation: 2mDBTBPDBq-II) and has a thickness of 15 nm.

The layer 113B2(*j*)*b* includes 2,9-bis(naphthalen-2-yl)-4,7-diphenyl-1,10-phenanthroline (abbreviation: NBPhen) and has a thickness of 5 nm.

[Structure of Layer 105B2(*j*)]

The layer 105B2(*j*) includes NBPhen and Ag at NBPhen: Ag=1:0.1 (weight ratio) and has a thickness of 5 nm.

[Structure of Layer 106B(*j*)]

The intermediate layer 106B(*j*) includes a layer 106B1(*j*) and a layer 106B2(*j*).

The layer 106B1(*j*) includes copper phthalocyanine (abbreviation: CuPc) and has a thickness of 2 nm.

The layer 106B2 includes BBABnf and MoOx at BBABnf:MoOx=1:0.5 (weight ratio), and has a thickness of 10 nm.

[Structure of Unit 103B(*j*)]

The unit 103B(*j*) includes a layer 112B(*j*), a layer 111B(*j*), a layer 113B(*j*)*a*, and a layer 113B(*j*)*b*.

The layer 112B(*j*) includes N-(1,1'-biphenyl-4-yl)-N-[4-(9-phenyl-9H-carbazol-3-yl)phenyl]-9,9-dimethyl-9H-fluoren-2-amine (abbreviation: PCBBiF) and has a thickness of 7.5 nm.

The layer 111B(*j*) includes 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and bis[2-(2-pyridinyl-κN2)phenyl-κC][2-(5-phenyl-2-pyridinyl-κN2)phenyl-κC]iridium(III) (abbreviation: Ir(ppy)2(4dppy)) at 8BP-4mDBtPBfpm: βNCCP:Ir(ppy)2 (4dppy)=0.5:0.5:0.1 (weight ratio) and has a thickness of 40 nm.

The layer 113B(*j*)*a* includes 9,9'-(pyrimidine-4,6-diyldi-3,1-phenylene)bis(9H-carbazole) (abbreviation: 4,6mCzP2Pm) and has a thickness of 25 nm.

The layer 113B(*j*)*b* includes NBPhen and has a thickness of 10 nm.

[Structure of Layer 105B(*j*)]

The layer 105B(*j*) includes NBPhen and Ag at NBPhen: Ag=1:0.05 (weight ratio) and has a thickness of 5 nm.

[Structure of Electrode 552B(*j*)]

The electrode 552B(*j*) includes an electrode 552B(*j*)*a* and an electrode 552B(*j*)*b*.

The electrode 552B(*j*)*a* includes Ag and Mg at Ag:Mg=1:0.1 (weight ratio) and has a thickness of 25 nm.

The electrode 552B(*j*)*b* includes ITO and has a thickness of 70 nm.

[Structure of Protective Layer 554B(*j*)]

The protective layer 554B(*j*) includes aluminum oxide (abbreviation: AlOx) and has a thickness of 60 nm.

<Structure 2 of Display Panel>

The fabricated display panel includes the insulating film 573A.

The insulating film 573A is in contact with the protective layer 554B(*j*), and the protective layer 554B(*j*) includes a region interposed between the insulating film 573A and the electrode 552B(*j*).

The insulating film 573A is in contact with the protective layer 554G(*j*), and the protective layer 554G(*j*) includes a region interposed between the insulating film 573A and the electrode 552G(*j*).

The layer 104B(*j*) includes the sidewall WL1, the layer 104G(*j*) includes the sidewall WL2, the sidewall WL2(*j*) faces the sidewall WL1, and the gap 104S(*j*) is interposed between the sidewall WL2(*j*) and the sidewall WL1.

The sidewall WL1 and the sidewall WL2 are in contact with the insulating film 573A.

Example 2

In this example, a structure of a fabricated display panel of one embodiment of the present invention is described with reference to FIG. 22.

Figure 22:
FIG. 22 is a photograph of a display panel according to an example.

FIG. 22 is a photograph illustrating a display result of the fabricated display panel.

<Structure Example of Display Panel>

The display panel described in this example has specifications listed in the following table.

TABLE 2

| Item | Specifications |
|---|---|
| Display region | 228.59 mm(H) × 149.675 mm(V), 8.33 inches in diagonal |
| Number of pixels | 7680(H) × 4320(V) pixels |
| Resolution | 1058 ppi |
| Subpixel size | 8 μm(H) × 16 μm(V) |
| Element structure | White tandem OLED<br>Color filter method |

The external view of the fabricated functional panel and the display result are shown (see FIG. 22). A high-resolution image was able to be displayed.

REFERENCE NUMERALS

ANO: conductive film, CFB: coloring layer, CFG: coloring layer, CFR: coloring layer, C21: capacitor, C22: capacitor, FM: foreign substance, G1: conductive film, G2: conductive film, M21: transistor, N21: node, N22: node, REFB: reflective film, REFG: reflective film, S1*g*: conductive film, S2*g*: conductive film, SW21: switch, SW22: switch, SW23: switch, VCOM2: conductive film, WL1: sidewall, WL2: sidewall, 101: electrode, 102: electrode, 103: unit, 103B: unit, 103B2: unit, 103G: unit, 103G2: unit, 103R: unit, 103R2: unit, 104: layer, 104B: layer, 104G: layer, 104R: layer, 104S: gap, 105: layer, 105S: gap, 105B: layer, 105B2: layer, 105G: layer, 105G2: layer, 105R: layer, 105R2: layer, 106: intermediate layer, 106(1): layer, 106(2): layer, 106B: intermediate layer, 106B1: layer, 106B2: layer, 106G: intermediate layer, 106R: intermediate layer, 106S: gap, 111: layer, 111B: layer, 111B2: layer, 111G: layer, 111R: layer, 112: layer, 112B: layer, 112B2: layer, 113: layer, 113B: layer, 113B2: layer, 150: light-emitting device, 231: display region, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 516A: insulating film, 516B: insulating film, 518: insulating film, 519B: terminal, 520: functional layer, 520T: region, 524: conductive film, 528: partition, 528B: opening portion, 528G: opening portion, 550B: light-emitting device, 550G: light-emitting device, 550R: light-emitting device, 551B: electrode, 551G: electrode, 551R: electrode, 551S: gap, 552: electrode, 552B: electrode, 552G: electrode, 552R: electrode, 573: insulating film, 554: protective layer, 554B: protective layer, 554G: protective layer, 554R: protective layer, 554S: gap, 554C: region, 573A: insulating film, 573B: insulating film, 591B: opening portion, 591G: opening portion, 700: display panel, 705: insulating film, 770: base material, 1032: unit, 1052: layer, 5200B: data processing device, 5210: arithmetic device, 5220: input/output device, 5230: display portion, 5240: input portion, 5250: sensing portion, 5290: communication portion

The invention claimed is:

1. A display panel comprising:

a first light-emitting device;

a second light-emitting device;

a partition;

a first protective layer; and a second protective layer, wherein the first light-emitting device comprises a first electrode, a second electrode, and a first layer, wherein the first layer comprises a region interposed between the second electrode and the first electrode, wherein the first layer comprises a first material having a hole-transport property and a first substance having an electron-accepting property, wherein the first layer has an electrical resistivity higher than or equal to $1\times10^2$ Ω cm and lower than or equal to $1\times10^8$ Ω cm, wherein the first protective layer is in contact with the second electrode, wherein the second electrode is interposed between the first protective layer and the first electrode, wherein the second light-emitting device comprises a third electrode, a fourth electrode, and a second layer, wherein the second layer comprises a region interposed between the fourth electrode and the third electrode, wherein the second layer comprises the first material having the hole-transport property and the first substance having the electron-accepting property, wherein the second layer comprises a first gap between the second layer and the first layer, wherein the second protective layer comprises a second gap between the second protective layer and the first protective layer, wherein the second gap overlaps with the first gap, wherein the second protective layer is in contact with the fourth electrode, wherein the fourth electrode is interposed between the second protective layer and the third electrode, wherein the partition comprises a first opening portion and a second opening portion, wherein the first opening portion overlaps with the first electrode, wherein the second opening portion overlaps with the third electrode, and wherein the partition overlaps with the first gap and the second gap between the first opening portion and the second opening portion.

2. A display panel comprising:

a first light-emitting device;

a second light-emitting device;

a partition;

a first protective layer; and a second protective layer, wherein the first light-emitting device comprises a first electrode, a second electrode, a first unit, and a first layer, wherein the second electrode overlaps with the first electrode, wherein the first unit comprises a region interposed between the second electrode and the first electrode, wherein the first layer comprises a region interposed between the first unit and the first electrode, wherein the first layer comprises a first material having a hole-transport property and a first substance having an electron-accepting property, wherein the first layer has an electrical resistivity higher than or equal to $1\times10^2$ Ω cm and lower than or equal to $1\times10^8$ Ω cm, wherein the first protective layer is in contact with the second electrode, wherein the second electrode is interposed between the first protective layer and the first electrode, wherein the second light-emitting device comprises a third electrode, a fourth electrode, a second unit, and a second layer, wherein the fourth electrode overlaps with the third electrode, wherein the second unit comprises a region interposed between the fourth electrode and the third electrode, wherein the second layer comprises a region interposed between the second unit and the third electrode, wherein the second layer comprises the first material having the hole-transport property and the first substance having the electron-accepting property, wherein the second layer comprises a first gap between the second layer and the first layer, wherein the second protective layer comprises a second gap between the second protective layer and the first protective layer, wherein the second gap overlaps with the first gap, wherein the second protective layer is in contact with the fourth electrode, wherein the fourth electrode is interposed between the second protective layer and the third electrode, wherein the partition comprises a first opening portion and a second opening portion, wherein the first opening portion overlaps with the first electrode, wherein the second opening portion overlaps with the third electrode, and wherein the partition overlaps with the first gap and the second gap between the first opening portion and the second opening portion.

3. The display panel according to claim 2, wherein the first light-emitting device comprises a third unit and a first intermediate layer, wherein the third unit comprises a region interposed between the second electrode and the first unit, wherein the first intermediate layer comprises a region interposed between the third unit and the first unit, wherein the first intermediate layer comprises a second material having the hole-transport property and a second substance having the electron-accepting property, wherein the first intermediate layer has an electrical resistivity higher than or equal to $1\times10^2$ Ω cm and lower than or equal to $1\times10^8$ Ω cm, wherein the second light-emitting device comprises a fourth unit and a second intermediate layer, wherein the fourth unit comprises a region interposed between the fourth electrode and the second unit, wherein the second intermediate layer comprises a region interposed between the fourth unit and the second unit, wherein the second intermediate layer comprises the second material having the hole-transport property and the second substance having the electron-accepting property, wherein the second intermediate layer comprises a third gap between the second intermediate layer and the first intermediate layer, and wherein the partition overlaps with the third gap between the first opening portion and the second opening portion.

4. The display panel according to claim 1, wherein the first material having the hole-transport property is an aromatic amine compound or an organic compound comprising a x-electron rich heteroaromatic ring, and wherein the first substance having the electron-accepting property is an organic compound comprising fluorine or a cyano group or a transition metal oxide.

5. The display panel according to claim 1, wherein the first protective layer comprises aluminum oxide, and wherein the second protective layer comprises aluminum oxide.

6. The display panel according to claim 1, further comprising a first insulating film, wherein the first insulating film is in contact with the first protective layer, wherein the first protective layer comprises a region interposed between the first insulating film and the second electrode, wherein the first insulating film is in contact with the second protective layer, wherein the second protective layer comprises a region interposed between the first insulating film and the fourth electrode, wherein the first layer comprises a first sidewall, wherein the second layer comprises a second sidewall, wherein the second sidewall faces the first sidewall, wherein the first gap is interposed between the second sidewall and the first sidewall, and wherein the first sidewall and the second sidewall are in contact with the first insulating film.

7. The display panel according to claim 1, further comprising a second insulating film, wherein the second insulating film fills the first gap.

8. A data processing device comprising:

one or more of a keyboard, a hardware button, a pointing device, a touch sensor, an illuminance sensor, an imaging device, an audio input device, an eye-gaze input device and an attitude detection device; and the display panel according to claim 1.

9. A manufacturing method of a display panel, comprising the steps of:

forming a first electrode and a second electrode;

forming a partition between the first electrode and the second electrode;

forming a first layer over the first electrode and the second electrode;

forming a first unit over the first layer;

forming a second layer comprising a first organic compound and a first metal over the first unit by a co-evaporation method;

forming an intermediate layer over the second layer;

forming a second unit over the intermediate layer;

forming a third layer comprising a second organic compound and a second metal over the second unit by a co-evaporation method;

forming a third electrode over the third layer;

forming a first protective layer over the third electrode;

forming a second protective layer over the first electrode and a third protective layer over the second electrode by processing the first protective layer by a photoetching method; and forming a first light-emitting device and a second light-emitting device by removing the first layer, the first unit, the second layer, the intermediate layer, the second unit, the third layer, and the third electrode that are over the partition with use of the second protective layer and the third protective layer as hard masks.

* * * * *